US007655566B2

(12) United States Patent
Fujii

(10) Patent No.: US 7,655,566 B2
(45) Date of Patent: Feb. 2, 2010

(54) METHOD FOR MANUFACTURING SEMICONDUCTOR DEVICE

(75) Inventor: Gen Fujii, Sagamihara (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 535 days.

(21) Appl. No.: 11/488,143

(22) Filed: Jul. 18, 2006

(65) Prior Publication Data

US 2007/0026580 A1   Feb. 1, 2007

(30) Foreign Application Priority Data

Jul. 27, 2005   (JP) ............... 2005-218090

(51) Int. Cl.
*H01L 21/44* (2006.01)
(52) U.S. Cl. .................. 438/678; 438/151; 438/676; 257/E21.44; 257/E21.584
(58) Field of Classification Search .......... 438/151, 438/199, 584, 644, 648, 652, 653, 674, 676, 438/678, 685, FOR. 390, FOR. 405–407; 257/E21.535, E21.538, E21.525, E21.295, 257/E21.44, E21.584, E21.586
See application file for complete search history.

(56) References Cited

U.S. PATENT DOCUMENTS

| | | | |
|---|---|---|---|
| 5,445,997 A * | 8/1995 | Fujishima et al. ........... 438/149 |
| 6,277,679 B1 | 8/2001 | Ohtani | |
| 6,562,671 B2 | 5/2003 | Ohnuma | |
| 6,720,211 B2 | 4/2004 | Izumi et al. | |
| 6,750,475 B1 | 6/2004 | Izumi et al. | |
| 6,853,004 B2 | 2/2005 | Ohtani | |
| 6,909,117 B2 | 6/2005 | Ohnuma | |
| 6,933,533 B2 | 8/2005 | Yamazaki et al. | |
| 2004/0119902 A1 * | 6/2004 | Chae et al. .................... 349/43 |
| 2005/0095356 A1 | 5/2005 | Nakamura et al. | |
| 2005/0136578 A1 | 6/2005 | Ohtani | |
| 2005/0200301 A1 | 9/2005 | Yamazaki et al. | |
| 2007/0004202 A1 | 1/2007 | Fujii | |

FOREIGN PATENT DOCUMENTS

| | | |
|---|---|---|
| JP | 2000-305113 | 11/2000 |
| JP | 2001-032086 | 2/2001 |
| JP | 2004-013042 | 1/2004 |
| WO | WO 2005/022664 * | 3/2005 |

* cited by examiner

*Primary Examiner*—Matthew Smith
*Assistant Examiner*—Quovaunda Jefferson
(74) *Attorney, Agent, or Firm*—Nixon Peabody, LLP; Jeffrey L. Costellia

(57) ABSTRACT

A semiconductor device is manufactured by forming a gate electrode layer over a substrate having a light transmitting property; forming a gate insulating layer over the gate electrode layer; forming a photocatalyst material over the gate insulating layer; immersing the photocatalyst material in a solution containing a plating catalyst material and selectively exposing the photocatalyst material to light transmitted through the substrate in the solution containing the plating catalyst material with the use of the gate electrode layer as a mask to adsorb or deposit the plating catalyst material onto the light-exposed photocatalyst material; immersing the plating catalyst material in a plating solution containing a metal material to form a source electrode layer and a drain electrode layer on the surface of the photocatalyst material adsorbing or depositing the plating catalyst material; and forming a semiconductor layer over the source electrode layer and the drain electrode layer.

36 Claims, 35 Drawing Sheets

FIG. 11A
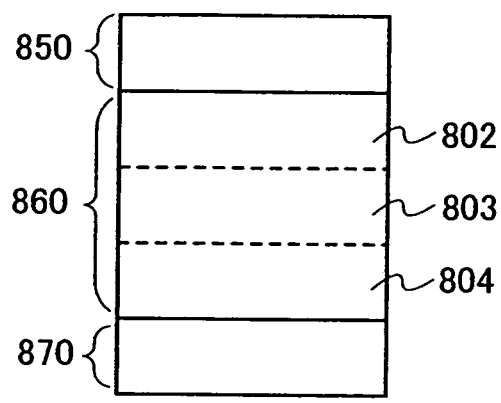
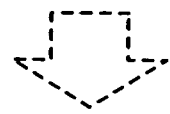
FIG. 11B
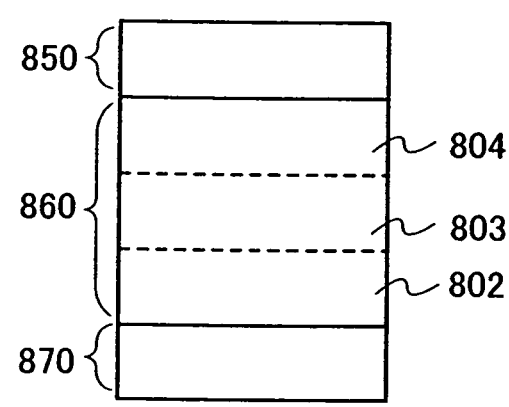
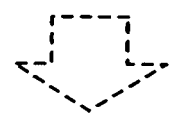
FIG. 11C
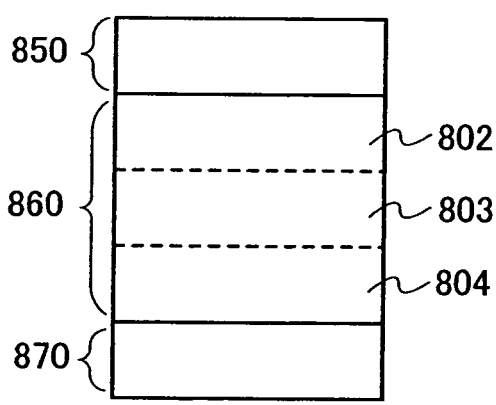
FIG. 11D
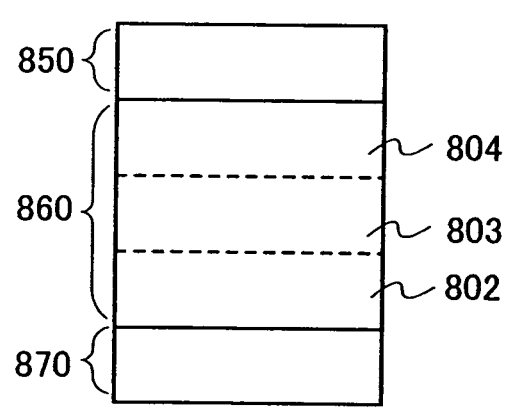

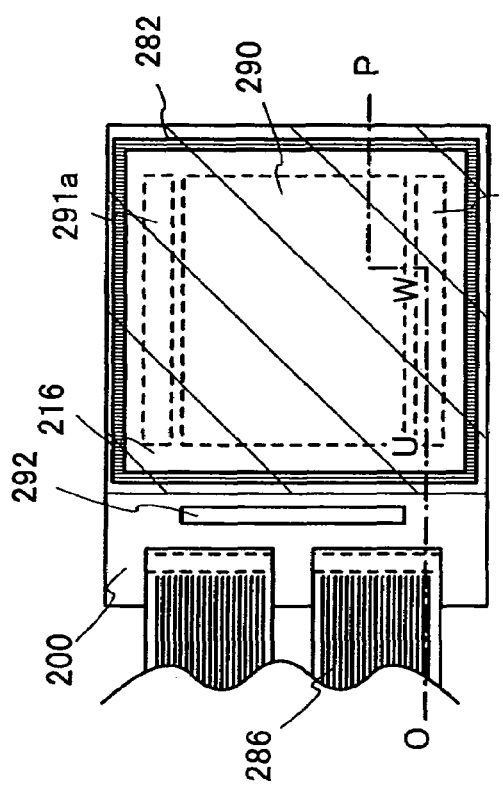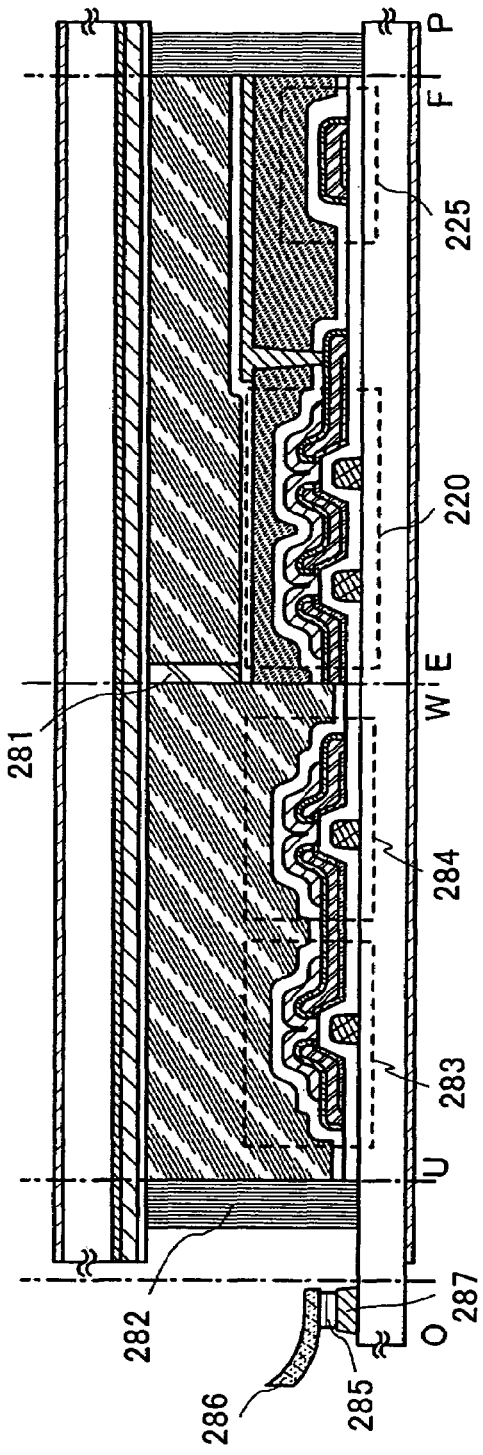
FIG. 19A
FIG. 19B

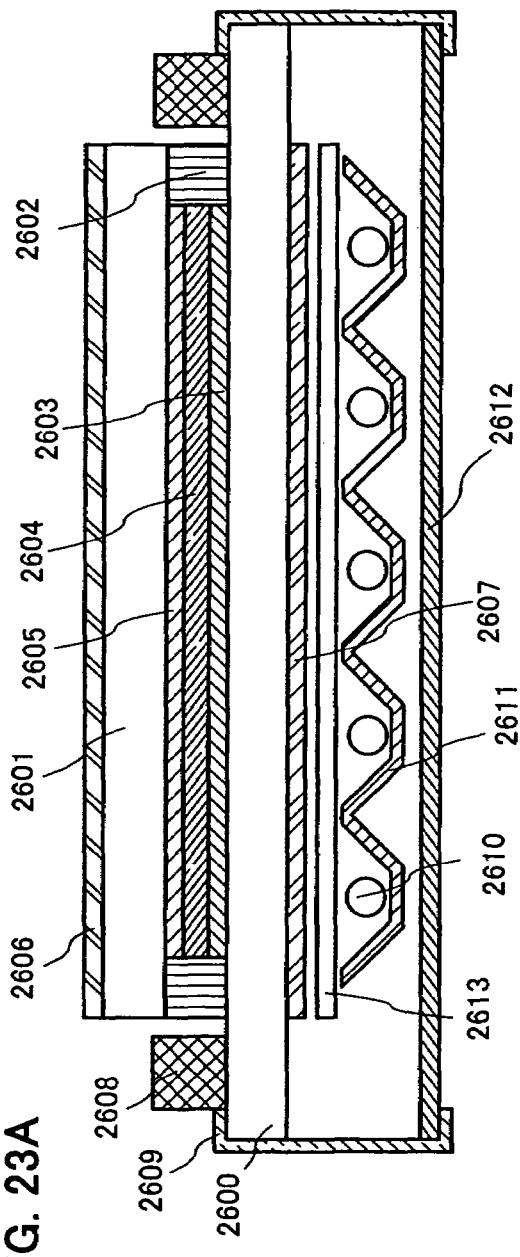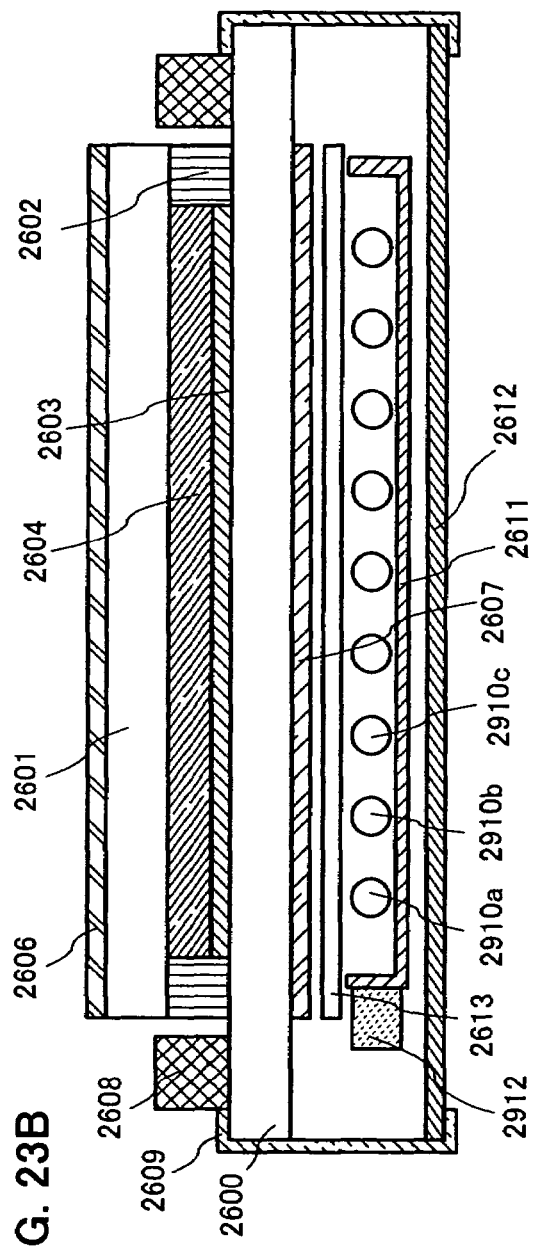

FIG. 25A
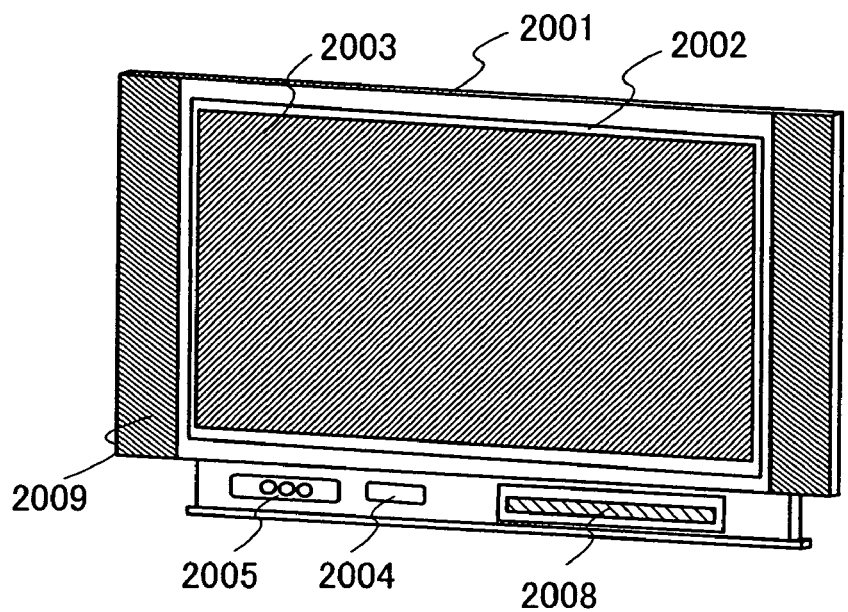
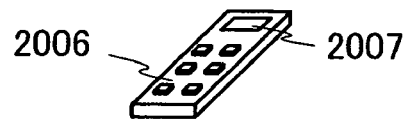
FIG. 25B
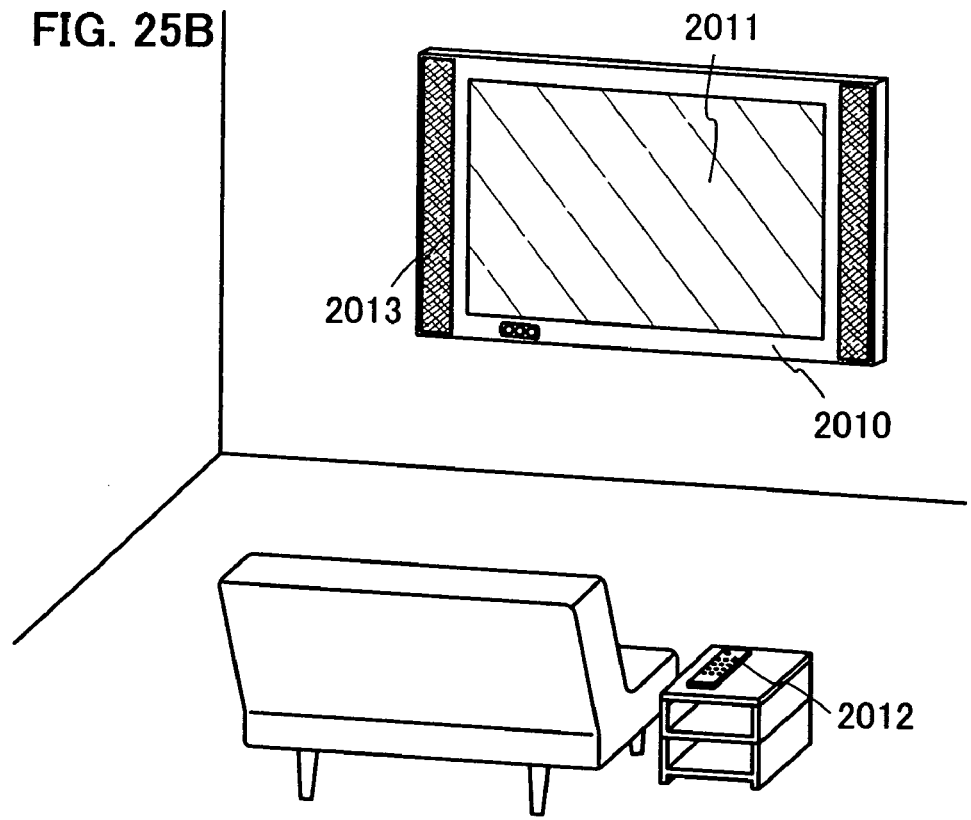

METHOD FOR MANUFACTURING SEMICONDUCTOR DEVICE

BACKGROUND OF THE INVENTION

1. Field of the Invention

The present invention relates to a semiconductor device formed by a plating method and a method for manufacturing the semiconductor device using the plating method.

2. Description of the Related Art

A method using a wet film formation technique in a manufacturing process of a flat panel display, a semiconductor integrated circuit, or the like has been considered. For example, it has been attempted, as a wet film formation technique, to form a metal film by a plating method (for example, Reference 1: Japanese Patent Laid-Open No. 2001-032086).

SUMMARY OF THE INVENTION

It is an object of the present invention to provide a technique by which the number of photolithography steps is reduced in a manufacturing process of a thin film transistor (TFT), an electronic circuit using TFTs, and a semiconductor device or a display device formed using TFTs, the manufacturing process is simplified, and manufacturing thereof can be performed with high yield even over a large-area substrate having a side of more than one meter.

It is another object of the present invention to provide a technique by which a high-performance and high-reliability semiconductor device can be manufactured with high productivity.

In the present invention, at least one or more of conductive layers forming wire layers, electrodes, and the like is manufactured by a plating method. In an electroless plating method, in addition to a catalyst material for a metal material used for plating (also referred to as a plating metal material), a photocatalyst material is used as a material which adsorbs by a photocatalytic function a catalyst material to be plated with the metal material. One feature of the present invention is to manufacture a semiconductor device or a display device by selectively adsorbing (depositing) a catalyst material (in this specification, referred to as a plating catalyst material) for a metal material into a desired shape to form a conductive layer in a self-aligned manner by a plating method. In the present invention, the plating catalyst material is selectively formed; therefore, a photocatalyst material which deposits the plating catalyst material is selectively exposed to light by backside light exposure to generate a photocatalytic function in the light-exposed region.

Note that the term "semiconductor device" in this specification means a device which can be operated by utilizing semiconductor characteristics. A multilayer wiring layer and a semiconductor device such as a processor chip can be manufactured by using the present invention.

The present invention can be used for a display device that is a device having a display function. The display device using the present invention includes, in its category, a light emitting display device where a TFT is connected to a light emitting element in which a layer containing an organic material, an inorganic material or a mixture of organic and inorganic materials which exhibits light emission called electroluminescence (hereinafter also referred to as "EL"), is interposed between electrodes, a liquid crystal display device using a liquid crystal element including a liquid crystal material as a display element, and the like.

One feature of a method for manufacturing a semiconductor device of the present invention is to include the steps of forming a gate electrode layer having a non-light transmitting property over a substrate having a light transmitting property; forming a gate insulating layer over the gate electrode layer; forming a photocatalyst material over the gate insulating layer; immersing the photocatalyst material in a solution containing a plating catalyst material and selectively exposing the photocatalyst material to light transmitted through the substrate in the solution containing the plating catalyst material with the use of the gate electrode layer as a mask to adsorb or deposit the plating catalyst material onto the light-exposed photocatalyst material; immersing the plating catalyst material in a plating solution containing a metal material to form a source electrode layer and a drain electrode layer on the surface of the photocatalyst material adsorbing or depositing the plating catalyst material; and forming a semiconductor layer over the source electrode layer and the drain electrode layer.

Another feature of a method for manufacturing a semiconductor device of the present invention is to include the steps of forming a gate electrode layer having a non-light transmitting property over a substrate having a light transmitting property; forming a gate insulating layer over the gate electrode layer; forming a photocatalyst material over the gate insulating layer; forming a mask film over the photocatalyst material; selectively exposing the photocatalyst material to light transmitted through the substrate with the use of the gate electrode layer as a mask and removing the mask film over the light-exposed photocatalyst material to selectively expose the photocatalyst material; immersing the selectively exposed photocatalyst material in a solution containing a plating catalyst material to adsorb or deposit the plating catalyst material onto the selectively exposed photocatalyst material; immersing the plating catalyst material in a plating solution containing a metal material to form a source electrode layer and a drain electrode layer on the surface of the photocatalyst material adsorbing or depositing the plating catalyst material; and forming a semiconductor layer over the source electrode layer and the drain electrode layer, where the solution containing the plating catalyst material is used with its pH adjusted to 3 to 6.

Still another feature of a method for manufacturing a semiconductor device of the present invention is to include the steps of forming a gate electrode layer having a non-light transmitting property over a substrate having a light transmitting property; forming a gate insulating layer over the gate electrode layer; forming a photocatalyst material over the gate insulating layer; immersing the photocatalyst material in a solution containing a plating catalyst material and selectively exposing the photocatalyst material to light transmitted through the substrate in the solution containing the plating catalyst material with the use of the gate electrode layer as a mask to adsorb or deposit the plating catalyst material onto the light-exposed photocatalyst material; immersing the plating catalyst material in a plating solution containing a first metal material to form a source electrode layer and a drain electrode layer on the surface of the photocatalyst material adsorbing or depositing the plating catalyst material; immersing the source electrode layer and the drain electrode layer in a plating solution containing a second metal material and replacing the surface of the source electrode layer and the drain electrode layer by the second metal material to form a metal film on the surface of the source electrode layer and the drain electrode layer; and forming a semiconductor layer over the metal film.

Yet another feature of a method for manufacturing a semiconductor device of the present invention is to include the steps of forming a gate electrode layer having a non-light transmitting property over a substrate having a light transmitting property; forming a gate insulating layer over the gate electrode layer; forming a photocatalyst material over the gate insulating layer; forming a mask film over the photocatalyst material; selectively exposing the photocatalyst material to light transmitted through the substrate with the use of the gate electrode layer as a mask and removing the mask film over the light-exposed photocatalyst material to selectively expose the photocatalyst material; immersing the selectively exposed photocatalyst material in a solution containing a plating catalyst material to adsorb or deposit the plating catalyst material onto the selectively exposed photocatalyst material; immersing the plating catalyst material in a plating solution containing a first metal material to form a source electrode layer and a drain electrode layer on the surface of the photocatalyst material adsorbing or depositing the plating catalyst material; immersing the source electrode layer and the drain electrode layer in a plating solution containing a second metal material and replacing the surface of the source electrode layer and the drain electrode layer by the second metal material to form a metal film on the surface of the source electrode layer and the drain electrode layer; and forming a semiconductor layer over the metal film, where the solution containing the plating catalyst material is used with its pH adjusted to 3 to 6. As the metal film, a nickel alloy thin film, a copper thin film, or the like can be used. The mask film can be formed of a silane coupling agent having a fluorocarbon group or an alkyl group as its end group.

In the present invention, a photocatalyst material which adsorbs a plating catalyst element is selectively irradiated with light by backside light exposure to selectively adsorb the plating catalyst element onto the light-exposed photocatalyst material, thereby forming a source electrode layer and a drain electrode layer in a self-aligned manner. Accordingly, a defective shape or the like due to misalignment of a mask is not generated, and a wire can be formed with high controllability. Therefore, a high-reliability semiconductor device, display device, or the like can be manufactured with high yield by using the present invention.

In addition, a plating method is employed; therefore, the thickness or size of a wire layer can be controlled relatively easily, and a wire layer can be manufactured to suit application. Therefore, a high-performance and high-reliability semiconductor device which can operate at high speed can also be manufactured.

BRIEF DESCRIPTION OF DRAWINGS

FIGS. 11A to 11D are diagrams explaining structures of light emitting elements applicable to the present invention.

FIGS. 19A and 19B are diagrams explaining a display device of the present invention.

FIGS. 23A and 23B are cross-sectional views explaining structure examples of liquid crystal display modules of the present invention.

FIGS. 25A and 25B are diagrams showing electronic devices to which the present invention is applied.

DETAILED DESCRIPTION OF THE INVENTION

Figure 1A:
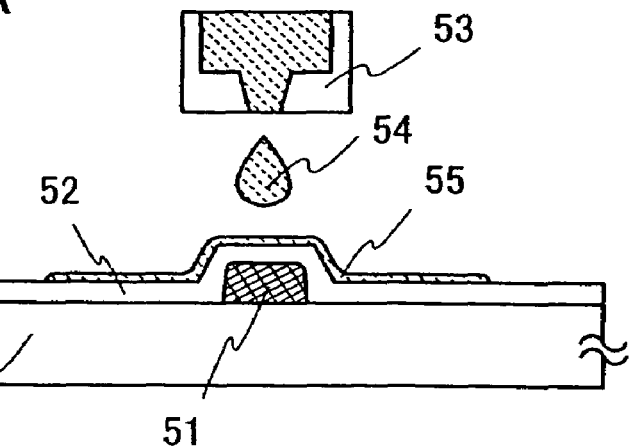
FIGS. 1A to 1D are conceptual diagrams explaining the present invention.

Embodiment modes and an embodiment according to the present invention will be hereinafter explained with reference to the accompanying drawings. However, the present invention is not limited to the following explanation. As is easily known to a person skilled in the art, the mode and the detail of the invention can be variously changed without departing from the spirit and the scope of the present invention. Therefore, the present invention is not interpreted as being limited to the following description of the embodiment modes and the embodiment. Note that the same portions or portions having a similar function are denoted by the same reference numeral among different diagrams in a structure of the present invention to be explained hereinafter, and repetitive explanation thereof is omitted.

Embodiment Mode 1

An embodiment mode of the present invention is explained with reference to FIGS. 1A to 1D.

In this embodiment mode, one or more of conductive layers forming wire layers, electrodes, or the like is manufactured by a plating method. In an electroless plating method, in addition to a catalyst material for a plating metal material, a photocatalyst material is used as a material which functions to adsorb a catalyst material to be plated with the metal material (plating catalyst material). One feature is to manufacture a semiconductor device or a display device by selectively adsorbing (depositing) a plating catalyst material into a desired shape to form a conductive layer in a self-aligned manner by a plating method. In the present invention, in order to selectively form the plating catalyst material, a photocatalyst material which deposits the plating catalyst material is selectively exposed to light by backside light exposure to generate a photocatalytic function in the light-exposed region.

A gate electrode layer 51 is formed over a substrate 50 having a light transmitting property, and a gate insulating layer 52 is formed over the gate electrode layer 51. A photocatalyst material 55 is formed over the gate insulating layer 52 superposed over the gate electrode layer 51. This photocatalyst material 55 is a material having a photocatalytic function and having a function to adsorb a plating catalyst material serving as a catalyst for a plating metal material. In other words, the photocatalyst material 55 has a function to adsorb or deposit a plating catalyst material.

The photocatalyst material can reduce and deposit (also referred to as "adsorb onto the surface") the plating catalyst material included in the solution by a photocatalytic function. The photocatalyst material is preferably titanium oxide ($TiO_2$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Photocatalytic activity can be caused by irradiating the photocatalyst material with light of an ultraviolet light region (having a wavelength of 400 nm or less, preferably, 380 nm or less).

A photocatalyst material including an oxide semiconductor containing a plurality of metals can be formed by mixing and melting salts of constituting elements. When a solvent needs to be removed, baking and/or drying may be performed. Specifically, heating may be performed at a predetermined temperature (for example, 300° C. or more), and preferably performed in an atmosphere containing oxygen.

With this heat treatment, the photocatalyst material can have a predetermined crystal structure. For example, as for titanium oxide ($TiO_2$), the photocatalyst material is of an anatase type or a rutile-anatase mixed type, and an anatase type is preferentially formed in a low-temperature phase. Therefore, the photocatalyst material may be heated also when it does not have a predetermined crystal structure.

Photocatalytic activity can be improved by further doping the photocatalyst material with transition metal (such as Pd, Pt, Cr, Ni, V, Mn, Fe, Ce, Mo, or W), or photocatalytic activity can be caused by light of a visible light region (having a wavelength of 400 nm to 800 nm). This is because transition metal can form a new level in a forbidden band of an active photocatalyst having a wide band gap, and can expand a light absorption range to a visible light region. For example, an acceptor type such as Cr or Ni, a donor type such as V or Mn, an amphoteric type such as Fe, or Ce, Mo, W, or the like can be used for doping. Since a wavelength of light can be determined by the photocatalyst material as described above, light irradiation means irradiating with light having such a wavelength as to activate the photocatalyst material.

In addition, when the photocatalyst material is heated and reduced in vacuum or under hydrogen reflux, an oxygen defect is generated in a crystal. Without doping with a transition element as described above, the oxygen defect can play a role equivalent to an electron donor. In particular, in the case of forming by a sol-gel method, an oxygen defect originally exists, so that reduction is not necessarily performed. By performing doping with a gas of $N_2$ or the like, an oxygen defect can be formed.

The plating catalyst material is appropriately selected depending on a plating metal material. As the plating catalyst material, palladium (Pd), rhodium (Rh), ruthenium (Ru), osmium (Os), iridium (Ir), gold (Au), platinum (Pt), silver (Ag), or the like may be used. The plating catalyst material is dissolved in a solution and is treated as a solution containing the plating catalyst material.

In this embodiment mode, a liquid composition 54 containing titanium oxide that is a photocatalyst material is discharged by a droplet discharge apparatus 53 and solidified by drying and/or baking to selectively form the photocatalyst material 55 (see FIG. 1A).

As the method by which a formation object can be selectively formed in a desired pattern, a droplet discharge (eject) method (also referred to as an ink-jet method depending on its method) which can form a thin film in a predetermined pattern by selectively discharging (ejecting) a droplet of a composition mixed for a specific purpose is used. In addition, a method by which a formation object can be transferred or drawn into a desired pattern, for example, various printing methods (a method by which a formation object can be formed in a desired pattern, such as screen (mimeograph) printing, offset (planography) printing, relief printing, or gravure (intaglio) printing), a dispenser method, a selective coating method, or the like can be used.

This embodiment mode employs a method for discharging (ejecting) a composition containing a fluidized catalyst material as a droplet to be selectively formed in a desired pattern in a manufacturing process of a semiconductor device or a display device. A droplet containing a component-forming material is discharged to a formation region of a catalyst material and is fixed (or solidified) by baking, drying, and/or the like to form a catalyst material in a desired pattern. In the case of directly manufacturing a wire layer by an ink-jet method, an organic material serving as a binder is included in the wire layer; therefore, the wire layer tends to have high resistance. However, a low-resistance wire layer can be manufactured by using a plating method. In the electroless plating method used in the present invention, a growth rate of a conductive layer is not affected even when a pattern shape is narrowed, and a film thickness can also be controlled by adjusting immersion time in a plating solution.

In addition, the shape of the photocatalyst material may be processed using a resist mask, an evaporation mask, or the like, which may be combined with the droplet discharge (eject) method, a printing method (such as screen (mimeograph) printing, offset (planography) printing, relief printing, or gravure (intaglio) printing), a dispenser method, or the like. By selectively forming the photocatalyst material 55 by a droplet discharge method as described in this embodiment mode, a manufacturing process is more simplified.

Figure 1B:
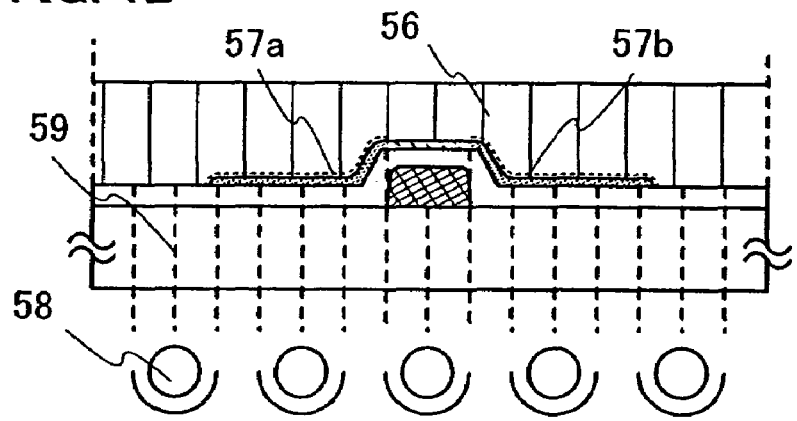

In order to deposit the plating catalyst material on the photocatalyst material 55, the photocatalyst material 55 is immersed in a solution 56 containing the plating catalyst material so as to deposit a plating catalyst material 57a and a plating catalyst material 57b on the surface of the photocatalyst material 55 (see FIG. 1B). At this time, the photocatalyst material 55 is irradiated with light 59 transmitted through the substrate 50 having a light transmitting property from a light source 58 on the substrate 50 side having a light transmitting property. The light 59 is transmitted through the substrate 50 having a light transmitting property and the gate insulating layer 52, whereas it is blocked without being transmitted through the gate electrode layer 51 having a non-light transmitting property. Therefore, a region of the photocatalyst material 55, which is superposed over the gate electrode layer 51, is a light-unexposed region, and only in a light-exposed region, the photocatalyst material is activated by light. By the photocatalytic function, the plating catalyst material in the solution 56 containing the plating catalyst material is reduced. Thus, the plating catalyst material 57a and the plating catalyst material 57b are selectively deposited on the surface of the photocatalyst material 55. In the case where the photocatalyst material is activated by light irradiation as described above, and the photocatalytic function of the photocatalyst material is utilized, the pH of the solution containing the plating catalyst material is not necessarily adjusted. The light 59 is set to light having such a wavelength as to generate the photocatalytic function of the photocatalyst material 55, and light irradiation time and immersion time are appropriately adjusted depending on light energy. In this embodiment mode, titanium oxide is used as the photocatalyst material 55; therefore, irradiation is performed using ultraviolet light as the light 59.

When using a photocatalytic function, sodium hydroxide (NaOH), potassium hydroxide (KOH), or the like does not need to be added to the solution containing a plating catalyst material for pH adjustment. Therefore, the use of a photocatalytic function has an advantage in that a material which may have an adverse effect such as potassium hydroxide (KOH) does not need to be used depending on materials of a semiconductor layer.

There is no limitation on the immersion method as long as the solution 56 containing a plating catalyst material is in contact with the photocatalyst material 55. Therefore, the substrate 50 may be placed obliquely (or vertically), and the solution 56 containing a plating catalyst material may be applied so as to flow on the surface of the photocatalyst material 55. If plating is performed with a substrate placed obliquely (or vertically) and a solution applied, there is the advantage of miniaturizing an apparatus used for a step even in the case of using a large-area substrate.

Figure 1C:
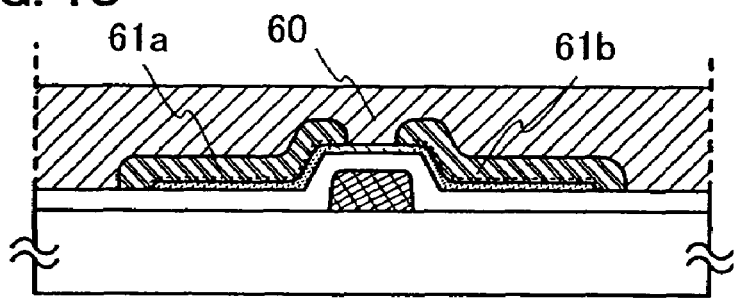
Figure 1D:
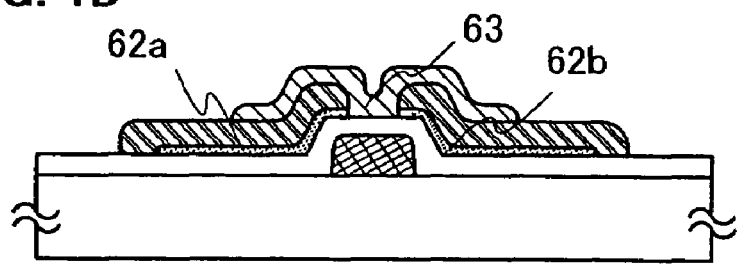

The photocatalyst material 55 adsorbing the plating catalyst material 57a and the plating catalyst material 57b onto its surface is immersed in a plating solution 60 containing a plating metal material, and a metal film is grown over the plating catalyst material 57a and the plating catalyst material 57b, and immersion time is controlled to reach a desired film thickness, thereby forming a source electrode layer or drain electrode layer 61a and a source electrode layer or drain electrode layer 61b in a self-aligned manner (see FIG. 1C). Since the source electrode layer or drain electrode layer 61a and the source electrode layer or drain electrode layer 61b can be formed in a self-aligned manner so as to hardly overlap the gate electrode layer 51, controllability thereof is high.

In addition, the growth rate of a conductive film by electroless plating used in this embodiment mode is not affected even in the case of thinning a pattern shape. If thickening is required, immersion time in a plating solution may be extended.

The plating solution contains, as its main component, a metal salt (a salt containing a metal material to be deposited, typically, chloride or sulfate) and a reducing agent (which provides an electron to deposit a metal ion as metal). In addition, a pH adjuster, a buffer, a complexing agent, an accelerator, a stabilizer, an improver, or the like may be added as an auxiliary component. Even with only the main component, a metal ion deposits as metal under the right conditions such as pH and bath temperature. In contrast to the main component, the auxiliary component functions to extend the life of a plating bath (plating solution) and to improve the efficiency of a reducing agent, and highly economical electroless plating can be performed depending on selection of the auxiliary component. The pH adjuster affects a plating rate, a reduction efficiency, and the state of a plating film. The buffer (various organic acids or weak inorganic acids) suppresses pH fluctuation caused by a substance generated when metal deposition is caused by the reduction of a metal ion in an electroless plating method. The complexing agent contributes to prevention of hydroxide precipitation in an alkaline solution and plating solution decomposition, adjustment of free metal ion concentration and plating rate, and the like (typically, ammonia, ethylenediamine, pyrophosphate, a citric acid, an acetic acid, various organic salts, or the like is used). The accelerator improves metal deposition efficiency while suppressing generation of a hydrogen gas as well as accelerating the plating rate, which is added in minute amounts (typically, sulfide or fluoride is used). The stabilizer functions to suppress generation of a reductive reaction except on the surface of an object to be plated. The stabilizer suppresses natural decomposition of a plating bath or the like and prevents a precipitate or the like generated with aging of a plating bath from reacting with the reducing agent so as not to intensely generate a hydrogen gas (typically, chloride, sulfide, or nitrate of lead, or the like is used). The improver improves the state of a plating film and improves luster and the like (typically, a surfactant is used).

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

In this embodiment mode, as the plating solution 60 containing a metal material, a mixture of nickel sulfate hexahydrate ($NiSO_4$) which is a metal salt, a hypophosphorous acid ($H_3PO_2$) which is a reducing agent, and a lactic acid and a malic acid which are complexing agents is used. A metal film to be deposited is a nickel phosphorus alloy (NiP) film.

The plating catalyst material 57a and the plating catalyst material 57b are adsorbed to cover the surface of the photocatalyst material 55. Since a metal film formed by plating is formed in multiple directions and three dimensions as well as in a film thickness direction, the source electrode layer or drain electrode layer 61a and the source electrode layer or drain electrode layer 61b are formed to cover an upper surface and a side surface of the photocatalyst material 55 as shown in FIG. 1C.

With the use of the source electrode layer or drain electrode layer 61a and the source electrode layer or drain electrode layer 61b as masks, an exposed unnecessary portion of the photocatalyst material 55 is etched to form a photocatalyst material 62a and a photocatalyst material 62b. It is needless to say that new masks may be formed over the source electrode layer or drain electrode layer 61a and the source electrode layer or drain electrode layer 61b, and then an exposed unnecessary portion of the photocatalyst material 55 may be etched. A semiconductor layer 63 is formed over the source electrode layer or drain electrode layer 61a and the source electrode layer or drain electrode layer 61b (see FIG. 1D). In this embodiment mode, the semiconductor layer 63 is formed using pentacene. Through the above steps, a coplanar thin film transistor in this embodiment mode can be manufactured.

In this embodiment mode, a photocatalyst material which adsorbs a plating catalyst element is selectively irradiated with light by backside light exposure to selectively adsorb the plating catalyst element onto the light-exposed photocatalyst material, thereby forming a source electrode layer and a drain electrode layer in a self-aligned manner. Accordingly, a defective shape or the like due to misalignment of a mask is not generated, and a wire can be formed with high controllability. Therefore, a high-reliability semiconductor device, display device, or the like can be manufactured with high yield by using the present invention.

In addition, a plating method is used; therefore, the thickness or size of a wire layer can be controlled relatively easily, and a wire layer can be manufactured to suit application. Therefore, a high-performance and high-reliability semiconductor device which can operate at high speed can also be manufactured.

Embodiment Mode 2

An embodiment mode of the present invention is explained with reference to FIGS. 2A to 2E. This embodiment mode is an example of selectively exposing a photocatalyst material. Therefore, repetitive explanation of the same portion or a portion having a similar function is omitted.

A gate electrode layer 91 is formed over a substrate 90 having a light transmitting property, and a gate insulating layer 92 is formed over the gate electrode layer 91. A photocatalyst material 95 is formed over the gate insulating layer 92 superposed over the gate electrode layer 91. A mask film 94 is formed over the photocatalyst material 95. The mask film 94 is a mask film against a plating catalyst material, and prevents the photocatalyst material from adsorbing the plating catalyst material onto its surface.

The photocatalyst material 95 is irradiated with light 99 that is transmitted through the substrate 90 having a light transmitting property from a light source 98 on the substrate 90 side having a light transmitting property. The light 99 is transmitted through the substrate 90 having a light transmitting property and the gate insulating layer 92, whereas it is blocked without being transmitted through the gate electrode layer 91 which has a non-light transmitting property. Therefore, a region of the photocatalyst material 95 superposed over the gate electrode layer 91 is a light-unexposed region, and only in a light-exposed region, the photocatalyst material is activated by light to decompose and remove a mask film to be formed thereover. In the photocatalyst material 95, a photocatalyst material 86a and a photocatalyst material 86b in the light-exposed region are activated, and the mask film 94 over the photocatalyst material 86a and the photocatalyst material 86b is decomposed and removed. On the other hand, in the photocatalyst material 95, the mask film in the light-unexposed region over the gate electrode layer 91 is not removed and remains as a mask film 85b. In the above steps, the mask film 94 is processed by a photocatalytic function of the photocatalyst material 95 into a mask film 85a, the mask film 85b, and a mask film 85c, and the photocatalyst material 86a and the photocatalyst material 86b are exposed (see FIG. 2B).

In this embodiment mode, the light 99 emitted from the light source 98 has such a wavelength as to decompose the mask film 94 utilizing a photocatalytic function of the photocatalyst material; therefore, the mask film 94 could not be removed only by irradiation with the light 99 and remains as the mask film 85a and the mask film 85c. However, with high-energy light having a shorter wavelength than that of the light 99, the mask film 94 can be decomposed and removed in a region irradiated with the light 99. In this embodiment mode, the light 99 needs to have such a wavelength as to be transmitted through the substrate 90 having a light transmitting property and the gate insulating layer 92 and such a wavelength as not to be transmitted through the gate electrode layer 91; therefore, the wavelength of the light 99 may be appropriately determined in accordance with materials used for them. In the present invention, a selection range of a wavelength of light is wide since performance of processing light is improved by the photocatalyst material.

Since the mask film 94 is formed of a material which is decomposed and removed by a photocatalytic effect caused by light irradiation and functions as a mask film against a plating catalyst material, the mask film 94 is preferably a thin film containing an organic material which hardly adsorbs a plating catalyst material. The mask film is desirably a thin film with a thickness of less than 10 nm, approximately several nanometers. A material containing a silane coupling agent can be used as a material which can be used for such a thin mask film.

The silane coupling agent is expressed by the chemical formula: $R_n$—Si—$X_{(4-n)}$ (n=1, 2, 3). Here, R represents a material containing a relatively inert group such as an alkyl group. X includes a hydrolytic group such as halogen, a methoxy group, an ethoxy group, or an acetoxy group that is bondable by a condensation of a hydroxyl group or adsorbed water on a base material surface.

As a typical example of the silane coupling agent, a fluorine-based silane coupling agent which has a fluoroalkyl group for R, (fluoroalkylsilane (hereinafter also referred to as FAS)), can be used. R in FAS has a structure expressed by $(CF_3)(CF_2)_x(CH_2)_y$ (X is an integer in the range of 0 to 10, and Y is an integer in the range of 0 to 4). When a plurality of Rs or Xs is bonded with Si, the Rs or Xs may be all the same or different from one another. The following can be given as typical FAS: heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane. Note that an FAS film is used as the mask film 94 in this embodiment mode.

Alternatively, a material including an alkyl group without a fluorocarbon group being provided in R of a silane coupling agent can also be used. Octadecyl trimethoxysilane or the like can be used as, for example, organosilane.

As a solvent of a material containing a silane coupling agent, a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalane; tetrahydrofuran; or the like can be used.

Figure 2A:
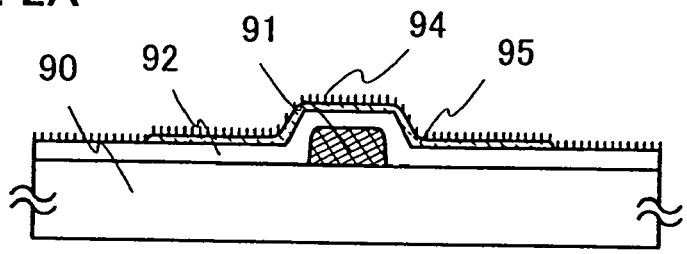
FIGS. 2A to 2E are conceptual diagrams explaining the present invention.
Figure 2B:
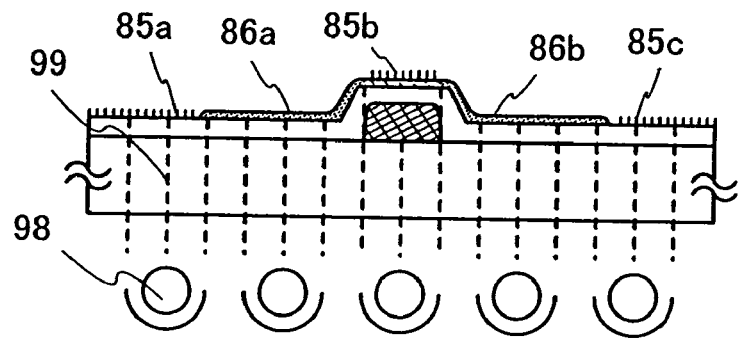
Figure 2C:
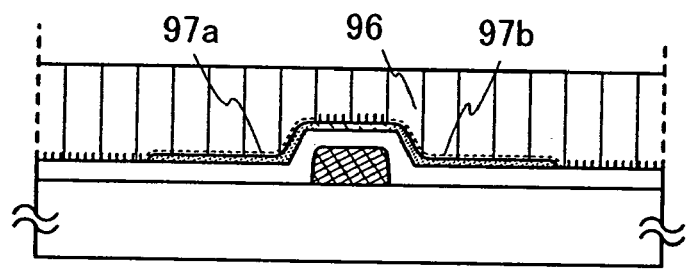

In order to adsorb a plating catalyst material onto the photocatalyst material 86a and the photocatalyst material 86b, the photocatalyst material 86a and the photocatalyst material 86b are immersed in a solution 96 containing a plating catalyst material to adsorb a plating catalyst material 97a and a plating catalyst material 97b onto the surface of the photocatalyst material 86a and the photocatalyst material 86b (see FIG. 2C). In this case, the surface of the photocatalyst material which is covered with the mask film 85b does not adsorb a plating catalyst material, so that a plating catalyst material can be selectively adsorbed. The pH of the solution containing a plating catalyst material is adjusted, and the pH is preferably adjusted to 3 to 6 with an alkaline solution or an acid solution. In this embodiment mode, palladium is used as the plating catalyst material, and a compound such as palladium chloride ($PdCl_2$) or palladium(II) sodium chloride ($2NaCl \cdot PdCl_2$) can be used. Since an acid water solution such as a hydrochloric acid is used in dissolving such a plating catalyst material, the pH of the solution becomes 2 or less. The pH is preferably 3 to 6 (more preferably, 4 to 5) to obtain a sufficient amount of plating catalyst material to be adsorbed or deposited; therefore, the pH is adjusted by adding potassium hydroxide (KOH), sodium hydroxide (NaOH), or the like. In this embodiment mode, a solution, which is produced by dissolving palladium (II) chloride ($PdCl_2$) in a dilute hydrochloric acid and adjusting the pH to approximately 4 to 6 with potassium hydroxide, is employed as the solution 96 containing a plating catalyst material. Note that immersion time in this embodiment mode is approximately 30 seconds to 3 minutes.

There is no limitation on the immersion method as long as the solution 96 containing a plating catalyst material is in contact with the photocatalyst material 86a and the photocatalyst material 86b. Thus, the substrate 90 having a light transmitting property may be placed obliquely (or vertically), and the solution 96 containing a plating catalyst material may be applied so as to flow on the surface of the photocatalyst material 86a and the photocatalyst material 86b. If plating is performed with a substrate placed obliquely (or vertically) and a solution applied, there is the advantage of miniaturizing an apparatus used for a step even in the case of using a large-area substrate.

Figure 2D:
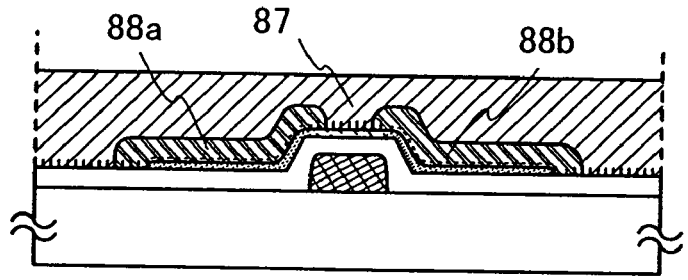
Figure 2E:
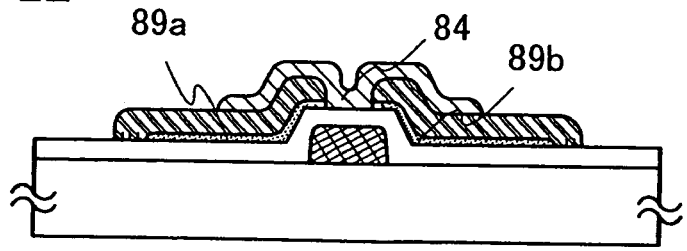
Figure 3A:
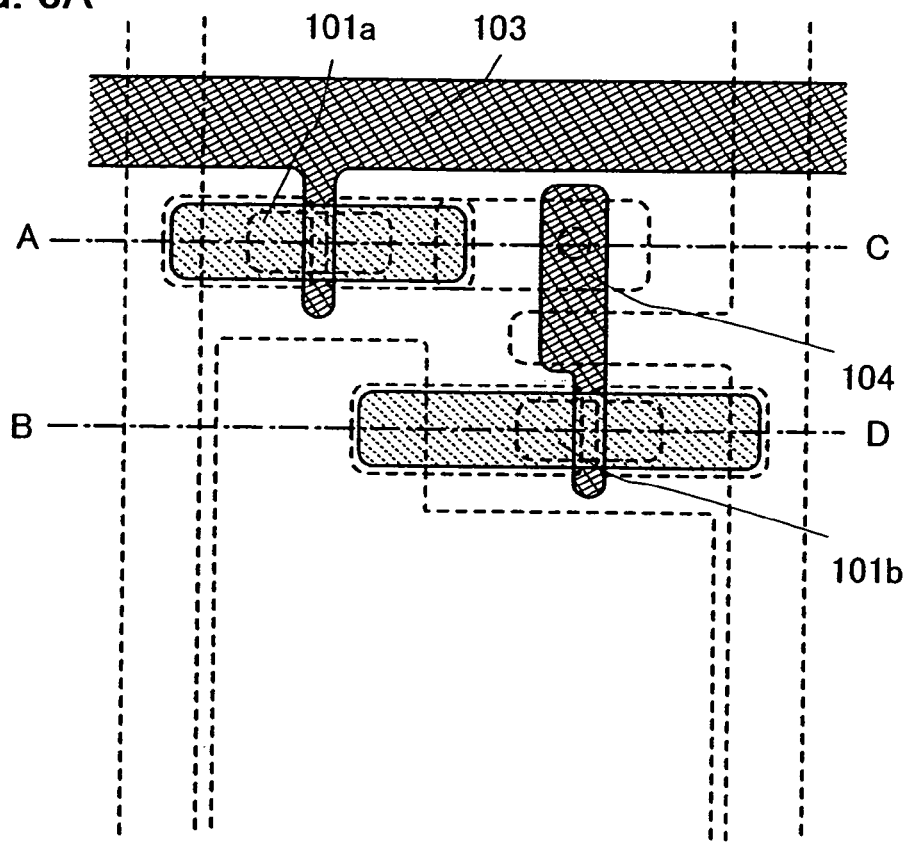
FIGS. 3A to 3C are diagrams explaining a method for manufacturing a display device of the present invention.
Figure 3B:
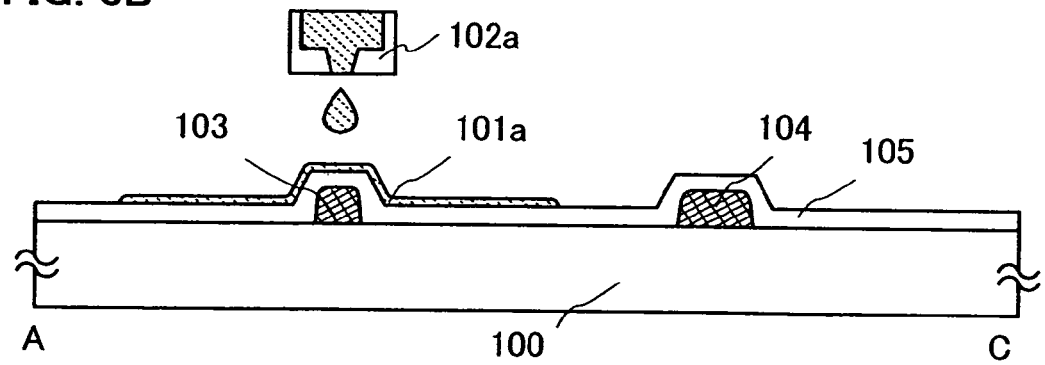
Figure 3C:
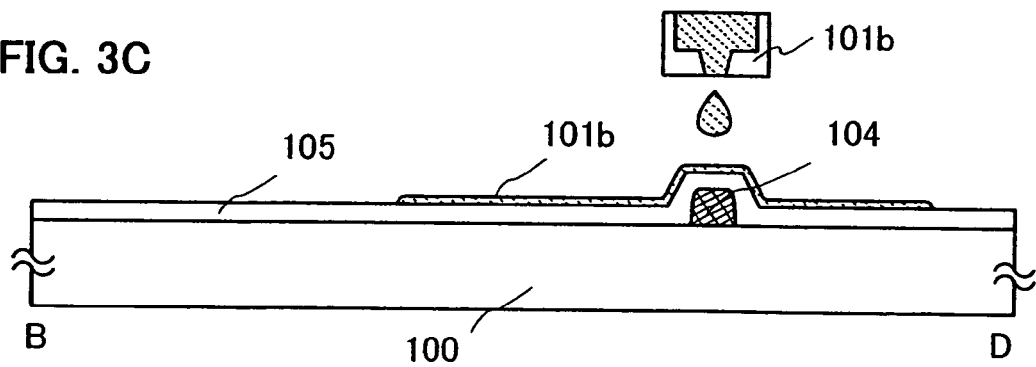

The photocatalyst material 86a and the photocatalyst material 86b adsorbing the plating catalyst material 97a and the plating catalyst material 97b onto its surface are immersed in a plating solution 87 containing a plating metal material, and a metal film is grown over the plating catalyst material 97a and the plating catalyst material 97b, and immersion time is controlled to reach a desired film thickness, thereby forming a source electrode layer or drain electrode layer 88a and a source electrode layer or drain electrode layer 88b in a self-aligned manner (see FIG. 2D). Since the source electrode layer or drain electrode layer 88a and the source electrode layer or drain electrode layer 88b can be formed in a self-aligned manner so as to hardly overlap the gate electrode layer 91, controllability thereof is high.

In this embodiment mode, as the plating solution 87 containing a metal material, a mixture of nickel sulfate hexahydrate ($NiSO_4$) which is a metal salt, a hypophosphorous acid ($H_3PO_2$) which is a reducing agent, and a lactic acid and a malic acid which are complexing agents is used. A metal film to be deposited is a nickel phosphorus alloy (NiP) film.

The plating catalyst material 97a and the plating catalyst material 97b are adsorbed to cover the surface of the photocatalyst material 86a and the photocatalyst material 86b. Since a metal film formed by plating is formed in multiple directions and three dimensions as well as in a film thickness direction, the source electrode layer or drain electrode layer 88a and the source electrode layer or drain electrode layer 88b are formed to cover upper surfaces and side surfaces of the photocatalyst material 86a and the photocatalyst material 86b as shown in FIG. 2D.

With the use of the source electrode layer or drain electrode layer 88a and the source electrode layer or drain electrode layer 88b as masks, an exposed unnecessary portion of the photocatalyst material 95 and the mask film 85b are etched to form a photocatalyst material 89a and a photocatalyst material 89b. It is needless to say that a new mask may be formed over the source electrode layer or drain electrode layer 88a and the source electrode layer or drain electrode layer 88b, and then the exposed unnecessary portion of the photocatalyst material 95 and the mask film 85b may be etched. A semiconductor layer 84 is formed over the source electrode layer or drain electrode layer 88a and the source electrode layer or drain electrode layer 88b (see FIG. 2E). In this embodiment mode, the semiconductor layer 84 is formed using pentacene. Through the above steps, a coplanar thin film transistor in this embodiment mode can be manufactured.

In this embodiment mode, a photocatalyst material which adsorbs a plating catalyst element is selectively irradiated with light by backside light exposure to adsorb the plating catalyst element onto the light-exposed photocatalyst material, thereby forming a source electrode layer and a drain electrode layer in a self-aligned manner. Accordingly, a defective shape or the like due to misalignment of a mask is not generated, and a wire can be formed with high controllability. Therefore, a high-reliability semiconductor device, display device, or the like can be manufactured with high yield by using the present invention.

In addition, a plating method is used; therefore, the thickness or size of a wire layer can be controlled relatively easily, and a wire layer can be manufactured to suit application. Therefore, a high-performance and high-reliability semiconductor device which can operate at high speed can also be manufactured.

Embodiment Mode 3

An embodiment mode of the present invention is explained with reference to FIGS. 13A to 13D. This embodiment mode is an example of forming a mask film over a photocatalyst material in Embodiment Mode 1. Therefore, repetitive explanation of the same portion or a portion having a similar function is omitted.

A gate electrode layer 71 is formed over a substrate 70 having a light transmitting property, and a gate insulating layer 72 is formed over the gate electrode layer 71. A photocatalyst material 75 is formed over the gate insulating layer 72 superposed over the gate electrode layer 71. A mask film 74 is formed over the photocatalyst material 75. The mask film 74 is a mask film against a plating catalyst material, and prevents the photocatalyst material from adsorbing the plating catalyst material onto its surface.

Figure 13A:
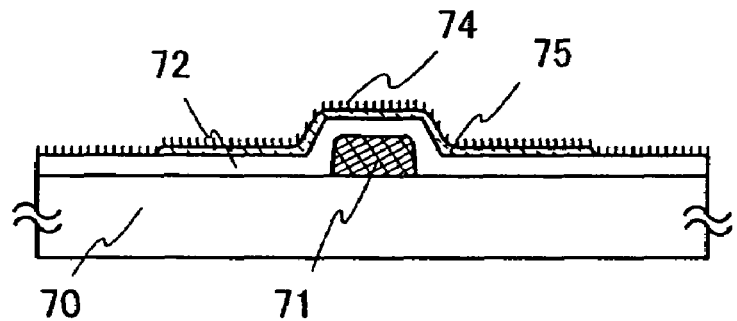
FIGS. 13A to 13D are conceptual diagrams explaining the present invention.
Figure 13B:
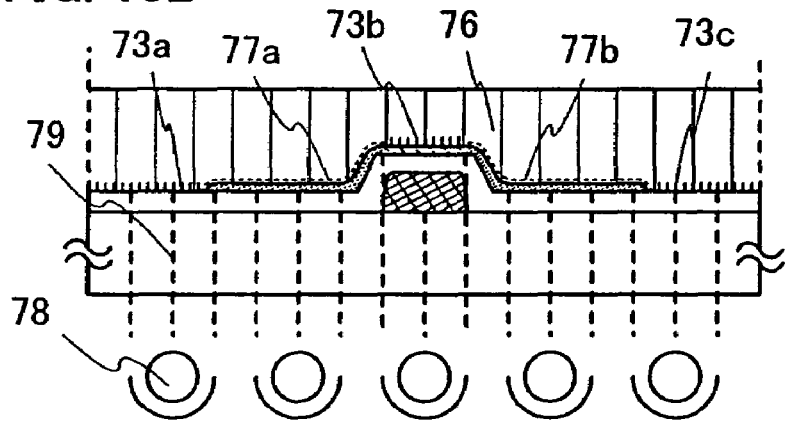

In this embodiment mode, a liquid composition containing titanium oxide that is a photocatalyst material is discharged by a droplet discharge method and solidified by drying and/or baking to form the photocatalyst material 75, and an FAS film is formed as the mask film 74 (see FIG. 13A).

In order to deposit a plating catalyst material on the photocatalyst material 75, while the photocatalyst material 75 is immersed in a solution 76 containing a plating catalyst material, the photocatalyst material 75 is irradiated with light 79 transmitted through the substrate 70 having a light transmitting property from a light source 78 on the substrate 70 side having a light transmitting property. The light 79 is transmitted through the substrate 70 having a light transmitting property and the gate insulating layer 72, whereas it is blocked without being transmitted through the gate electrode layer 71 having a non-light transmitting property. Therefore, a region of the photocatalyst material 75, which is superposed over the gate electrode layer 71, is a light-unexposed region, and only in a light-exposed region, the photocatalyst material is activated by light to decompose and remove the mask film formed thereover. In the photocatalyst material 75, the light-exposed region is activated, and the mask film 74 over the light-exposed region is decomposed and removed. On the other hand, in the photocatalyst material 75, the mask film in the light-unexposed region over the gate electrode layer 71 is not removed and remains as a mask film 73b. In the step, the mask film 74 is processed by a photocatalytic function of the photocatalyst material 75 into a mask film 73a, a mask film 73b, and a mask film 73c, and the photocatalyst material 75 in the light-exposed region is exposed. The exposed photocatalyst material is in contact with the solution 76 containing a plating catalyst material and a plating catalyst material 77a and a plating catalyst material 77b are selectively deposited on its surface by its photocatalytic function (see FIG. 13B).

The photocatalyst material may be selectively irradiated with light by backside light exposure to deposit the plating catalyst material as in Embodiment Mode 1, but a mask film may further be combined as in this embodiment mode. The plating catalyst material is not deposited in a region of the photocatalyst material 75 covered with the mask film 73b, and the plating catalyst material 77a and the plating catalyst material 77b can be certainly formed with high controllability.

In the case where the photocatalyst material is activated by light irradiation as described above and a photocatalytic function of the photocatalyst material is utilized, the pH of the solution containing a plating catalyst material is not necessarily adjusted. The light 79 is set to light having such a wavelength as to generate a photocatalytic function of the photocatalyst material 75, and light irradiation time and immersion time are appropriately adjusted depending on light energy. In this embodiment mode, titanium oxide is used as the photocatalyst material 75; therefore, irradiation is performed using ultraviolet light as the light 79.

When using a photocatalytic function, sodium hydroxide (NaOH), potassium hydroxide (KOH), or the like does not need to be added to the solution containing a plating catalyst material for pH control. Therefore, the use of a photocatalytic function has an advantage in that a material which may have an adverse effect such as potassium hydroxide (KOH) does not need to be used depending on materials of a semiconductor layer.

There is no limitation on the immersion method as long as the solution 76 containing a plating catalyst material is in contact with the photocatalyst material 75. Therefore, the substrate 70 having a light transmitting property may be placed obliquely (or vertically), and the solution 76 containing a plating catalyst material may be applied so as to flow on the surface of the photocatalyst material 75 over the substrate 70 having a light transmitting property. If plating is performed with a substrate placed obliquely (or vertically) and a solution applied, there is the advantage of miniaturizing an apparatus used for a step even in the case of using a large-area substrate.

Figure 13C:
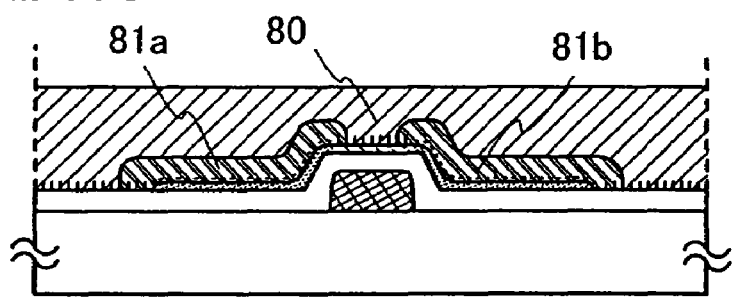
Figure 13D:
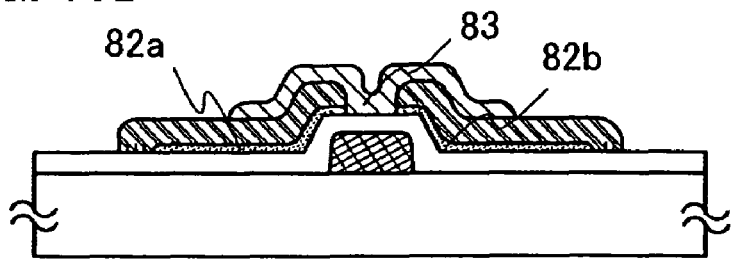
Figure 14A:
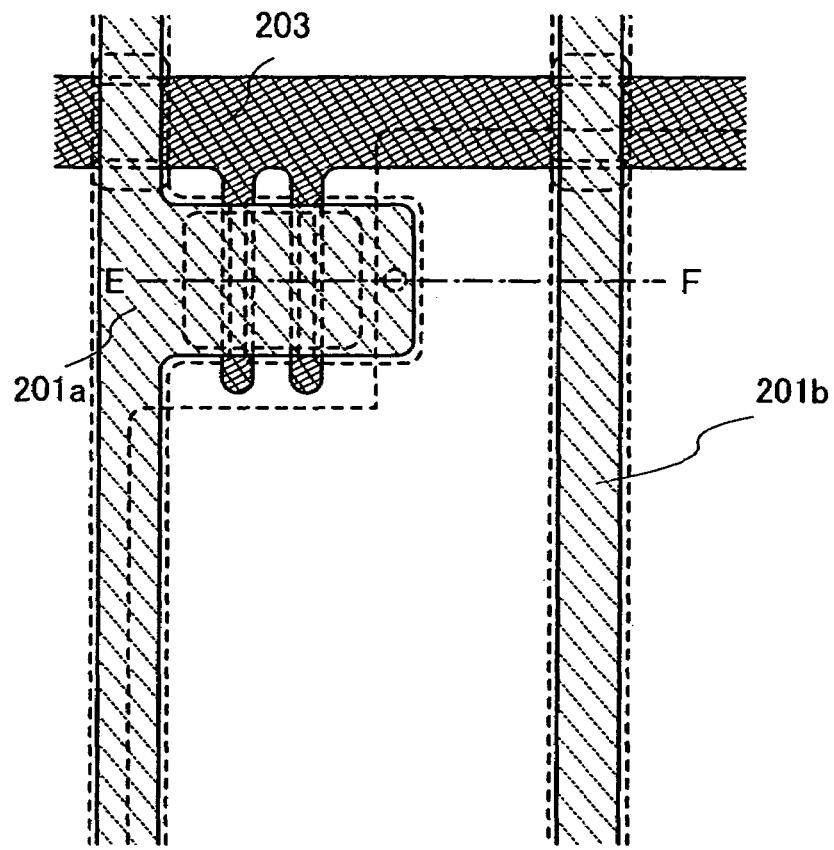
FIGS. 14A and 14B are diagrams explaining a method for manufacturing a display device of the present invention.
Figure 14B:
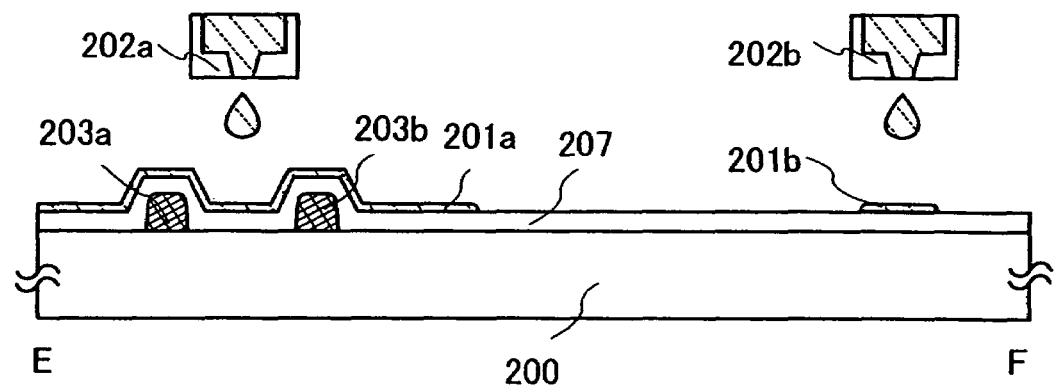

The photocatalyst material 75 adsorbing the plating catalyst material 77a and the plating catalyst material 77b onto its surface is immersed in a plating solution 80 containing a plating metal material, and a metal film is grown over the plating catalyst material 77a and the plating catalyst material 77b, and immersion time is controlled to reach a desired film thickness, thereby forming a source electrode layer or drain electrode layer 81a and a source electrode layer or drain electrode layer 81b in a self-aligned manner (see FIG. 13C). Since the source electrode layer or drain electrode layer 81a and the source electrode layer or drain electrode layer 81b can be formed in a self-aligned manner so as to hardly overlap the gate electrode layer 71, controllability thereof is high.

In this embodiment mode, as the solution 80 containing a metal material, a mixture of nickel sulfate hexahydrate (NiSO$_4$) which is a metal salt, a hypophosphorous acid (H$_3$PO$_2$) which is a reducing agent, and a lactic acid and a malic acid which are complexing agents is used. A metal film to be deposited is a nickel phosphorus alloy (NiP) film.

The plating catalyst material 77a and the plating catalyst material 77b are adsorbed to cover the surface of the photocatalyst material 75. Since a metal film formed by plating is formed in multiple directions and three dimensions as well as in a film thickness direction, the source electrode layer or drain electrode layer 81a and the source electrode layer or drain electrode layer 81b are formed to cover an upper surface and a side surface of the photocatalyst material 75 as shown in FIG. 13C.

With the use of the source electrode layer or drain electrode layer 81a and the source electrode layer or drain electrode layer 81b as masks, exposed unnecessary portions of the photocatalyst material 75 and the mask film 73b are etched to form a photocatalyst material 82a and a photocatalyst material 82b. It is needless to say that a new mask may be formed over the source electrode layer or drain electrode layer 81a and the source electrode layer or drain electrode layer 81b, and then an exposed unnecessary portion of the photocatalyst material 75 may be etched. A semiconductor layer 83 is formed over the source electrode layer or drain electrode layer 81a and the source electrode layer or drain electrode layer 81b (see FIG. 13D). In this embodiment mode, the semiconductor layer 83 is formed using pentacene. Through the above steps, a coplanar thin film transistor in this embodiment mode can be manufactured.

In this embodiment mode, a photocatalyst material which adsorbs a plating catalyst element is selectively irradiated with light by backside light exposure to selectively adsorb the plating catalyst element onto the light-exposed photocatalyst material, thereby forming a source electrode layer and a drain electrode layer in a self-aligned manner. Accordingly, a defective shape or the like due to misalignment of a mask is not generated, and a wire can be formed with high controllability. Therefore, a high-reliability semiconductor device, display device, or the like can be manufactured with high yield by using the present invention.

In addition, a plating method is used; therefore, the thickness or size of a wire layer can be controlled relatively easily, and a wire layer can be manufactured to suit application. Therefore, a high-performance and high-reliability semiconductor device which can operate at high speed can also be manufactured.

Embodiment Mode 4

Figure 27A:
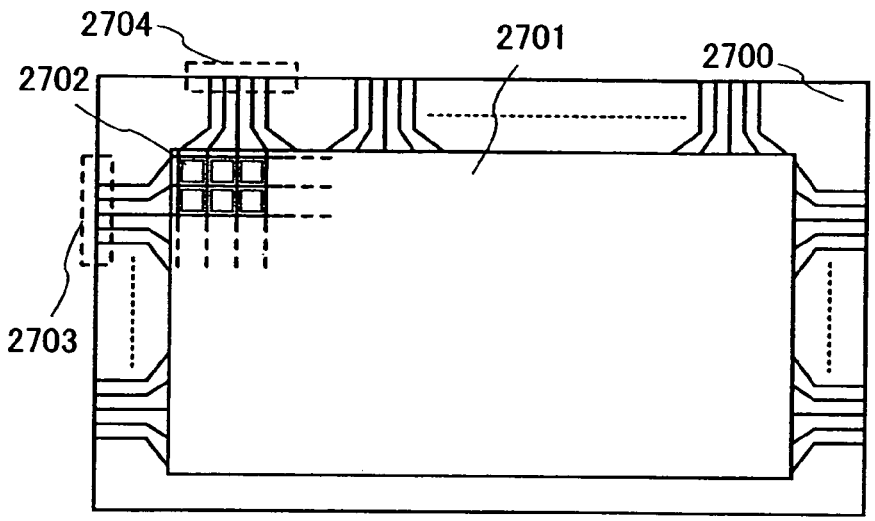
FIGS. 27A to 27C are top views of display devices of the present invention.

FIG. 27A is a top view showing a structure of a display panel according to the present invention. A pixel portion 2701 in which pixels 2702 are arranged in matrix, a scan line input terminal 2703, and a signal line input terminal 2704 are formed over a substrate 2700 having an insulating surface. The number of pixels may be determined in accordance with various standards. In the case of XGA, the number of pixels is 1024×768×3 (RGB). In the case of UXGA, the number of pixels is 1600×1200×3 (RGB), and in the case of full-spec high-definition display, it is 1920×1080×3 (RGB).

The pixels 2702 are formed in matrix by intersections of scan lines extended from the scan line input terminal 2703 and signal lines extended from the signal line input terminal 2704. Each pixel 2702 is provided with a switching element and a pixel electrode connected thereto. A typical example of the switching element is a TFT. A gate electrode of the TFT is connected to the scan line, and a source or a drain of the TFT is connected to the signal line, which enables each pixel to be independently controlled by a signal inputted from the outside.

Figure 28A:
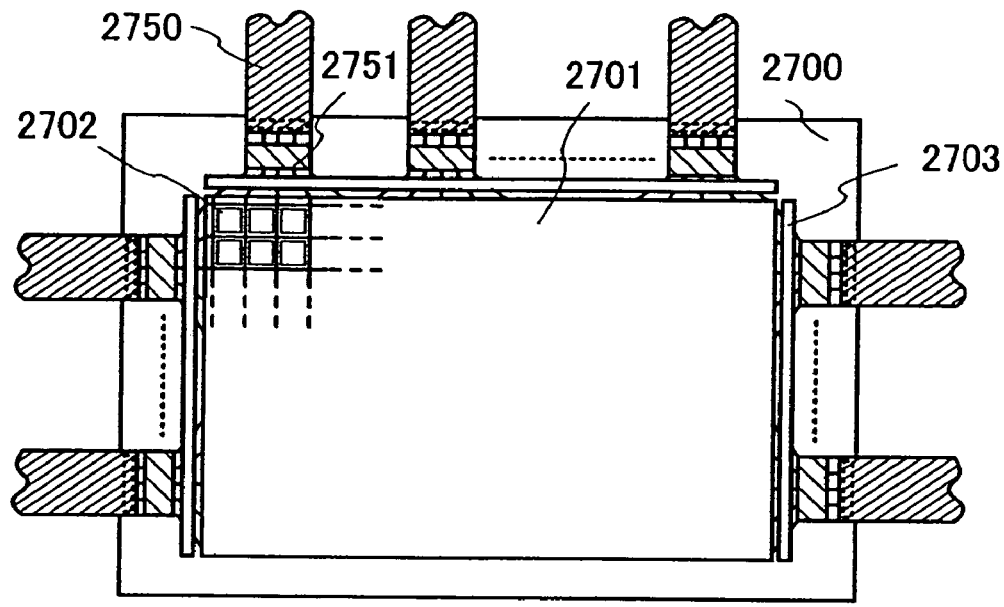
FIGS. 28A and 28B are top views of display devices of the present invention.
Figure 28B:
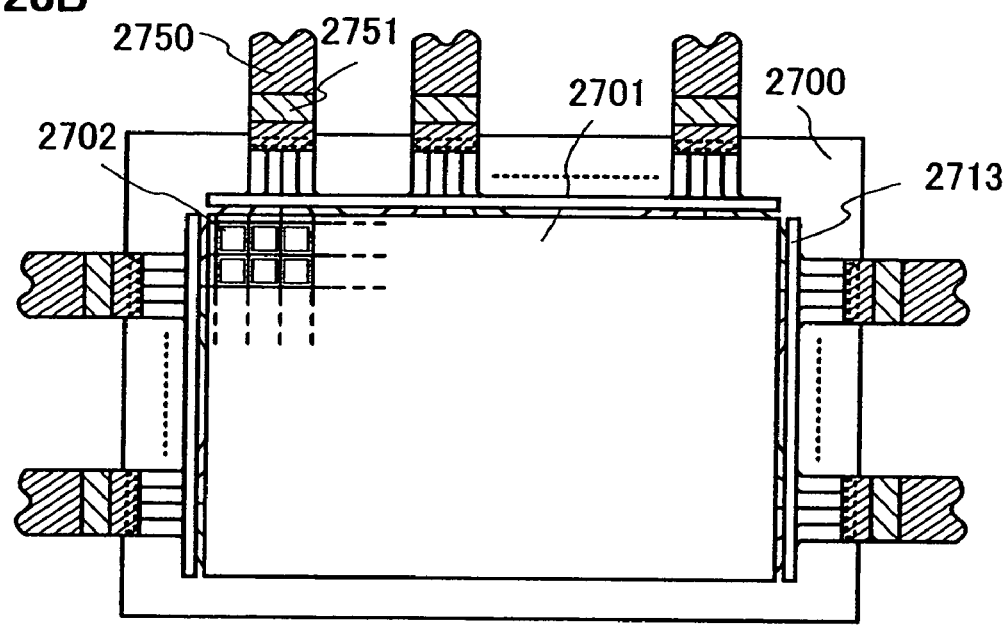

FIG. 27A shows a structure of a display panel in which a signal to be inputted to the scan line and the signal line is controlled by an external driver circuit. Alternatively, a driver IC 2751 may be mounted on the substrate 2700 by a COG (Chip On Glass) method as shown in FIG. 28A. As another mounting mode, a TAB (Tape Automated Bonding) method may also be used as shown in FIG. 28B. The driver IC may be formed over a single crystal semiconductor substrate or may be formed of a TFT over a glass substrate. In each of FIGS. 28A and 28B, the driver IC 2751 is connected to an FPC 2750.

Figure 27B:
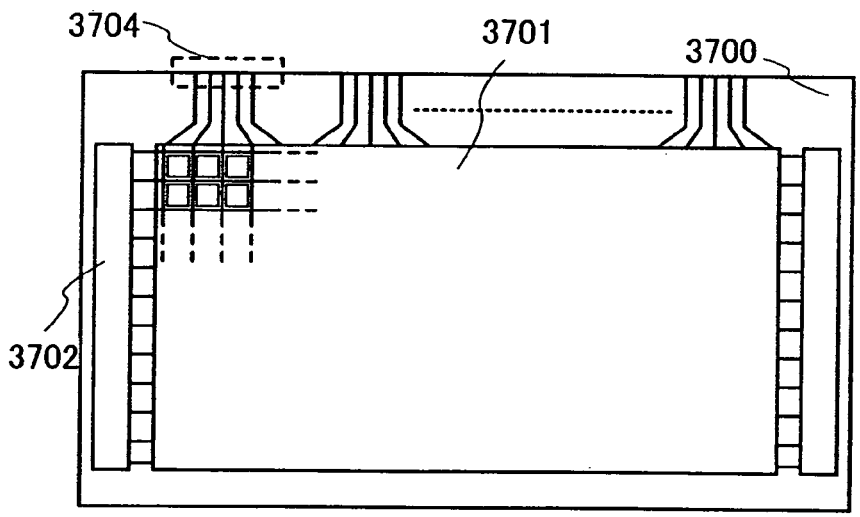
Figure 27C:
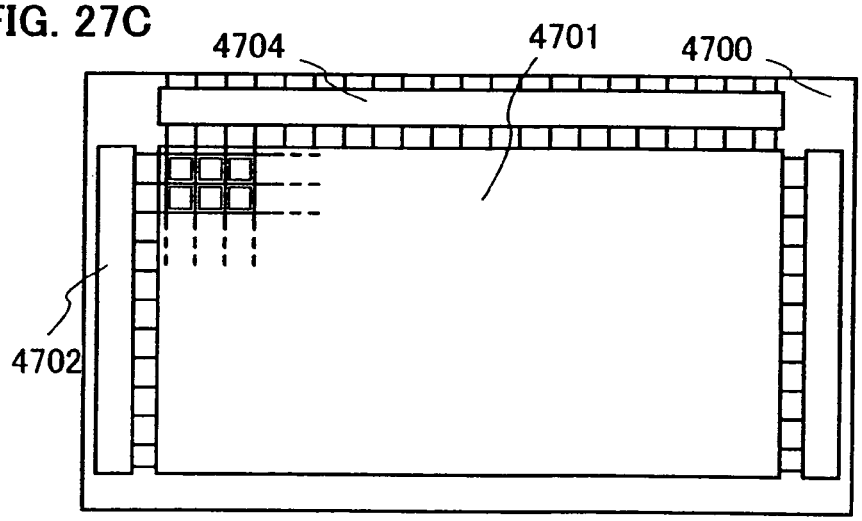

When a TFT provided in a pixel is formed of a polycrystalline (microcrystalline) semiconductor having high crystallinity, a scan line driver circuit 3702 can be formed over a substrate 3700 as shown in FIG. 27B. In FIG. 27B, reference numeral 3701 denotes a pixel portion, and a signal line driver circuit is controlled by an external driver circuit in the same manner as in FIG. 27A. As the TFT formed in the present invention, when the TFT provided in a pixel is formed of a polycrystalline (microcrystalline) semiconductor, a single crystal semiconductor, or the like having high mobility, a scan line driver circuit 4702 and a signal line driver circuit 4704 can be integrated over a glass substrate 4700 as shown in FIG. 27C.

Figure 7A:
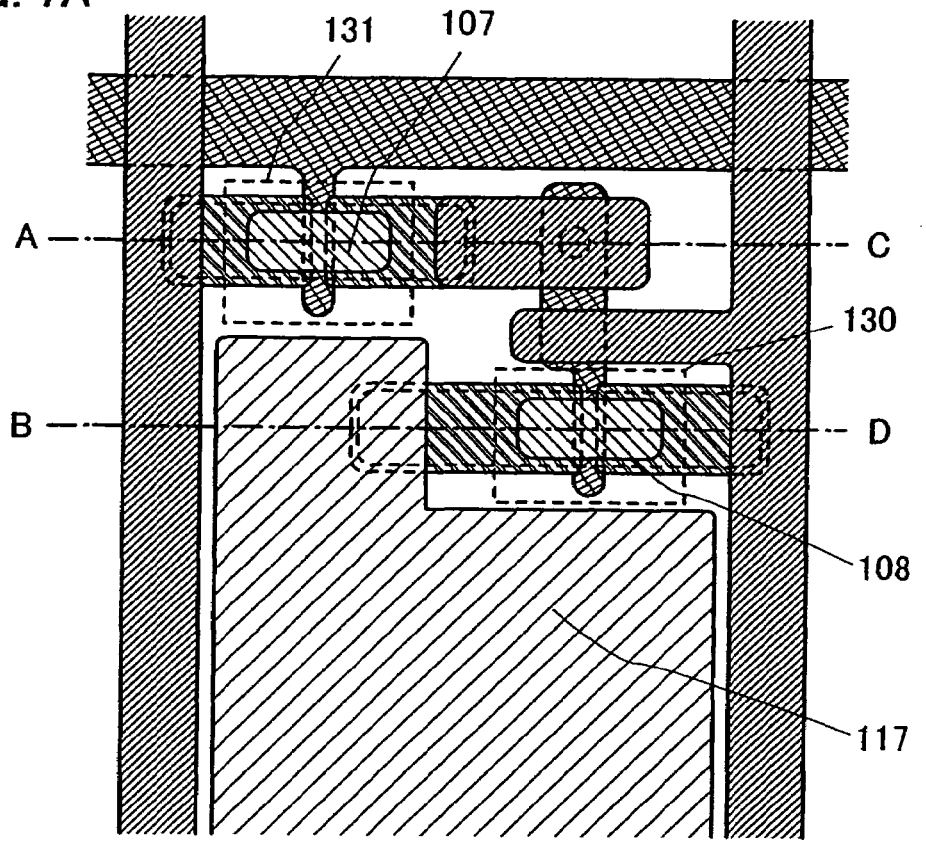
FIGS. 7A to 7C are diagrams explaining a method for manufacturing a display device of the present invention.
Figure 7B:
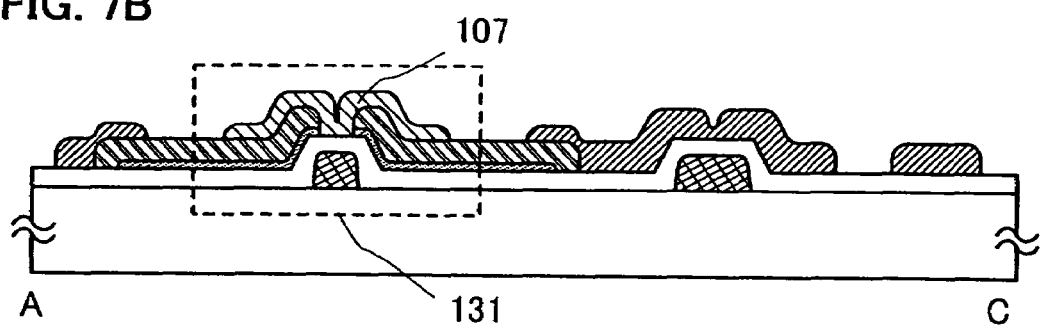
Figure 7C:
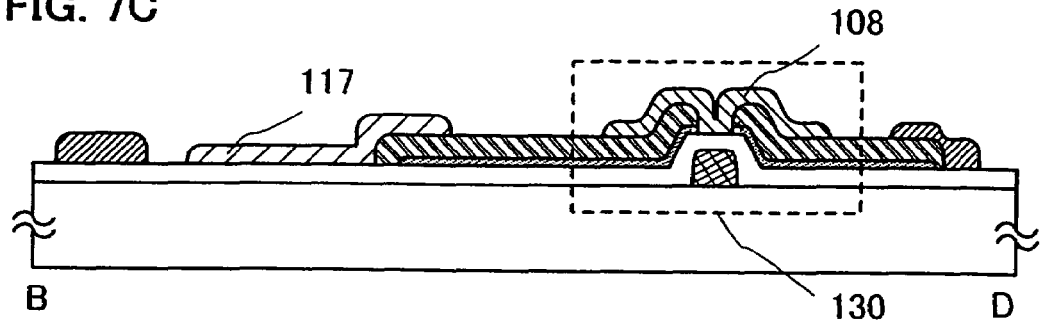
Figure 8A:
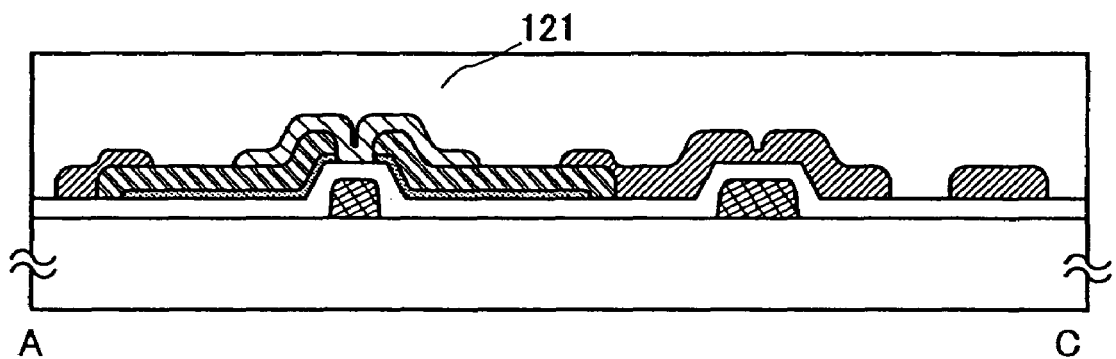
FIGS. 8A and 8B are diagrams explaining a method for manufacturing a display device of the present invention.
Figure 8B:
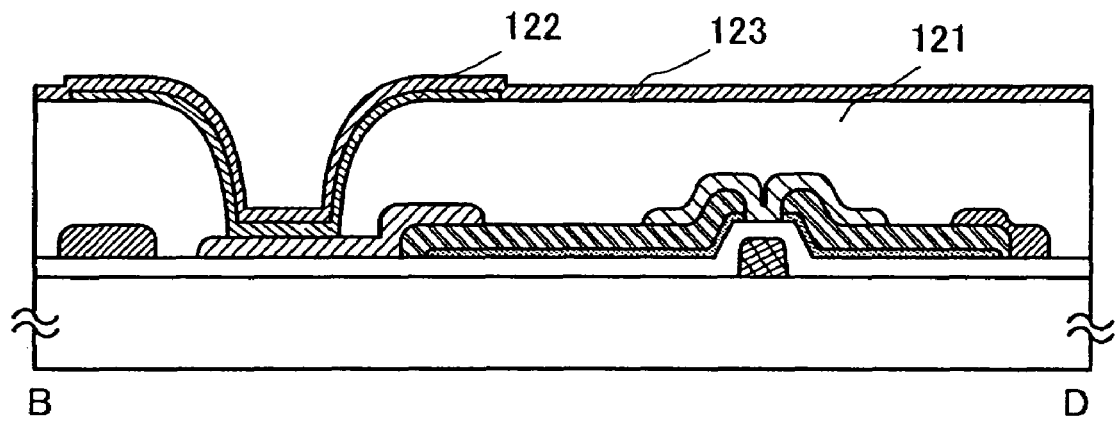
Figure 9A:
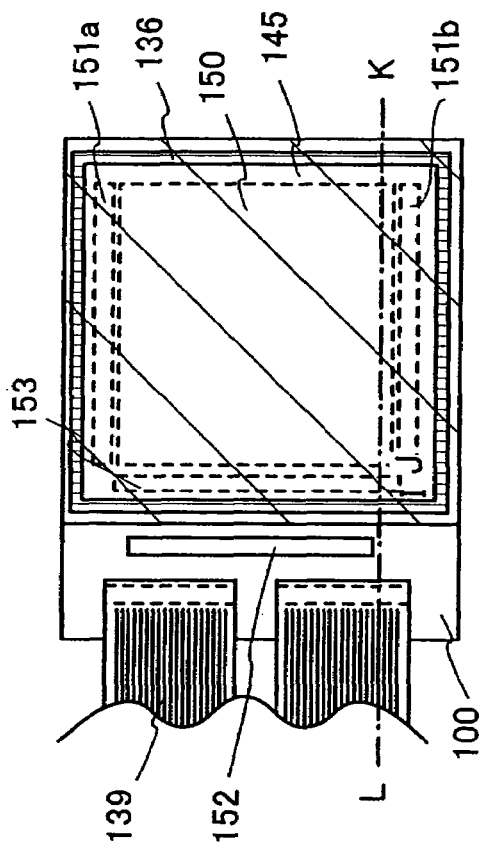
FIGS. 9A and 9B are diagrams explaining a display device of the present invention.
Figure 9B:
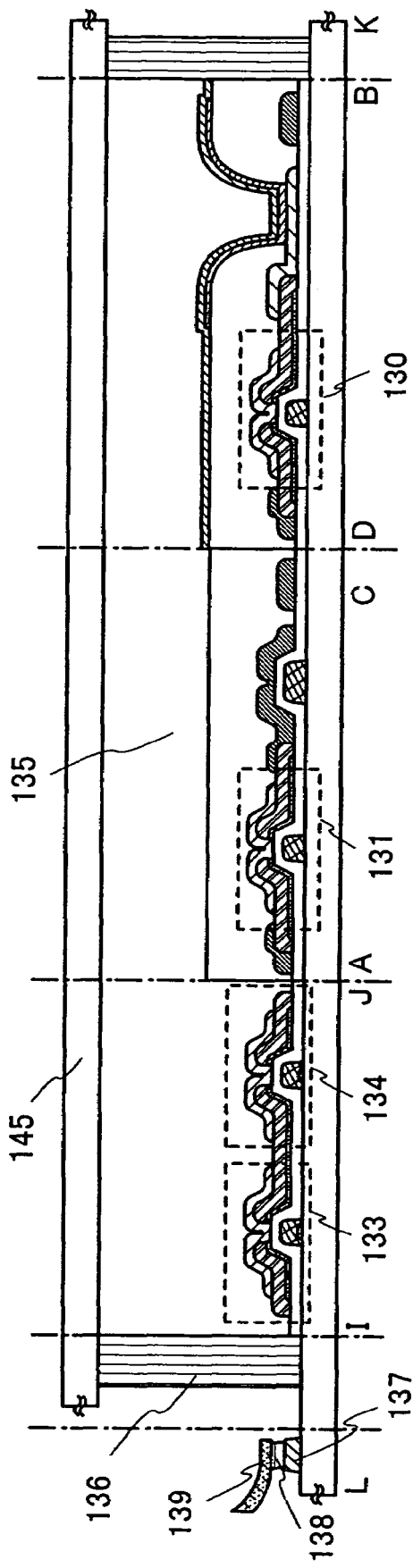

An embodiment mode of the present invention is explained with reference to FIGS. 3A to 9B. More specifically, a method for manufacturing a display device including a bottom-gate coplanar thin film transistor, to which the invention is applied, is explained. FIGS. 3A, 4A, 5A, 6A, and 7A are top views of a pixel portion of a display device. FIGS. 3B, 4B, 5B, 6B, and 7B are cross-sectional views taken along a line A-C in FIGS. 3A, 4A, 5A, 6A, and 7A and FIGS. 3C, 4C, 5C, 6C, and 7C are cross-sectional views taken along a line B-D. FIGS. 8A and 8B are cross-sectional views of display devices, and FIG. 9A is a top view. FIG. 9B is a cross-sectional view taken along a line L-K (including a line I-J) in FIG. 9A.

A glass substrate made of barium borosilicate glass, alumino borosilicate glass, or the like; a quartz substrate; or a plastic substrate which can withstand the process temperature of this manufacturing process is used as a substrate 100. A surface of the substrate 100 may be polished by a CMP method or the like so as to be planarized. In this embodiment mode, light irradiation treatment is performed through the substrate 100; therefore, the substrate 100 needs to have a light transmitting property with the use of a material which transmits light used for the treatment.

Note that an insulating layer may be formed over the substrate 100. The insulating layer is formed using a single layer or laminated layer of an oxide material and/or a nitride material containing silicon by a method such as a CVD method, a plasma CVD method, a sputtering method, or a spin coating method. Alternatively, an acrylic acid, a methacrylic acid, or a derivative thereof; a heat-resistant high molecular compound such as polyimide, aromatic polyamide, or polybenzimidazole; or a siloxane resin may be used. Note that the siloxane resin corresponds to a resin including a Si—O—Si bond. Siloxane has a skeleton formed of the bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin of polyvinyl alcohol, polyvinylbutyral, or the like, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Furthermore, a droplet discharge method, a printing method (such as screen printing or offset printing by which a pattern is formed), a coating method such as a spin coating method, a dipping method, or the like can be used. This insulating layer does not necessarily need to be formed, but it has the effect of blocking a contaminant or the like from the substrate 100.

In the present invention, in irradiating a photocatalyst material formed over the substrate 100 with light, light irradiation is performed by backside light exposure from the substrate 100 side so as to pass through the substrate 100 to activate the formed photocatalyst material. Therefore, the substrate 100 needs to be formed using a material which transmits enough light (wavelength, energy, or the like of light) to activate the photocatalyst material.

A gate electrode layer 103 and a gate electrode layer 104 are formed over the substrate 100. The gate electrode layer 103 and the gate electrode layer 104 can be formed using a CVD method, a sputtering method, a droplet discharge method, or the like. The gate electrode layer 103 and the gate electrode layer 104 may be formed of an element selected from Ag, Au, Ni, Pt, Pd, Ir, Rh, Ta, W, Ti, Mo, Al, and Cu or an alloy or compound material containing the above element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (TiN) film and a molybdenum (Mo) film or a three-layer structure in which a tungsten film having a thickness of 50 nm, an alloy film of aluminum and silicon (Al—Si) having a thickness of 500 nm, and a titanium nitride film having a thickness of 30 nm are sequentially laminated may be used. Further, in the case of the three-layer structure, tungsten nitride may be used instead of tungsten as a first conductive film, an alloy film of aluminum and titanium (Al—Ti) may be used instead of the alloy film of aluminum and silicon (A—Si) as a second conductive film, and a titanium film may be used instead of the titanium nitride film as a third conductive film.

In the case where etching processing is required to form the gate electrode layer 103 and the gate electrode layer 104, the processing may be performed by dry etching or wet etching after forming a mask. The electrode layers can be etched into a tapered shape by using an ICP (Inductively Coupled Plasma) etching method and appropriately adjusting the etching condition (the amount of electric power applied to a coiled electrode, the amount of electric power applied to an electrode on a substrate side, the temperature of the electrode on the substrate side, or the like). Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used for the etching gas.

The mask can be formed by selectively discharging a composition. When the mask is selectively formed in such a way, it becomes possible to simplify the step of processing the mask shape. A resin material such as an epoxy resin, an acrylic resin, a phenol resin, a novolac resin, a melamine resin, or a urethane resin is used for the mask. In addition, the mask is formed by a droplet discharge method using an organic material such as benzocyclobutene, parylene, fluorinated arylene ether, or permeable polyimide; a compound material made by polymerization of a siloxane-based polymer or the like; a composition material containing a water-soluble homopolymer and a water-soluble copolymer; or the like. Alternatively, a commercial resist material containing a photosensitizer may be used. For example, a typical positive type resist such as a novolac resin or a naphthoquinone diazide compound that is a photosensitizer, or a negative type resist such as a base resin, diphenylsilanediol, or an acid generator may be used. In using whichever material, the surface tension and the viscosity are appropriately controlled by adjusting the concentration of a solvent or adding a surfactant or the like.

In the case of forming the mask by a droplet discharge method in this embodiment mode, treatment to control wettability of a formation region and the vicinity thereof may be performed as pretreatment. In the present invention, when a conductive layer or an insulating layer is formed by discharging a droplet by a droplet discharge method, the shape of the conductive layer or the insulating layer can be controlled by controlling wettability of the formation region of the conductive layer or the insulating layer and the vicinity thereof. By this treatment, the conductive layer or the insulating layer can be formed with high controllability. The wettability may be controlled in accordance with the shape of a conductive layer or an insulating layer to be formed. Wettability may be uniform, or may be differentiated to form a plurality of regions having a difference in wettability in a formation region. In the case of using a liquid material, this step is applicable as pretreatment of forming every conductive layer or insulating layer.

In this embodiment mode, the gate electrode layer 103 and the gate electrode layer 104 are formed using a droplet discharge means. The droplet discharge means is a general term for a means that discharges a droplet, such as a nozzle having a discharge opening of a composition, or a head equipped with a single or plurality of nozzles. The diameter of the nozzle included in the droplet discharge means is set in the range of 0.02 μm to 100 μm (preferably, 30 μm or less), and the amount of the composition to be discharged from the nozzle is set in the range of 0.001 pl to 100 pl (preferably, 0.1 pl to 40 pl, more preferably, 10 pl or less). The amount of the composition to be discharged increases in proportion to the size of the nozzle diameter. Further, it is preferable that the distance between an object to be treated and the discharge opening of the nozzle is as short as possible in order to drop a droplet on a desired position. Preferably, the distance is set approximately within the range of 0.1 mm to 3 mm (more preferably, 1 mm or less).

Figure 20:
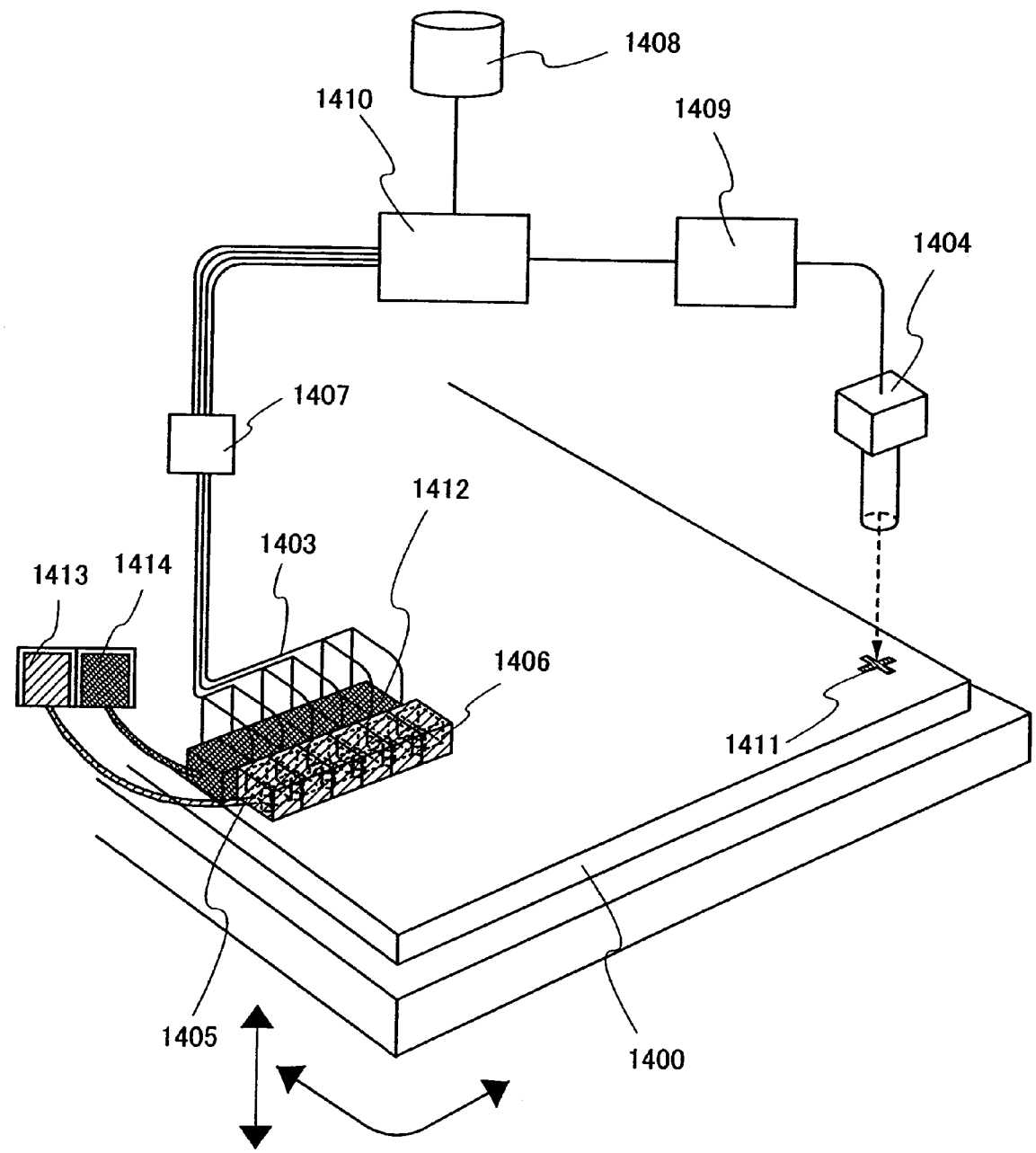
FIG. 20 is a diagram explaining a structure of a droplet discharge apparatus applicable to the present invention.

One mode of a droplet discharge apparatus used for a droplet discharge method is shown in FIG. 20. Each of heads 1405 and 1412 of a droplet discharge means 1403 is connected to a control means 1407, and this control means 1407 is controlled by a computer 1410, so that a preprogrammed pattern can be formed. The formation position may be determined, for example, based on a marker 1411 that is formed over a substrate 1400. Alternatively, a reference point may be fixed based on an edge of the substrate 1400. The reference point is detected by an imaging means 1404, and converted into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor (CMOS) can be used as the imaging means 1404. Naturally, information about a pattern to be formed over the substrate 1400 is stored in a storage medium 1408, and the control signal is transmitted to the control means 1407 based on the information, so that each of the heads 1405 and 1412 of the droplet discharge means 1403 can be individually controlled. The heads 1405 and 1412 are supplied with a material to be discharged, from material supply sources 1413 and 1414 through pipes, respectively.

The head 1405 has an internal structure which includes a space filled with a liquid material as indicated by dotted lines 1406 and a nozzle which is a discharge opening. Although not shown, an internal structure of the head 1412 is similar to that of the head 1405. When the nozzle sizes of the heads 1405 and 1412 are different from each other, different materials with different widths can be discharged simultaneously. Also, a conductive material, an organic material, an inorganic material, or the like can each be discharged from one head. In the case of drawing over a large area such as an interlayer film, one material can be simultaneously discharged from a plurality of nozzles to improve throughput, and thus, drawing can be performed. When a large-sized substrate is used, the heads 1405 and 1412 can freely move over the substrate in a direction indicated by arrows in FIG. 20, and a drawing region can be freely set. Thus, a plurality of the same pattern can be drawn over one substrate.

In the case of forming a film (such as an insulating film or a conductive film) by a droplet discharge method, the film is formed as follows: a composition containing a film material which is processed into a particle form is discharged, and the composition is fused or welded by baking and is solidified. Many of films formed by a sputtering method or the like have a columnar structure, whereas many of films formed by discharging and baking the composition containing a conductive material in this way have a polycrystalline structure having a large number of grain boundaries.

For the composition to be discharged from the discharge opening, a conductive material dissolved or dispersed in a solvent is used. The conductive material corresponds to a fine particle or a dispersed nanoparticle of metal such as Ag, Au, Cu, Ni, Pt, Pd, Ir, Rh, W, or Al, sulfide of metal such as Cd or Zn, oxide of Fe, Ti, Si, Ge, Zr, Ba, or the like, silver halide, or the like. The conductive material may be a mixture thereof. In addition, a transparent conductive film transmits light at the time of backside light exposure since it has a light transmitting property, but it can be used as a laminated body with a material which does not transmit light. For the transparent conductive film, indium tin oxide (ITO), indium tin silicon oxide (ITSO) that contains indium tin oxide and silicon oxide, organic indium, organic tin, zinc oxide, titanium nitride, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. However, as for the composition to be discharged from the discharge opening, it is preferable to use one of the materials of gold, silver, and copper dissolved or dispersed in a solvent, taking into consideration a specific resistance value. It is more preferable to use silver or copper having a low resistance value. However, when silver or copper is used, a barrier film may be additionally provided as a countermeasure against impurities. A silicon nitride film or a nickel boron (NiB) film can be used as the barrier film.

The composition to be discharged is a conductive material dissolved or dispersed in a solvent, which contains a dispersant, or a thermosetting resin called a binder as well. In particular, the binder has a function to prevent the generation of cracks or uneven baking during baking. Thus, a formed conductive film may contain an organic material. The organic material to be contained depends on heating temperature, atmosphere, or time. This organic material is an organic resin which functions as a binder, a solvent, a dispersant, and a coating of a metal particle. A typical example thereof is an organic resin such as polyimide, acrylic, a novolac resin, a melamine resin, a phenol resin, an epoxy resin, a silicon resin, a furan resin, or a diallyl phthalate resin.

In addition, a particle with a plurality of layers, in which a conductive material is coated with another conductive material, may be used. For example, a three-layer structure particle in which copper is coated with nickel boron (NiB), which is further coated with silver, may be used. As for the solvent, esters such as butyl acetate or ethyl acetate, alcohols such as isopropyl alcohol or ethyl alcohol, an organic solvent such as methyl ethyl ketone or acetone, water, or the like is used. The viscosity of the composition is preferably 20 mPa·s (cp) or less. This prevents the composition from drying, and enables the composition to be discharged smoothly from the discharge opening. The surface tension of the composition is preferably 40 mN/m or less. However, the viscosity of the composition and the like may be appropriately controlled depending on a solvent to be used and an intended purpose. For example, the viscosity of a composition in which ITO, organic indium, or organic tin is dissolved or dispersed in a solvent may be set to 5 mPa·s to 20 mPa·s, the viscosity of a composition in which silver is dissolved or dispersed in a solvent may be set to 5 mPa·s to 20 mPa·s, and the viscosity of a composition in which gold is dissolved or dispersed in a solvent may be set to 5 mPa·s to 20 mPa·s.

The conductive layer may be formed by laminating a plurality of conductive materials. In addition, the conductive layer may be formed first by a droplet discharge method using silver as a conductive material, and may then be plated with copper or the like. The plating may be performed by an electroplating or chemical (electroless) plating method. The plating may be performed by immersing a substrate surface in a container filled with a solution containing a plating material; alternatively, the solution containing a plating material may be applied with the substrate placed obliquely (or vertically) and the solution containing a plating material applied so as to flow on the substrate surface. When the plating is performed by applying a solution with the substrate placed obliquely (or vertically), there is the advantage of miniaturizing a process apparatus.

The diameter of a particle of the conductive material is preferably as small as possible, for the purpose of preventing nozzles from being clogged and for manufacturing a minute pattern, although it depends on the diameter of each nozzle, a desired shape of a pattern, and the like. Preferably, the diameter of the particle of the conductive material is 0.1 µm or less. The composition is formed by a method such as an electrolyzing method, an atomizing method, a wet reduction method, and the particle size to be obtained is typically about 0.01 µm to 10 µm. However, when a gas evaporation method is employed, nanoparticles protected by a dispersant are minute, each having a size of about 7 nm, and when the surface of each particle is covered with a coating, the nanoparticles do not aggregate in the solvent and are uniformly dispersed in the solvent at room temperature, and behaves similarly to a liquid. Accordingly, it is preferable to use a coating.

In addition, the step of discharging the composition may be performed under reduced pressure. When the step is performed under reduced pressure, an oxide film or the like is not formed on the surface of the conductive material, which is preferable. After discharging the composition, either or both steps of drying and baking are performed. Both the drying and baking steps are heat treatment. For example, drying is performed for three minutes at 100° C. and baking is performed for 15 minutes to 60 minutes at a temperature of 200° C. to 350° C., each having a different purpose, temperature, and time period. The steps of drying and baking are performed under normal pressure or under reduced pressure, by laser light irradiation, rapid thermal annealing, heating using a heating furnace, or the like. Note that the timing of the heat treatment is not particularly limited. The substrate may be heated in advance to favorably perform the steps of drying and baking, and although the temperature of the substrate at the time depends on the material of the substrate or the like, it is typically 100° C. to 800° C. (preferably, 200° C. to 350° C.). Through these steps, nanoparticles are made in contact with each other and fusion and welding are accelerated by hardening and shrinkage of a peripheral resin, while the solvent in the composition is volatilized or the dispersant is chemically removed.

A continuous wave or pulsed gas laser or solid-state laser may be used for laser light irradiation. An excimer laser, a YAG laser, or the like can be used as the former gas laser. A laser or the like using a crystal of YAG, $YVO_4$, $GdVO_4$, or the like which is doped with Cr, Nd, or the like can be used as the latter solid-state laser. Note that it is preferable to use a continuous wave laser in consideration of the absorptance of laser light. Moreover, a laser irradiation method in which pulsed and continuous wave lasers are combined may be used. However, it is preferable that the heat treatment by laser light irradiation is instantaneously performed within several microseconds to several tens of seconds so as not to damage the substrate 100, depending on heat resistance of the substrate 100. Rapid thermal annealing (RTA) is carried out by raising the temperature rapidly and heating instantaneously for several microseconds to several minutes with the use of an infrared lamp or a halogen lamp which emits ultraviolet to infrared light in an inert gas atmosphere. Since this treatment is performed instantaneously, only an outermost thin film can be substantially heated and the lower layer of the film is not affected. In other words, even a substrate having low heat resistance such as a plastic substrate is not affected.

After forming the gate electrode layer 103 and the gate electrode layer 104 by discharging a liquid composition by a droplet discharge method, the surface thereof may be planarized by pressing with pressure to improve planarity. As a pressing method, unevenness may be reduced by moving a roller-shaped object over the surface, or the surface may be perpendicularly pressed with a flat plate-shaped object. A heating step may be performed at the time of pressing. Alternatively, the unevenness of the surface may be eliminated with an air knife after softening or melting the surface with a solvent or the like. A CMP method may be alternatively used for polishing the surface. This step may be employed in planarizing a surface when unevenness is generated by a droplet discharge method.

Although a film formation method by the above droplet discharge method is explained using a conductive layer as an example, conditions for discharge, drying, baking, a solvent, or the like and detailed explanation can also be applied to the photocatalyst material and the insulating layer formed in this embodiment mode. By combining a droplet discharge method, cost can be reduced as compared to the case of entire surface coating by a spin coating method or the like.

Next, a gate insulating layer 105 is formed over the gate electrode layer 103 and the gate electrode layer 104. The gate insulating layer 105 needs to have a light transmitting property with respect to light with which irradiation is performed since light is transmitted therethrough in irradiating a photocatalyst material to be formed thereover with light. The gate insulating layer 105 may be formed of an oxide material or a nitride material of silicon, or the like, which may be a single layer or a laminated layer. In this embodiment mode, a laminated layer of three layers, a silicon nitride film, a silicon oxide film, and a silicon nitride film, is used. Alternatively, a single layer of those films or a silicon oxynitride film or a laminated layer of two layers may be used. Preferably, a silicon nitride film with dense film quality is used. In the case of using silver, copper or the like for a conductive layer to be formed by a droplet discharge method, diffusion of an impurity is prevented and a surface of the conductive layer is planarized when a silicon nitride film or a NiB film is formed thereover as a barrier film. In order to form a dense insulating film with less gate leakage current at a low temperature, a reactive gas containing a rare gas element such as argon may be mixed into the insulating film to be formed.

After forming the substrate, the insulating layer, a semiconductor layer, the gate insulating layer, an interlayer insulating layer, and another insulating layer, conductive layer, and the like included in a display device or a semiconductor device, the surfaces of the substrate, the insulating layer, the semiconductor layer, the gate insulating layer, the interlayer insulating layer may be oxidized or nitrided by plasma treatment. When the semiconductor layer and the insulating layer are oxidized or nitrided by plasma treatment, the surface of the semiconductor layer and the insulating layer is modified and a denser insulating layer than an insulating layer formed by a CVD method or a sputtering method can be obtained. Accordingly, defects such as a pinhole can be suppressed, and characteristics or the like of a semiconductor device can be improved. Such plasma treatment as described above can be performed on a conductive layer such as a gate electrode layer, a source wire layer, or a drain wire layer, and the surface can be nitrided or oxidized by performing nitridation or oxidization (or both nitridation and oxidization).

In addition, the plasma treatment is performed in the above gas atmosphere with an electron density of $1 \times 10^{11}$ cm$^{-3}$ or more and a plasma electron temperature of 1.5 eV or less. More specifically, the plasma treatment is performed with an electron density of $1 \times 10^{11}$ cm$^{-3}$ to $1 \times 10^{13}$ cm$^{-3}$ and a plasma electron temperature of 0.5 eV to 1.5 eV. Since plasma electron density is high and electron temperature is low in the vicinity of an object to be treated, which is formed over the substrate, damage by plasma to the object to be treated can be prevented. Further, since plasma electron density is high, $1 \times 10^{11}$ cm$^{-3}$ or more, an oxide film or a nitride film formed by oxidizing or nitriding the object to be irradiated is superior in uniformity of thickness or the like to a film formed by a CVD method, a sputtering method, or the like, and a dense film can be formed. In addition, since plasma electron temperature is low, 1.5 eV or less, oxidizing or nitriding treatment can be performed at lower temperature than in conventional plasma treatment or thermal oxidation method. For example, oxidizing or nitriding treatment can be performed sufficiently even in the case of performing the plasma treatment at a temperature lower by 100° C. or more than a strain point of the glass substrate. Note that as a frequency to form plasma, a high frequency wave such as a microwave (2.45 GHz) can be used.

Note that plasma treatment is assumed to be performed under the above conditions unless otherwise specified hereinafter.

In this embodiment mode, a source electrode layer and a drain electrode layer are manufactured by a plating method using the present invention. A plating method used in this embodiment mode is an electroless plating method. A photocatalyst material is formed over the gate insulating layer 105 overlapping the gate electrode layer 103 or the gate electrode layer 104 as a material adsorbing (depositing) a plating catalyst material for the source electrode layer and the drain electrode layer.

In addition, the shape of the photocatalyst material may be processed using a resist mask, an evaporation mask, or the like, or may be combined with the droplet discharge (eject) method, a printing method (such as screen (mimeograph) printing, offset (planography) printing, relief printing, or gravure (intaglio) printing), a dispenser method, or the like. By selectively forming the photocatalyst material by a droplet discharge method as described in this embodiment mode, a manufacturing process is more simplified.

In this embodiment mode, a photocatalyst material 101a and a photocatalyst material 101b are selectively formed by a droplet discharge method. A liquid composition containing a photocatalyst material is discharged by a droplet discharge apparatus 102a and a droplet discharge apparatus 102b to form the photocatalyst material 101a and the photocatalyst material 101b (see FIGS. 3A to 3C). The photocatalyst material 101a and the photocatalyst material 101b are solidified by drying and/or baking. In this embodiment mode, titanium oxide is used as the photocatalyst material. A liquid composition in which nanoparticles of titanium oxide are dispersed in a solvent is selectively discharged by a droplet discharge method and solidified in a film shape by drying or heat treatment. In this specification, a film formed by a droplet discharge method, which is described as a film, may be extremely thin depending on its formation conditions, and the film does not necessarily maintain the form of a film; for example, it may have a discontinuous island structure or the like.

The photocatalyst material can reduce and deposit a plating catalyst material contained in a solution by a photocatalytic function. The photocatalyst material is preferably titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. The photocatalyst material is irradiated with light of an ultraviolet light region (wavelength: 400 nm or less, preferably, 380 nm or less), so that photocatalyst activity can be caused.

Figure 4A:
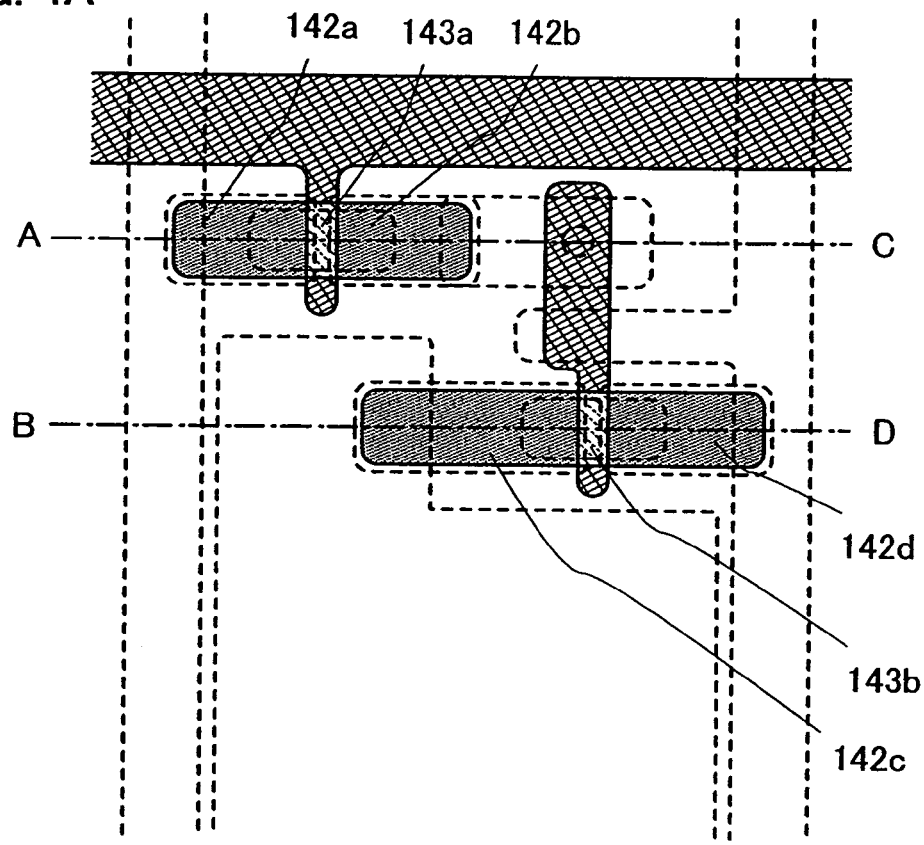
FIGS. 4A to 4C are diagrams explaining a method for manufacturing a display device of the present invention.
Figure 4B:
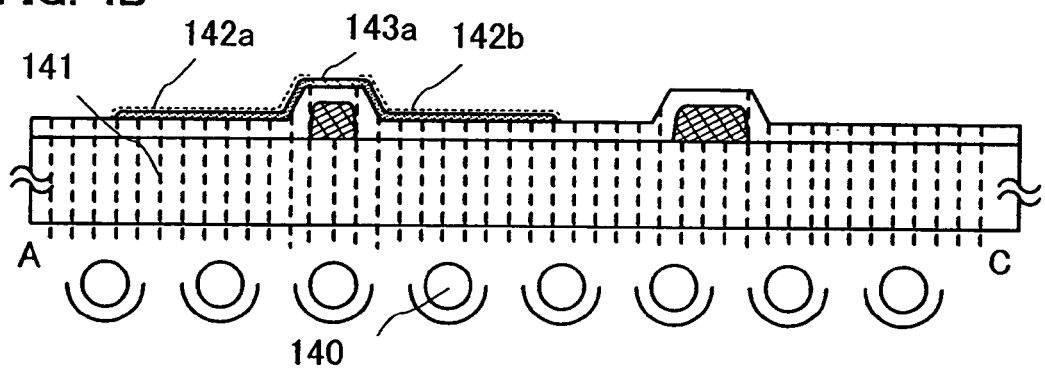
Figure 4C:
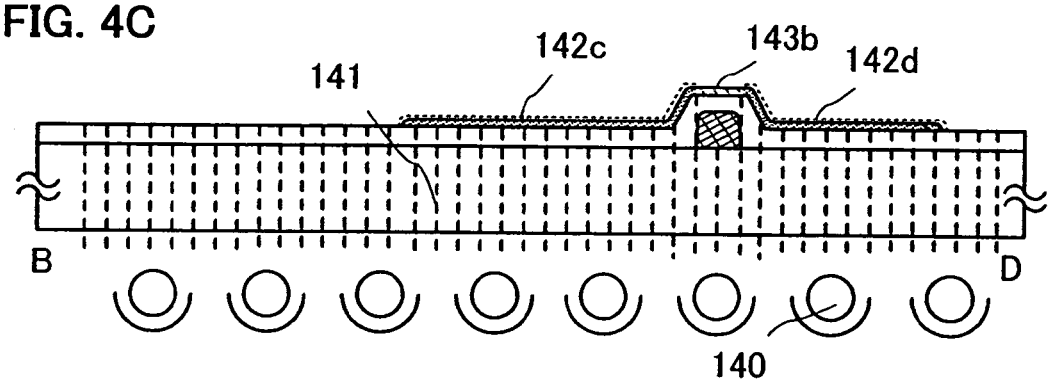

In order to deposit a plating catalyst material on the photocatalyst material 101a and the photocatalyst material 101b, the photocatalyst material 101a and the photocatalyst material 101b are immersed in a solution containing a plating catalyst material, and a plating catalyst material 142a and a plating catalyst material 142b, and a plating catalyst material 142c and a plating catalyst material 142d, are deposited on the surface of the photocatalyst material 101a and the photocatalyst material 101b, respectively (see FIGS. 4A to 4C). In this case, the photocatalyst material 101a and the photocatalyst material 101b are irradiated with light 141 which is transmitted through the substrate 100 from a light source 140 on the substrate 100 side. The light 141 is transmitted through the substrate 100 and the gate insulating layer 105, whereas it is blocked without being transmitted through the gate electrode layer 103 and the gate electrode layer 104 which have a non-light transmitting property. Therefore, a region of the photocatalyst material 101a and the photocatalyst material 101b superposed over the gate electrode layer 103 or the gate electrode layer 104 is a light-unexposed region, and only in a light-exposed region, the photocatalyst material is activated by light, and the plating catalyst material in the solution containing a plating catalyst material is reduced by its photocatalytic function. Accordingly, the plating catalyst material 142a and the plating catalyst material 142b are selectively deposited on the surface of the photocatalyst material 101a, and the plating catalyst material 142c and the plating catalyst material 142d are selectively deposited on the surface of the photocatalyst material 101b. On the other hand, the plating catalyst material is not deposited on the surface of a photocatalyst material 143a and a photocatalyst material 143b which are light-unexposed regions. The light 141 is set to light having such a wavelength as to generate a photocatalytic function of the photocatalyst material 101a and the photocatalyst material 101b, and light irradiation time and immersion treatment time are appropriately adjusted depending on light energy. In this embodiment mode, titanium oxide is used as the photocatalyst material 101a and the photocatalyst material 101b; therefore, irradiation is performed using ultraviolet light as the light 141.

Light to be used is not especially limited, and one of infrared light, visible light, and ultraviolet light or a combination thereof can be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In that case, a lamp light source may be lighted for a necessary period or multiple times for irradiation.

Alternatively, laser light may be used as light used for modification treatment, and a laser oscillator which can oscillate ultraviolet light, visible light, or infrared light can be used as a laser oscillator. As the laser oscillator, an excimer laser oscillator of KrF, ArF, XeCl, Xe, or the like, a gas laser oscillator of He, He—Cd, Ar, He—Ne, HF, or the like, a solid-state laser oscillator using crystal such as YAG, GdVO$_4$, YVO$_4$, YLF, or YAlO$_3$ which is doped with Cr, Nd, Er, Ho, Ce, Co, Ti, or Tm, a semiconductor laser oscillator of GaN, GaAs, GaAlAs, InGaAsP, or the like can be used. Note that first to fifth harmonics of a fundamental wave are preferably used in the solid-state laser oscillator.

A shutter, a reflector such as a mirror or a half mirror, an optical system including a cylindrical lens, a convex lens, or the like may be provided to adjust the shape or path of light of a lamp light source and laser light emitted from the laser oscillator. In addition, one or more lamp light sources or laser oscillators may be provided, and arrangement of an optical system including a light source and a substrate to be irradiated may be appropriately selected in accordance with an object to be irradiated (material, thickness, or the like of the object).

Note that in FIGS. 4A to 4C, light emitted from a plurality of light sources is set to be almost perpendicular to the surface of the substrate 100.

Note that light irradiation may be selectively performed by moving a substrate, or light irradiation may be performed by moving light in the X- and Y-axis directions. In that case, a polygon mirror or a galvanometer mirror is preferably used for the optical system.

In addition, a combination of light from a lamp light source and laser light can be used as the light. A relatively large region where light exposure treatment is performed may be irradiated using a lamp, and only a region where highly precise light exposure treatment is performed may be irradiated with laser light. By performing light irradiation treatment in such a manner, throughput can be improved and a highly precisely processed wiring board, display device, or the like can be obtained.

In the case where the photocatalyst material is activated by light irradiation as described above and a photocatalytic function of the photocatalyst material is utilized, the pH of the solution containing a plating catalyst material is not necessarily adjusted. Sodium hydroxide (NaOH), potassium hydroxide (KOH), or the like does not need to be added for pH control. Therefore, the use of a photocatalytic function has an advantage in that a material which may have an adverse effect such as potassium hydroxide (KOH) does not need to be used depending on materials of the semiconductor layer.

There is no limitation on the immersion method as long as the solution containing a plating catalyst material is in contact with the photocatalyst material 101a and the photocatalyst material 101b. Therefore, the substrate 100 may be placed obliquely (or vertically), and the solution containing a plating catalyst material may be applied so as to flow on the surface of the photocatalyst material 101a and the photocatalyst material 101b over the substrate 100. If plating is performed with a substrate placed obliquely (or vertically) and a solution applied, there is the advantage of miniaturizing an apparatus used for a step even in the case of using a large-area substrate.

Figure 5A:
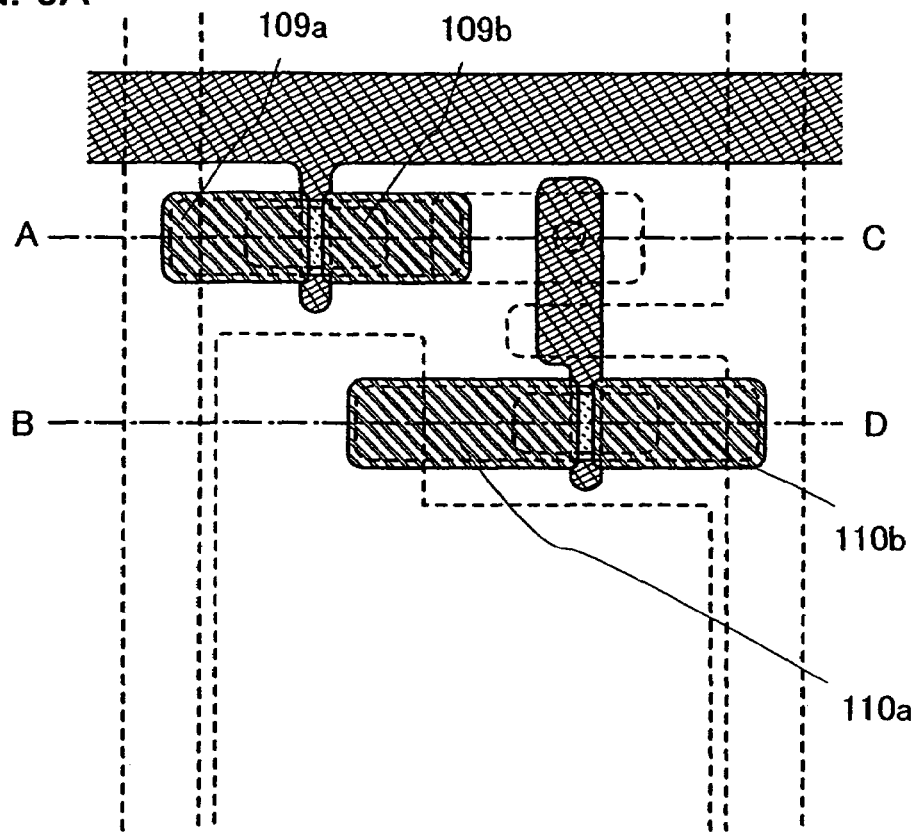
FIGS. 5A to 5C are diagrams explaining a method for manufacturing a display device of the present invention.
Figure 5B:
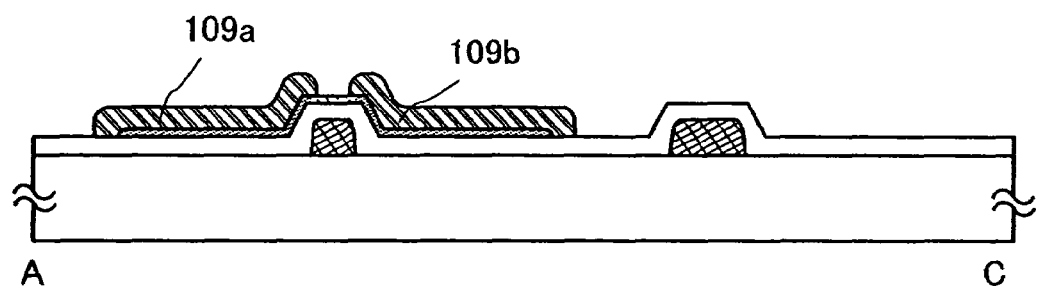
Figure 5C:
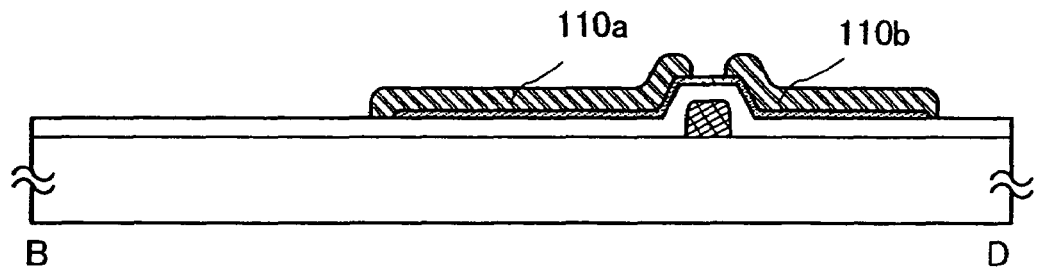

The photocatalyst material 101a and the photocatalyst material 101b adsorbing the plating catalyst material 142a, the plating catalyst material 142b, the plating catalyst material 142c, and the plating catalyst material 142d onto its surface are immersed in a plating solution containing a plating metal material, and a metal film is grown over the plating catalyst material 142a, the plating catalyst material 142b, the plating catalyst material 142c, and the plating catalyst material 142d, and immersion time is controlled to reach a desired film thickness, thereby forming a source electrode layer or drain electrode layer 109a, a source electrode layer or drain electrode layer 109b, a source electrode layer or drain electrode layer 110a, and a source electrode layer or drain electrode layer 110b in a self-aligned manner (see FIGS. 5A to 5C). Since the source electrode layer or drain electrode layer 109a, the source electrode layer or drain electrode layer 109b, the source electrode layer or drain electrode layer 110a, and the source electrode layer or drain electrode layer 110b can be formed in a self-aligned manner so as to hardly overlap the gate electrode layer 103 and the gate electrode layer 104, controllability thereof is high.

The plating catalyst material is appropriately selected depending on the plating metal material. As the plating catalyst material, palladium (Pd), rhodium (Rh), ruthenium (Ru), osmium (Os), iridium (Ir), gold (Au), platinum (Pt), silver (Ag), or the like may be used. The plating catalyst material is dissolved into a solution, and is treated as a solution containing the plating catalyst material.

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

Other detailed plating conditions can be similar to those in Embodiment Mode 1.

In this embodiment mode, as the plating solution containing a metal material, a mixture of nickel sulfate hexahydrate (NiSO$_4$) which is a metal salt, a hypophosphorous acid (H$_3$PO$_2$) which is a reducing agent, and a lactic acid and a malic acid which are complexing agents is used. A metal film to be deposited is a nickel phosphorus alloy (NiP) film.

The plating catalyst material 142a, the plating catalyst material 142b, the plating catalyst material 142c, and the plating catalyst material 142d are deposited to cover the surface of the photocatalyst material 101a and the photocatalyst material 101b. Since a metal film formed by plating is formed in multiple directions and three dimensions as well as in a film thickness direction, the source electrode layer or drain electrode layer 109a, the source electrode layer or drain electrode layer 109b, the source electrode layer or drain electrode layer 110a, and the source electrode layer or drain electrode layer 110b are formed to cover upper surfaces and side surfaces of the photocatalyst material 101a and the photocatalyst material 101b as shown in FIGS. 5A to 5C.

With the use of the source electrode layer or drain electrode layer 109a, the source electrode layer or drain electrode layer 109b, the source electrode layer or drain electrode layer 110a, and the source electrode layer or drain electrode layer 110b as masks, exposed unnecessary portions of the photocatalyst material 101a and the photocatalyst material 101b are etched to form a photocatalyst material 115a, a photocatalyst material 115b, a photocatalyst material 116a, and a photocatalyst material 116b. It is needless to say that a new mask may be formed over the source electrode layer or drain electrode layer 109a, the source electrode layer or drain electrode layer 109b, the source electrode layer or drain electrode layer 110a, and the source electrode layer or drain electrode layer 110b, and then the exposed unnecessary portion of the photocatalyst material 101a and the photocatalyst material 101b may be etched.

A mask is formed of a resist or an insulating material such as polyimide by a droplet discharge method. A through hole 125 is formed in a part of the gate insulating layer 105 by etching processing using the mask to partially expose the gate electrode layer 104 formed below the gate insulating layer 105. The etching processing may be performed by either plasma etching (dry etching) or wet etching; however, plasma etching is suitable for treating a large-sized substrate. As an etching gas, a fluorine-based gas such as $CF_4$ or $NF_3$ or a chlorine-based gas such as $Cl_2$ or $BCl_3$ is used, to which an inert gas such as He or Ar may be appropriately added. Alternatively, electric discharge machining may be performed locally when the etching process is performed using atmospheric pressure discharge, in which case a mask layer is not required to be formed over the entire surface of the substrate.

A mask used for etching to form the through hole 125 can also be formed by selectively discharging a composition. When the mask is selectively formed in such a way, it becomes possible to simplify the opening forming process. A resin material such as an epoxy resin, a phenol resin, a novolac resin, an acrylic resin, a melamine resin, or a urethane resin is used for the mask. Alternatively, the mask is formed by a droplet discharge method using an organic material such as benzocyclobutene, parylene, fluorinated arylene ether, or permeable polyimide; a compound material made by polymerization of a siloxane-based polymer or the like; a composition material containing a water-soluble homopolymer and a water-soluble copolymer; or the like. Alternatively, a commercial resist material containing a photosensitizer may be used. For example, a typical positive type resist such as a novolac resin or a naphthoquinone diazide compound that is a photosensitizer, or a negative type resist such as a base resin, diphenylsilanediol, an acid generator, or the like may be used. In using whichever material, the surface tension and the viscosity are appropriately controlled by adjusting the concentration of a solvent or adding a surfactant or the like.

Figure 6A:
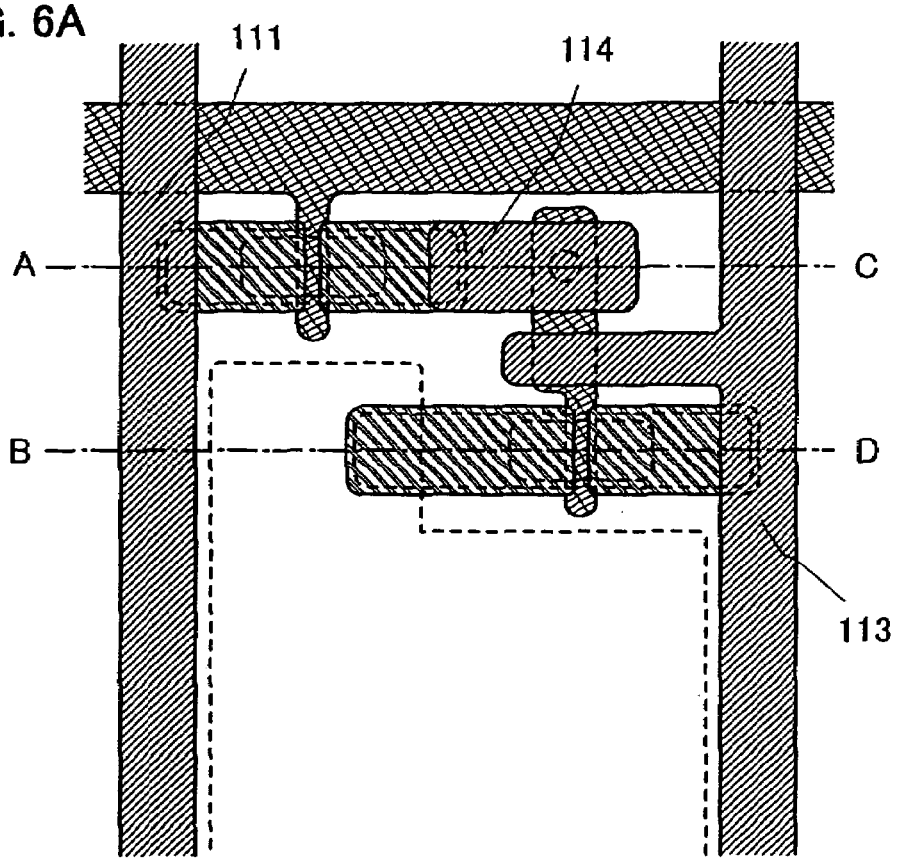
FIGS. 6A to 6C are diagrams explaining a method for manufacturing a display device of the present invention.
Figure 6B:
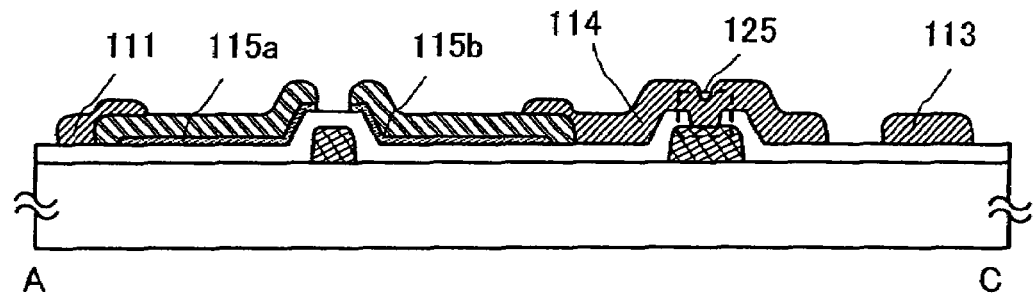
Figure 6C:
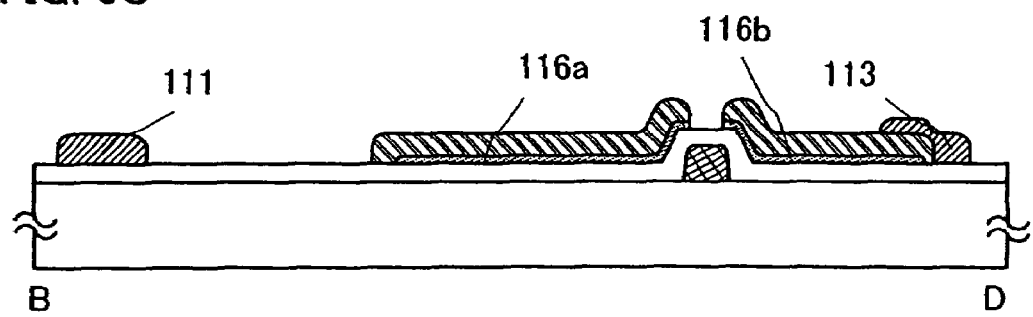

A liquid composition containing a conductive material is discharged by a droplet discharge apparatus over the gate insulating layer 105 to form a wire layer 111, a wire layer 113, and a wire layer 114 (see FIGS. 6A to 6C). The wire layer 111 functions also as a source wire layer or drain wire layer and is formed to be in contact with and electrically connected to the source electrode layer or drain electrode layer 109a. The wire layer 114 is formed in contact with the source electrode layer or drain electrode layer 109b and the gate electrode layer 104 and electrically connected thereto in the through hole 125 formed in the gate insulating layer 105. The wire layer 113 functions also as a power supply line and is formed to be in contact with and electrically connected to the source electrode layer or drain electrode layer 110b (see FIGS. 6A to 6C). A capacitor is also formed in a laminated region of the wire layer 113, the gate insulating layer 105, and the gate electrode layer 104.

As the conductive material for forming the wire layer 111, the wire layer 113, and the wire layer 114 by a droplet discharge method as described in this embodiment mode, a composition containing a metal particle of Ag (silver), Au (gold), Cu (copper), W (tungsten), Al (aluminum), or the like as a main component can be used. Further, indium tin oxide (ITO), indium tin silicon oxide (ITSO) containing indium tin oxide and silicon oxide, organic indium, organic tin, zinc oxide, titanium nitride, or the like which has a light transmitting property may be combined.

Alternatively, the wire layer 111, the wire layer 113, and the wire layer 114 can be formed by etching a conductive film formed by a PVD method, a CVD method, an evaporation method, or the like into a desired shape. In addition, a wire layer can be formed selectively at a predetermined place by a printing method, an electrolytic plating method, or the like. Furthermore, a reflow method or a damascene method may be used. The wire layer may be formed using an element such as Ag, Au, Cu, Ni, Pt, Pd, Ir, Rh, W, Al, Ta, Mo, Cd, Zn, Fe, Ti, Si, Ge, Zr, or Ba, an alloy thereof, or nitride thereof.

Next, a semiconductor layer is formed. A semiconductor layer having one conductivity type may be formed if necessary. An NMOS structure including an n-channel TFT provided with an n-type semiconductor layer, a PMOS structure including a p-channel TFT provided with a p-type semiconductor layer, and a CMOS structure including an n-channel TFT and a p-channel TFT can be manufactured. An n-channel TFT or a p-channel TFT can also be formed by forming an impurity region in a semiconductor layer by adding an element which imparts conductivity by doping to impart conductivity. The conductivity may be imparted to a semiconductor layer by performing plasma treatment using a $PH_3$ gas instead of forming the n-type semiconductor layer.

An amorphous semiconductor (hereinafter also referred to as an "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer. The semiconductor layer can be formed by a sputtering method, an LPCVD method, a plasma CVD method, or the like.

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. The SAS is formed by glow discharge decomposition (plasma CVD) of a gas containing silicon.

SiH$_4$ is used as the gas containing silicon. Alternatively, Si$_2$H$_6$, SiH$_2$Cl$_2$, SiHCl$_3$, SiCl$_4$, SiF$_4$, or the like can be used as the gas containing silicon. Further, F$_2$ or GeF$_4$ may be mixed. This gas containing silicon may be diluted with H$_2$, or H$_2$ and one or more rare gas elements of He, Ar, Kr, and Ne. Additionally, as the semiconductor layer, an SAS layer formed using a hydrogen-based gas may be formed over a SAS layer formed using a fluorine-based gas.

The amorphous semiconductor is typified by hydrogenated amorphous silicon, and the crystalline semiconductor is typified by polysilicon or the like. Polysilicon (polycrystalline silicon) includes so-called high-temperature polysilicon which contains polysilicon that is formed at a process temperature of 800° C. or more as the main component, so-called low-temperature polysilicon which contains polysilicon that is formed at a process temperature of 600° C. or less as the main component, and polysilicon which is crystallized by adding an element for promoting crystallization or the like. Naturally, as described above, a semiamorphous semiconductor, or a semiconductor which includes a crystalline phase in a portion of a semiconductor layer can be used.

In addition, a compound semiconductor such as GaAs, InP, SiC, ZnSe, GaN, or SiGe as well as an element such as silicon (Si) or germanium (Ge) can be used as the material for the semiconductor. Further, zinc oxide (ZnO), tin oxide (SnO$_2$), or the like which is an oxide semiconductor can be used. In the case of using ZnO for the semiconductor layer, Y$_2$O$_3$, Al$_2$O$_3$, TiO$_2$, a laminated layer thereof, or the like may be used for the gate insulating layer, and ITO, Au, Ti, or the like may be used for the gate electrode layer, the source electrode layer, and the drain electrode layer. In addition, In, Ga, or the like can be added to ZnO.

In the case where a crystalline semiconductor layer is used as the semiconductor layer, a laser crystallization method, a thermal crystallization method, a thermal crystallization method using an element promoting crystallization such as nickel, or the like may be employed as a method for manufacturing the crystalline semiconductor layer. A microcrystalline semiconductor, which is a SAS, can be crystallized by laser light irradiation to improve the crystallinity. In the case where the element promoting crystallization is not introduced, hydrogen is released until a concentration of hydrogen contained in an amorphous silicon film becomes 1×10$^{20}$ atoms/cm$^3$ or less by heating the amorphous silicon film at a temperature of 500° C. for one hour in a nitrogen atmosphere before irradiating the amorphous silicon film with laser light. This is because the amorphous silicon film containing much hydrogen is damaged when the film is irradiated with laser light.

Any method can be used for introducing a metal element into the amorphous semiconductor layer as long as the method is capable of making the metal element exist on the surface of or inside the amorphous semiconductor layer. For example, a sputtering method, a CVD method, a plasma treatment method (including a plasma CVD method), an adsorption method, or a method for applying a metal salt solution can be employed. Among them, the method using a solution is simple, easy, and advantageous in terms of easy concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

The crystallization may be performed by adding an element which promotes crystallization (also referred to as a catalyst element or a metal element) to the amorphous semiconductor layer and performing heat treatment (at 550° C. to 750° C. for 3 minutes to 24 hours) in a crystallization step in which an amorphous semiconductor layer is crystallized to form a crystalline semiconductor layer. As the element which promotes crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove the element which promotes crystallization from the crystalline semiconductor layer or reduce the element, a semiconductor layer containing an impurity element is formed in contact with the crystalline semiconductor layer and used as a gettering sink. The impurity element may be an impurity element imparting n-type conductivity, an impurity element imparting p-type conductivity, or a noble gas element. For example, one or more elements of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a noble gas element is formed over the crystalline semiconductor layer containing the element which promotes crystallization, and heat treatment (at 550° C. to 750° C. for 3 minutes to 24 hours) is performed. The element which promotes crystallization in the crystalline semiconductor layer moves into the semiconductor layer containing a noble gas element, and the element which promotes crystallization in the crystalline semiconductor layer is removed or reduced. Thereafter, the semiconductor layer containing a noble gas element, which serves as a gettering sink, is removed.

Heat treatment and laser light irradiation may be combined to crystallize the amorphous semiconductor layer. Alternatively, one of the heat treatment and the laser light irradiation may be performed plural times.

In addition, the crystalline semiconductor layer may be directly formed over the substrate by a plasma method. Alternatively, a crystalline semiconductor layer may be selectively formed over the substrate by using a plasma method.

The semiconductor layer can be formed using an organic semiconductor material by a printing method, a spray method, a spin coating method, a droplet discharge method, or the like. In this case, since the above etching step is not required, the number of steps can be reduced. A low molecular material, a high molecular material, or the like is used as the organic semiconductor material, and in addition, a material such as an organic pigment or a conductive high molecular material can be used. A π-electron conjugated high molecular material having a skeleton including conjugated double bonds is preferably used as the organic semiconductor material used in the present invention. Typically, a soluble high molecular material such as polythiophene, polyfluoren, poly(3-alkylthiophene), a polythiophene derivative, or pentacene can be used.

There is a material, which can form the semiconductor layer by being treated after the deposition of a soluble precursor, as the organic semiconductor material applicable to the present invention. Note that polythienylenevinylene, poly (2,5-thienylenevinylene), polyacetyrene, a polyacetyrene derivative, polyallylenevinylene, or the like can be used as such an organic semiconductor material.

In converting the precursor into an organic semiconductor, a reaction catalyst such as a hydrogen chloride gas is added in addition to heat treatment. The following can be employed as a typical solvent which dissolves the soluble organic semiconductor material: toluene, xylene, chlorobenzene, dichlorobenzene, anisole, chloroform, dichloromethane, γ butyl lactone, butyl cellosolve, cyclohexane, NMP (N-methyl-2- pyrrolidone), cyclohexanone, 2-butanone, dioxane, dimethylformamide (DMF), THF (tetrahydrofuran), or the like.

A semiconductor layer 107 and a semiconductor layer 108 are formed over the source electrode layer or drain electrode layer 109a and the source electrode layer or drain electrode layer 109b, and the source electrode layer or drain electrode layer 110a and the source electrode layer or drain electrode layer 110b, respectively. In this embodiment mode, the semiconductor layer 107 and the semiconductor layer 108 are formed using pentacene. Through the above steps, a coplanar thin film transistor 130 and a coplanar thin film transistor 131 in this embodiment mode can be manufactured (see FIGS. 7A to 7C).

Subsequently, a composition containing a conductive material is selectively discharged over the gate insulating layer 105 to form a first electrode layer 117 (see FIGS. 7A to 7C). When light is emitted from the substrate 100 side, the first electrode layer 117 may be formed by forming a predetermined pattern using a composition containing indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like, and by baking the pattern. In this embodiment mode, a composition containing ITO is discharged and baked to form the first electrode layer 117.

Examples of composition ratios of the conductive materials having a light transmitting property are described. As for a composition ratio of indium oxide containing tungsten oxide, tungsten oxide may be 1.0 wt % and indium oxide may be 99.0 wt %. As for a composition ratio of indium zinc oxide containing tungsten oxide, tungsten oxide may be 1.0 wt %, zinc oxide may be 0.5 wt %, and indium oxide may be 98.5 wt %. As for indium oxide containing titanium oxide, titanium oxide may be 1.0 wt % to 5.0 wt %, and indium oxide may be 95.0 wt % to 99.0 wt %. As for a composition ratio of indium tin oxide (ITO), tin oxide may be 10.0 wt %, and indium oxide may be 90.0 wt %. As for a composition ratio of indium zinc oxide (IZO), zinc oxide may be 10.7 wt %, and indium oxide may be 89.3 wt %. As for a composition ratio of indium tin oxide containing titanium oxide, titanium oxide may be 5.0 wt %, tin oxide may be 10.0 wt %, indium oxide may be 85.0 wt %. The above composition ratios are examples, and the composition ratios may be appropriately set.

Even in the case of using a material such as a metal film which does not have a light transmitting property, light can be transmitted through the first electrode layer 117 by forming the first electrode layer 117 very thin (preferably, a thickness of approximately 5 nm to 30 nm) so as to transmit light. As a metal thin film which can be used for the first electrode layer 117, a conductive film formed of titanium, tungsten, nickel, gold, platinum, silver, aluminum, magnesium, calcium, lithium, zinc, or an alloy thereof, or a film formed of a compound material containing the element as its main component, such as TiN, $TiS_xN_y$, $WSi_x$, $WN_x$, $WSi_xN_y$, or NbN can be used.

It is acceptable as long as the first electrode layer 117 is electrically connected to the source electrode layer or drain electrode layer 110a; therefore, the connection structure is not limited to this embodiment mode. A structure where an insulating layer serving as an interlayer insulating layer is formed over the source electrode layer or drain electrode layer 110a and is electrically connected to the first electrode layer 117 by a wire layer may be employed. In this case, an opening (contact hole) can be formed by not removing the insulating layer but forming a liquid repellent material with respect to the insulating layer over the source electrode layer or drain electrode layer 110a. When a composition containing an insulating material is applied thereafter by a coating method or the like, the insulating layer is formed in a region except for a region where the liquid repellent material is formed.

After forming the insulating layer by solidification by heating, drying, and/or the like, the liquid repellent material is removed to form an opening. A wire layer is formed so as to fill this opening, and the first electrode layer 117 is formed to be in contact with this wire layer. This method has an effect of simplifying a process since it does not require formation of the opening by etching.

In the case of having a structure in which generated light is emitted to a side opposite to the substrate 100 side (the case of manufacturing a top emission type display panel), a composition which contains metal particles of Ag (silver), Au (gold), Cu (copper), W (tungsten), Al (aluminum), or the like as a main component can be used. Alternatively, the first electrode layer 117 may be formed by forming a transparent conductive film or a light-reflective conductive film by a sputtering method, forming a mask pattern by a droplet discharge method, and then combining etching processing.

The first electrode layer 117 may be polished by a CMP method or by cleaning with a polyvinyl alcohol-based porous body so that a surface of the first electrode layer 117 is planarized. In addition, after polishing by a CMP method, ultraviolet irradiation, oxygen plasma treatment, or the like may be performed on the surface of the first electrode layer 117.

Through the above steps, a TFT substrate for a display panel, in which a coplanar thin film transistor is connected to the first electrode layer 117 over the substrate 100, is completed.

Next, an insulating layer 121 (also referred to as a partition wall) is selectively formed. The insulating layer 121 is formed to have an opening portion over the first electrode layer 117. In this embodiment mode, the insulating layer 121 is formed over the entire surface, and etched and processed using a mask of a resist or the like. When the insulating layer 121 is formed by a droplet discharge method, a printing method, or the like, by which the insulating layer 121 can be formed directly and selectively, processing by etching is not necessarily required. The insulating layer 121 can also be formed to have a desired shape by pretreatment of the present invention.

The insulating layer 121 can be formed of silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular material such as polyimide, aromatic polyamide, or polybenzimidazole; or a siloxane resin material. The insulating layer 121 may also be formed by using a photosensitive or non-photosensitive material such as acrylic or polyimide. The insulating layer 121 preferably has a shape in which a curvature radius changes continuously. Accordingly, coverage of an electroluminescent layer 122 and a second electrode layer 123 to be formed over the insulating layer 121 is improved.

After forming the insulating layer 121 by discharging a composition by a droplet discharge method, a surface of the insulating layer 121 may be planarized by pressing with pressure to improve its planarity. As a pressing method, unevenness may be smoothed by moving a roller-shaped object over the surface, or the surface may be perpendicularly pressed with a flat plate-shaped object. Alternatively, an uneven portion on the surface may be eliminated with an air knife after softening or melting the surface with a solvent or the like. A CMP method may also be used for polishing the surface. This step can be employed in planarizing a surface when unevenness is generated by a droplet discharge method. When the planarity is improved through this step, display unevenness or the like of the display panel can be prevented; therefore, a high-definition image can be displayed.

A light emitting element is formed over the substrate 100 that is a TFT substrate for a display panel (see FIGS. 8A and 8B).

Before forming the electroluminescent layer 122, heat treatment is performed at 200° C. under atmospheric pressure to remove moisture in the first electrode layer 117 and the insulating layer 121 or adsorbing onto the surface thereof. It is preferable to perform heat treatment at 200° C. to 400° C., preferably, 250° C. to 350° C. under reduced pressure and to form the electroluminescent layer 122 by a vacuum evaporation method or a droplet discharge method under reduced pressure without exposing to air.

As the electroluminescent layer 122, materials exhibiting light emission of red (R), green (G), and blue (B) are selectively formed by an evaporation method using respective evaporation masks, or the like. The materials exhibiting light emission of red (R), green (G), and blue (B) (low molecular materials, high molecular materials, or the like) can be formed by a droplet discharge method as in the case of a color filter. The droplet discharge method is preferable since the materials exhibiting R, G, and B light can be separately applied without using masks. The second electrode layer 123 is laminated over the electroluminescent layer 122, thereby completing a display device having a display function using a light emitting element.

Although not shown, it is effective to provide a passivation film so as to cover the second electrode layer 123. The passivation film which is provided at the time of forming a display device may have a single layer structure or a multi-layer structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) which contains more nitrogen than oxygen, aluminum oxide, diamond-like carbon (DLC), or a nitrogen-containing carbon film (CN$_x$), or a laminated layer of the insulating films can be used. For example, a laminated layer of a nitrogen-containing carbon film (CN$_x$) and silicon nitride (SiN) can be used. Alternatively, an organic material can be used, for example, a laminated layer of a high molecular material such as a styrene polymer. In addition, a siloxane material (inorganic siloxane, organic siloxane) may be used.

At this time, it is preferable to use a film having good coverage as the passivation film. A carbon film, especially, a DLC film is effective. The DLC film can be formed at a temperature ranging from room temperature to 100° C.; therefore, the DLC film can be easily formed over an electroluminescent layer having low heat resistance. The DLC film can be formed by a plasma CVD method (typically, an RF plasma CVD method, a microwave CVD method, an electron cyclotron resonance (ECR) CVD method, a heat filament CVD method, or the like), a combustion flame method, a sputtering method, an ion beam evaporation method, a laser evaporation method, or the like. A hydrogen gas and a hydrocarbon-based gas (for example, CH$_4$, C$_2$H$_2$, C$_6$H$_6$, or the like) are used as a reaction gas which is used for forming the passivation film. The reaction gas is ionized by glow discharge, and the ions are accelerated to collide with a cathode with negative self bias applied; accordingly, the passivation film is formed. A CN film may be formed using a C$_2$H$_4$ gas and an N$_2$ gas as the reaction gas. The DLC film has a high blocking effect on oxygen and can suppress oxidation of the electroluminescent layer. Accordingly, the electroluminescent layer can be prevented from oxidizing during the subsequent sealing step.

As shown in FIG. 9B, a sealant 136 is formed and sealing is performed using a sealing substrate 145. Thereafter, a gate wire layer formed to electrically connect to the gate electrode layer 103 may be connected to a flexible wiring board for external electrical connection. This applies to a source wire layer formed to be electrically connected to the wire layer 111.

A space between the substrate 100 having the element and the sealing substrate 145 is filled with a filler 135 and sealed. The space can be filled with the filler by a dropping method as is the case with a liquid crystal material described in Embodiment Mode 4. Instead of the filler 135, the space may be filled with an inert gas such as nitrogen. In addition, by providing a drying agent within the display device, deterioration of the light emitting element due to moisture can be prevented. The position of the drying agent may be either on the sealing substrate 145 side or on the substrate 100 side over which the element is formed. Alternatively, the drying agent may be provided in a depression formed in the substrate, which is also the region provided with the sealant 136. When the drying agent is provided in an area which does not contribute to displaying such as a driver circuit region of the sealing substrate 145 or a wire region, the aperture ratio is not decreased even when the drying agent is opaque. Further, the filler 135 may be formed to contain an absorbent material to have a function as a drying agent. Accordingly, the display device having a display function using the light emitting element is completed (see FIGS. 9A and 9B).

An FPC 139 is attached to a terminal electrode layer 137 for electrically connecting the inside of the display device to the outside thereof with an anisotropic conductive film 138 so as to be electrically connected to the terminal electrode layer 137.

FIG. 9A is a top view of the display device. As shown in FIG. 9A, a pixel portion 150, scan line driver regions 151$a$ and 151$b$, and a connecting region 153 are sealed between the substrate 100 and the sealing substrate 145 with the sealant 136, and a signal line driver circuit 152 formed with a driver IC is provided over the substrate 100. The driver circuit region is provided with thin film transistors 133 and 134, and the pixel portion is provided with thin film transistors 130 and 131.

In this embodiment mode, the case where the light emitting element is sealed with a glass substrate is described. Sealing treatment is treatment for protecting the light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capability, can be used. As for the cover material, glass, ceramics, plastics, or metal can be used. However, when light is emitted to the cover material side, the cover material needs to have a light-transmitting property. The cover material is attached to the substrate over which the above-mentioned light emitting element is formed with a sealant such as a thermosetting resin or an ultraviolet curable resin, and a sealed space is formed by curing the resin with heat treatment or ultraviolet light irradiation treatment. It is also effective to provide a moisture absorbent material typified by barium oxide in the sealed space. The moisture absorbent material may be provided on the sealant or over a partition wall or a peripheral part so as not to block light emitted from the light emitting element. Further, it is also possible to fill a space between the cover material and the substrate over which the light emitting element is formed with a thermosetting resin or an ultraviolet curable resin. In this case, it is effective to add a moisture absorbent material typified by barium oxide in the thermosetting resin or the ultraviolet curable resin.

In this embodiment mode, although a single gate structure of a switching TFT is explained in detail, a multi-gate structure such as a double gate structure may also be employed. In the case where the semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which is overlapped with the gate electrode layer, and may have a high concentration impurity region outside thereof.

In this embodiment mode, the process can be simplified as described above. By forming various components (parts) and a mask layer directly over a substrate using a droplet discharge method, a display panel can be easily manufactured even in the case of using a glass substrate of the fifth generation or later having a side of 1000 mm or more.

In this embodiment mode, a photocatalyst material which adsorbs a plating catalyst element is selectively irradiated with light by backside light exposure to adsorb the plating catalyst element onto the light-exposed photocatalyst material, thereby forming a source electrode layer and a drain electrode layer in a self-aligned manner. Accordingly, a defective shape or the like due to misalignment of a mask is not generated, and a wire can be formed with high controllability. Therefore, a high-reliability semiconductor device, display device, or the like can be manufactured with high yield by using the present invention.

In addition, a plating method is used; therefore, the thickness or size of a wire layer can be controlled relatively easily, and a wire layer can be manufactured to suit application. Therefore, a high-performance and high-reliability semiconductor device which can operate at high speed can also be manufactured.

Embodiment Mode 5

An embodiment mode of the present invention is explained with reference to FIGS. 14A to 19B. More specifically, a method for manufacturing a display device including a coplanar thin film transistor, to which the present invention is applied, is explained. FIGS. 14A, 15A, 16A, 17A, and 18A are top views of a pixel portion of a display device. FIGS. 14B, 15B, 16B, 17B, and 18B are cross-sectional views taken along a line E-F in respective steps of forming FIGS. 14A, 15A, 16A, 17A, and 18A. FIG. 19A is also a top view of a display device, and FIG. 19B is a cross-sectional view taken along a line O-P (including a line U-W) in FIG. 19A. Note that an example of a liquid crystal display device using a liquid crystal material as a display element is described. Therefore, repetitive explanation of the same portion or a portion having a similar function is omitted.

In this embodiment mode, a plating method using the present invention is employed in manufacturing a source electrode layer, a drain electrode layer, a capacitor wire layer, and another wire layer. A gate electrode layer 203a and a gate electrode layer 203b are formed over a substrate 200, and a gate insulating layer 207 is formed to cover the gate electrode layer 203a and the gate electrode layer 203b.

In the present invention, in irradiating a photocatalyst material formed over the substrate 200 with light, light irradiation is performed by backside light exposure from the substrate 200 side through the substrate 200 to activate the formed photocatalyst material. Therefore, the substrate 200 needs to be formed using a material which transmits enough light (wavelength, energy, or the like of light) to activate the photocatalyst material. The gate insulating layer 207 as well as the substrate 200 needs to have a light transmitting property. On the other hand, the gate electrode layer 203a and the gate electrode layer 203b function as masks which block light at the time of backside light exposure; therefore, they need to have a non-light transmitting property with respect to light to be used.

The gate electrode layer 203a and the gate electrode layer 203b can be formed using a CVD method, a sputtering method, a droplet discharge method, or the like. The gate electrode layer 203a and the gate electrode layer 203b may be formed of an element selected from Ag, Au, Ni, Pt, Pd, Ir, Rh, Ta, W, Ti, Mo, Al, and Cu or an alloy or a compound material containing the above element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (TiN) film and a molybdenum (Mo) film or a three-layer structure in which a tungsten film having a thickness of 50 nm, an alloy film of aluminum and silicon (A—Si) having a thickness of 500 nm, and a titanium nitride film having a thickness of 30 nm are sequentially laminated may be used. Further, in the case of the three-layer structure, tungsten nitride may be used instead of the tungsten film as a first conductive film, an alloy film of aluminum and titanium (Al—Ti) may be used instead of the alloy film of aluminum and silicon (A—Si) as a second conductive film, and a titanium film may be used instead of the titanium nitride film as a third conductive film.

In the case where etching processing is required to form the gate electrode layer 203a and the gate electrode layer 203b, the processing may be performed by dry etching or wet etching after forming a mask. The electrode layers can be etched into a tapered shape by using an ICP (Inductively Coupled Plasma) etching method and appropriately adjusting the etching condition (the amount of electric power applied to a coiled electrode, the amount of electric power applied to an electrode on a substrate side, the temperature of the electrode on the substrate side, or the like). Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used as the etching gas.

The gate insulating layer 207 may be formed in a similar manner to Embodiment Mode 1 and can be formed of an oxide material or a nitride material of silicon, or the like, which may be a single layer or a laminated layer. In this embodiment mode, a laminated layer of three layers, a silicon nitride film, a silicon oxide film, and a silicon nitride film, is used.

In each formation region of the source electrode layer, the drain electrode layer, and the capacitor wire layer over the substrate 200, a photocatalyst material is formed as a material which adsorbs a plating catalyst material for the source electrode layer, the drain electrode layer, and the capacitor wire layer. In this embodiment mode, a liquid composition containing the photocatalyst material is discharged by a droplet discharge apparatus 202a and a droplet discharge apparatus 202b to form a photocatalyst material 201a and a photocatalyst material 201b (see FIGS. 14A and 14B). The photocatalyst material 201a and the photocatalyst material 201b are solidified by drying and/or baking. In this embodiment mode, titanium oxide is used as the photocatalyst material, and water is used as a solvent.

Figure 15A:
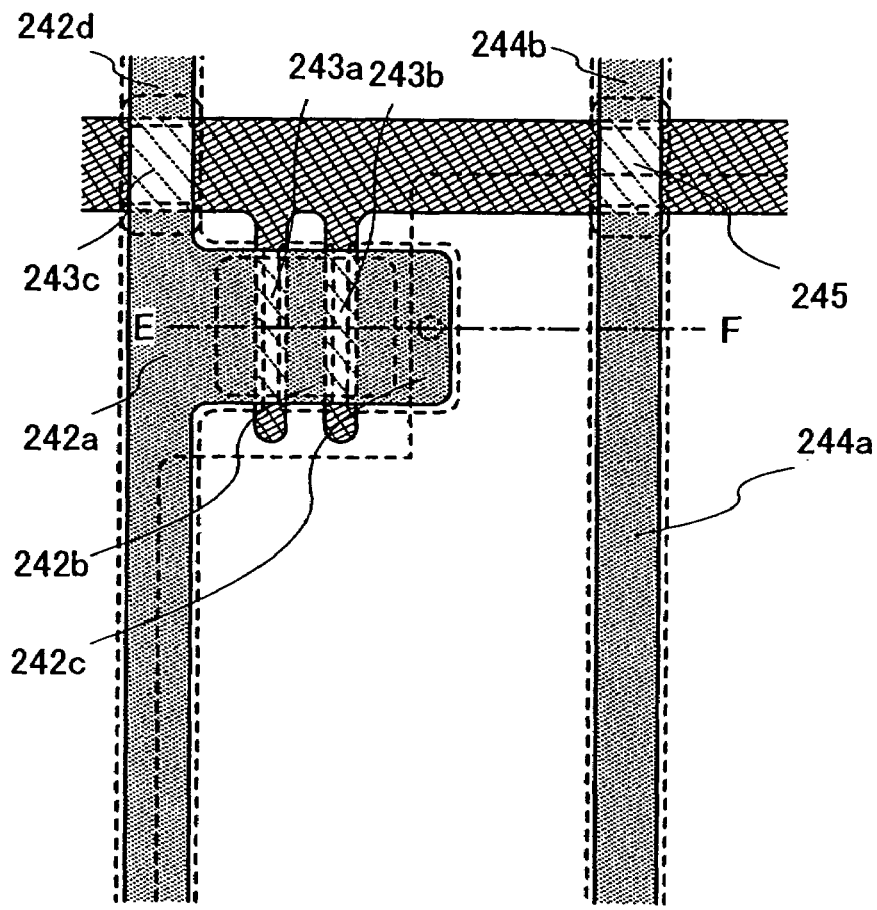
FIGS. 15A and 15B are diagrams explaining a method for manufacturing a display device of the present invention.
Figure 15B:
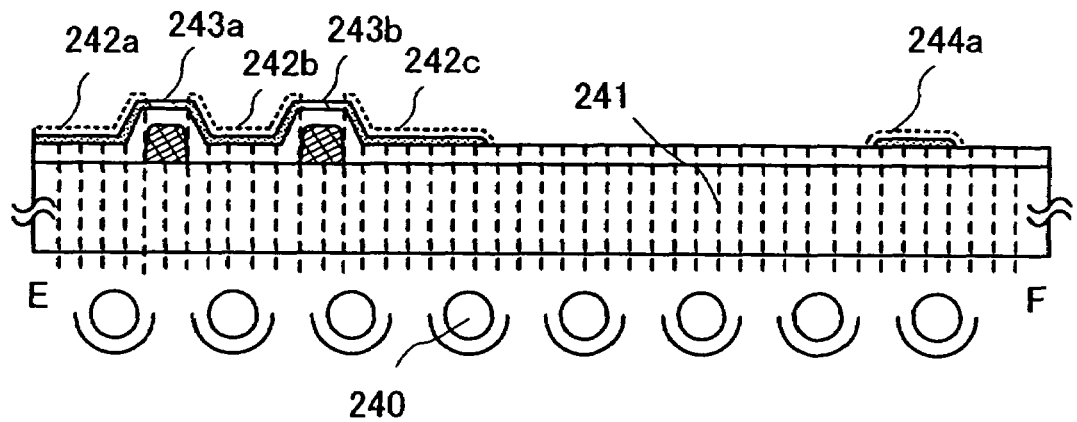

In order to deposit the plating catalyst material on the photocatalyst material 201a and the photocatalyst material 201b, the photocatalyst material 201a and the photocatalyst material 201b are immersed in a solution containing the plating catalyst material, and a plating catalyst material 242a, a plating catalyst material 242b, a plating catalyst material 242c, and a plating catalyst material 242d are deposited on the surface of the photocatalyst material 201a, and a plating catalyst material 244a and a plating catalyst material 244b are deposited on the photocatalyst material 201b (see FIGS. 15A and 15B). In this case, the photocatalyst material 201a and the photocatalyst material 201b are irradiated with light 241 transmitted through the substrate 200 from a light source 240 on the substrate 200 side. The light 241 is transmitted through the substrate 200 and the gate insulating layer 207, whereas it is blocked without being transmitted through the gate electrode layer 203a and the gate electrode layer 203b which have a non-light transmitting property. Therefore, a region of the photocatalyst material 201a and the photocatalyst material 201b superposed over the gate electrode layer 203a and the gate electrode layer 203b is a light-unexposed region, and only in a light-exposed region, the photocatalyst material is activated by light, and the plating catalyst material in the solution containing the plating catalyst material is reduced by its photocatalytic function. Accordingly, the plating catalyst material 242a, the plating catalyst material 242b, the plating catalyst material 242c, and the plating catalyst material 242d are selectively deposited on the surface of the photocatalyst material 201a, and the plating catalyst material 244a and the plating catalyst material 244b are selectively deposited on the surface of the photocatalyst material 201b. On the other hand, the plating catalyst material is not deposited on the surface of a photocatalyst material 243a, a photocatalyst material 243b, a photocatalyst material 243c, and a photocatalyst material 245 which are in light-unexposed regions. The light 241 is set to light having such a wavelength as to generate a photocatalytic function of the photocatalyst material 201a and the photocatalyst material 201b, and light irradiation time and immersion time are appropriately adjusted depending on light energy. In this embodiment mode, titanium oxide is used as the photocatalyst material 201a and the photocatalyst material 201b; therefore, irradiation is performed using ultraviolet light as the light 241.

In the case where the photocatalyst material is activated by light irradiation as described above and a photocatalytic function of the photocatalyst material is utilized, the pH of the solution containing a plating catalyst material is not necessarily adjusted. Sodium hydroxide (NaOH), potassium hydroxide (KOH), or the like does not need to be added for pH adjustment. Therefore, the use of a photocatalytic function has an advantage in that a material which may have an adverse effect such as potassium hydroxide (KOH) does not need to be used depending on materials of a semiconductor layer.

There is no limitation on the immersion method as long as the solution containing a plating catalyst material is in contact with the photocatalyst material 201a and the photocatalyst material 201b. Therefore, the substrate 200 may be placed obliquely (or vertically), and the solution containing a plating catalyst material may be applied so as to flow on the surface of the photocatalyst material 201a and the photocatalyst material 201b over the substrate 200. If plating is performed with a substrate placed obliquely (or vertically) and a solution applied, there is the advantage of miniaturizing an apparatus used for a step even in the case of using a large-area substrate.

Figure 16A:
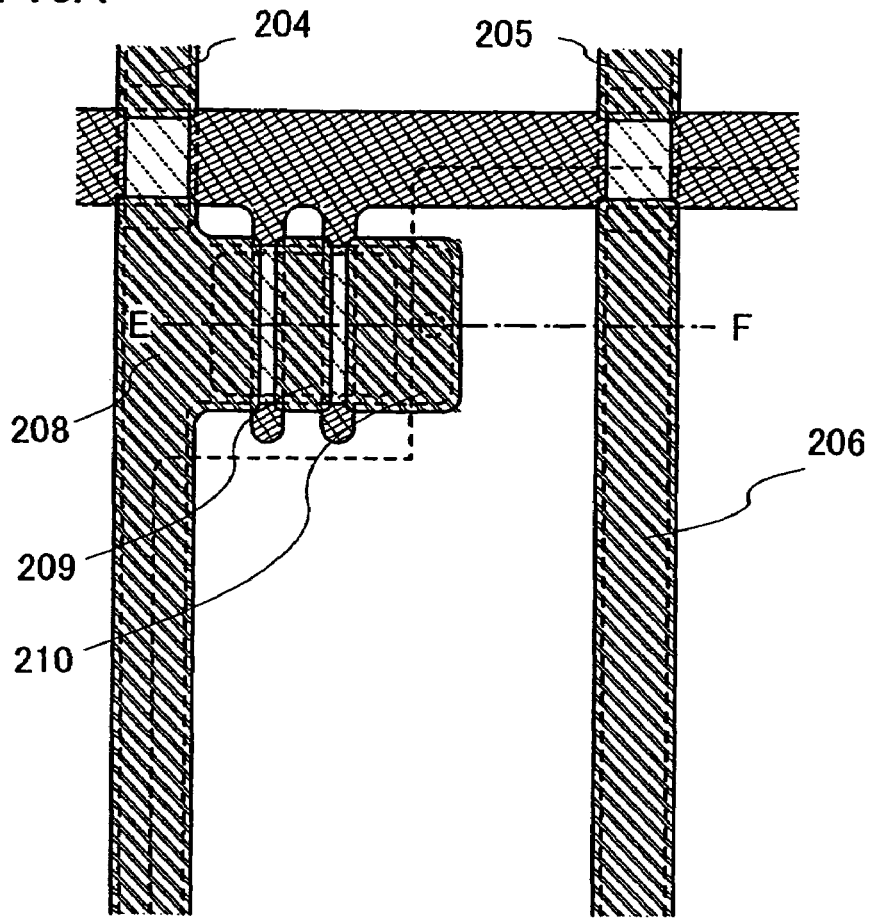
FIGS. 16A and 16B are diagrams explaining a method for manufacturing a display device of the present invention.
Figure 16B:
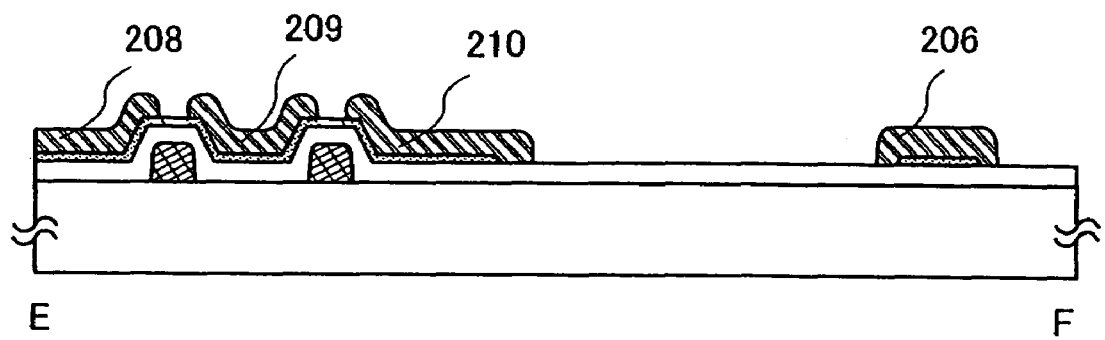

The photocatalyst material 201a and the photocatalyst material 201b adsorbing the plating catalyst material 242a, the plating catalyst material 242b, the plating catalyst material 242c, the plating catalyst material 242d, the plating catalyst material 244a, and the plating catalyst material 244b onto their surfaces are immersed in a plating solution containing a plating metal material, and a metal film is grown over the plating catalyst material 242a, the plating catalyst material 242b, the plating catalyst material 242c, the plating catalyst material 242d, the plating catalyst material 244a, and the plating catalyst material 244b and immersion time is controlled to reach a desired film thickness, thereby forming a source electrode layer or drain electrode layer 208, a source electrode layer or drain electrode layer 209, a source electrode layer or drain electrode layer 210, a source electrode layer or drain electrode layer 204, a capacitor wire layer 205, and a capacitor wire layer 206 in a self-aligned manner (see FIGS. 16A and 16B). Since the source electrode layer or drain electrode layer 208, the source electrode layer or drain electrode layer 209, and the source electrode layer or drain electrode layer 210 can be formed in a self-aligned manner so as to hardly overlap the gate electrode layer 203a and the gate electrode layer 203b, controllability thereof is high.

The plating catalyst material is appropriately selected depending on the plating metal material. As the plating catalyst material, palladium (Pd), rhodium (Rh), ruthenium (Ru), osmium (Os), iridium (Ir), gold (Au), platinum (Pt), silver (Ag), or the like may be used. The plating catalyst material is dissolved in a solution, and is treated as the solution containing the plating catalyst material.

As the plating metal material, nickel (Ni), a nickel alloy (such as a nickel phosphorus (NiP) alloy, a nickel cobalt (NiCo) alloy, a nickel cobalt phosphorus (NiCoP) alloy, a nickel iron phosphorus (NiFeP) alloy, or a nickel tungsten phosphorus (NiWP) alloy), copper (Cu), gold (Au), cobalt (Co), tin (Sn), or the like can be used.

Other detailed plating conditions can be similar to those in Embodiment Mode 1.

In this embodiment mode, as the plating solution containing a metal material, a mixture of nickel sulfate hexahydrate (NiSO$_4$) which is a metal salt, a hypophosphorous acid (H$_3$PO$_2$) which is a reducing agent, and a lactic acid and a malic acid which are complexing agents is used. A metal film to be deposited is a nickel phosphorus alloy (NiP) film.

The plating catalyst material 242a, the plating catalyst material 242b, the plating catalyst material 242c, the plating catalyst material 242d, the plating catalyst material 244a, and the plating catalyst material 244b are deposited to cover the surfaces of the photocatalyst material 201a and the photocatalyst material 201b. Since the metal film formed by plating is formed in multiple directions and three dimensions as well as in a thickness direction, the source electrode layer or drain electrode layer 208, the source electrode layer or drain electrode layer 209, the source electrode layer or drain electrode layer 210, the source electrode layer or drain electrode layer 204, the capacitor wire layer 205, and the capacitor wire layer 206 are formed to cover upper surfaces and side surfaces of the photocatalyst material 201a and the photocatalyst material 201b as shown in FIGS. 16A and 16B.

In the case of adsorbing the plating catalyst material without irradiating with light for generating a photocatalytic function of a photocatalyst material as in Embodiment Mode 2, pH adjustment of the solution containing a plating catalyst material may be performed.

Depending on a combination of a material used for a semiconductor layer and a material used for a source electrode layer and a drain electrode layer, degradation of electrical characteristics may occur, such as incapability of conducting or increase in resistance. Therefore, a material used for a semiconductor layer and a material used for a source electrode layer and a drain electrode layer need to be selected appropriately. In this embodiment mode, the source electrode layer or drain electrode layer is formed by a plating method; therefore, displacement plating of another metal material can be performed on the surface of the source electrode or drain electrode layer. Therefore, by forming on the surface a material with lower resistance than that of a semiconductor layer to be laminated, electrical characteristics of a thin film transistor can be improved. In this embodiment mode, each of the source electrode layer or drain electrode layer 208, the source electrode layer or drain electrode layer 209, and the source electrode layer or drain electrode layer 210 is a nickel phosphorus alloy film formed using palladium as the plating catalyst material. Since pentacene which is an organic semiconductor is used for the semiconductor layer in this embodiment mode, gold is preferable as a material of the source electrode layer and drain electrode layer to be in contact. Therefore, in this embodiment mode, gold plating is performed in which the surfaces of the source electrode layer or drain electrode layer 208, the source electrode layer or drain electrode layer 209, and the source electrode layer or drain electrode layer 210 are replaced by gold. In addition, in this embodiment mode, the source electrode layer or drain electrode layer 204, the capacitor wire layer 205, and the capacitor wire layer 206 are similarly plated with gold by this treatment.

Figure 17A:
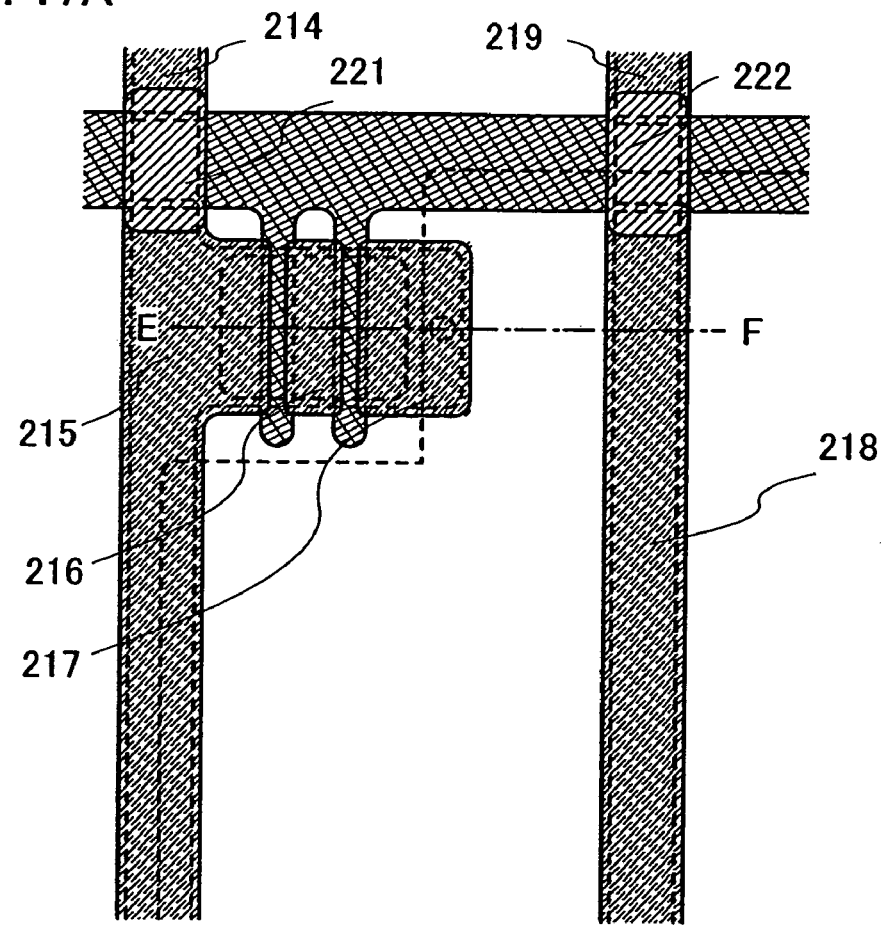
FIGS. 17A and 17B are diagrams explaining a method for manufacturing a display device of the present invention.
Figure 17B:
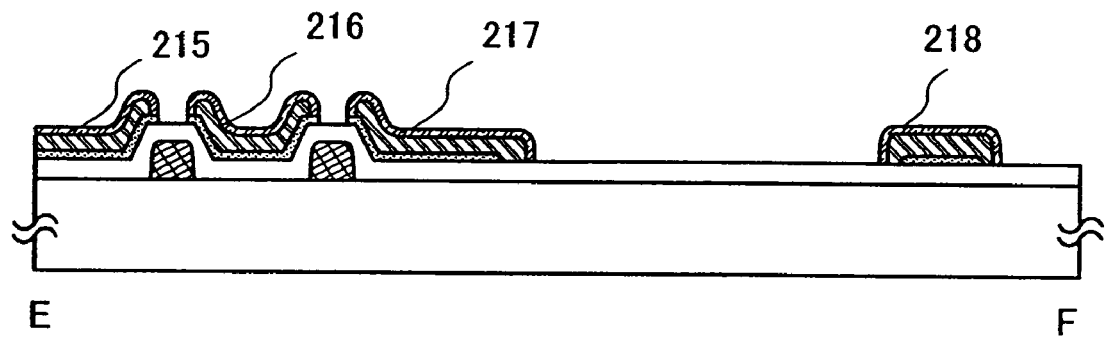
Figure 18A:
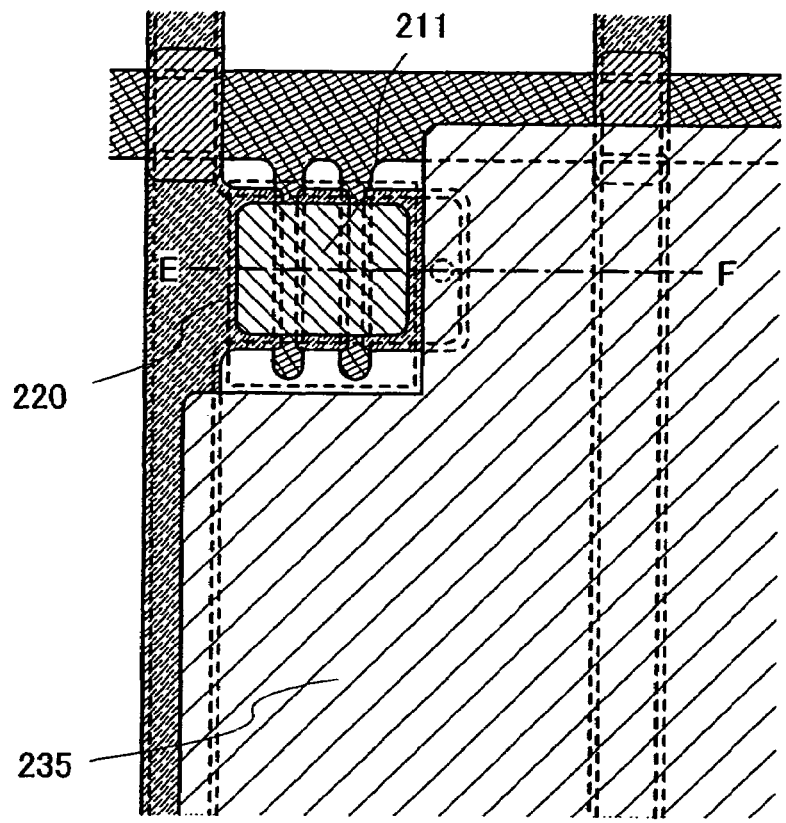
FIGS. 18A and 18B are diagrams explaining a method for manufacturing a display device of the present invention.
Figure 18B:
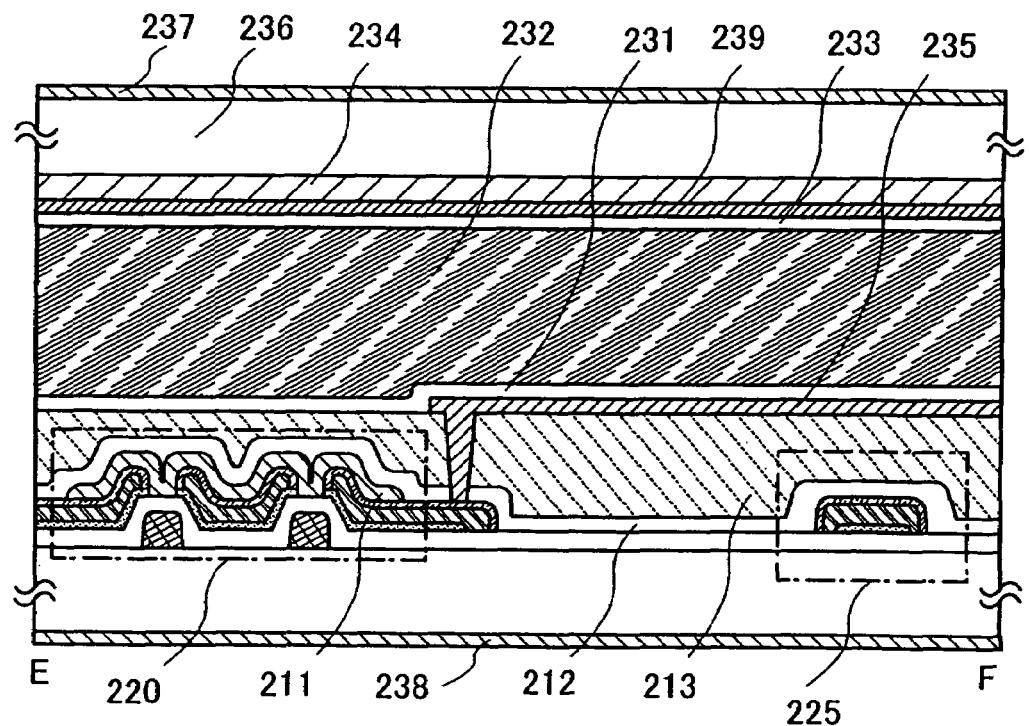

The source electrode layer or drain electrode layer 208, the source electrode layer or drain electrode layer 209, and the source electrode layer or drain electrode layer 210 are immersed in a plating solution containing gold as a metal material to form a metal film 215, a metal film 216, a metal film 217, a metal film 214, a metal film 218, and a metal film 219 which are gold thin films on the surface of the source electrode layer or drain electrode layer 208, the source electrode layer or drain electrode layer 209, the source electrode layer or drain electrode layer 210, the source electrode layer or drain electrode layer 204, the capacitor wire layer 205, and the capacitor wire layer 206 (see FIGS. 17A and 17B).

In this embodiment mode, activation is performed in a sulfuric acid solution before performing gold plating. Further, it is effective to perform preheating (80° C. to 90° C.) immersion with pure water before plating. The plating solution containing gold as a metal material in this embodiment mode includes a metal salt (potassium gold cyanide, chlorauric acid), a complexing agent (EDTA (ethylenediaminetetracetic acid), quadrol, citrate, lactate), a pH buffer (ammonium chloride-ammonia, phosphate-sodium phosphate), and the like. In addition, an active metal ion (for example, an ion of Zn, Co, Ni, Cu, or the like) may be added to increase a deposition rate and obtain a thicker plating film. When an active metal ion is added, there is also an effect such as improvement in luster and adhesion.

A liquid composition containing a conductive material is discharged by a droplet discharge apparatus to form a wire layer 221 and a wire layer 222 (see FIGS. 17A and 17B). The wire layer 221 functions also as a source wire layer or drain wire layer and is formed in contact with the metal film 214 and the metal film 215 to electrically connect the source electrode layer or drain electrode layer 204 to the source electrode layer or drain electrode layer 208. The wire layer 222 is formed in contact with the metal film 219 and the metal film 218 to electrically connect the capacitor wire layer 205 to the capacitor wire layer 206.

As the conductive material for forming the wire layer 221 and the wire layer 222 by a droplet discharge method as described in this embodiment mode, a composition containing a metal particle of Ag (silver), Au (gold), Cu (copper), W (tungsten), Al (aluminum), or the like as a main component can be used. Further, indium tin oxide (ITO), indium tin silicon oxide (ITSO) containing indium tin oxide and silicon oxide, organic indium, organic tin, zinc oxide, titanium nitride, or the like which has a light-transmitting property may be combined.

Alternatively, the wire layer 221 and the wire layer 222 can be formed by etching into a desired shape a conductive film formed by a PVD method, a CVD method, an evaporation method, or the like. In addition, the wire layers can be formed selectively at a predetermined place by a printing method, an electrolytic plating method, or the like. Furthermore, a reflow method or a damascene method may be used. The wire layer may be formed using an element such as Ag, Au, Cu, Ni, Pt, Pd, Ir, Rh, W, Al, Ta, Mo, Cd, Zn, Fe, Ti, Si, Ge, Zr, or Ba, an alloy thereof, or nitride thereof.

Wettability of a solid surface is affected by surface condition. If a material having low wettability by a liquid composition is formed, a surface thereof is a region having low wettability by the liquid composition (hereinafter also referred to as a low wettability region). On the other hand, if a material having high wettability by a liquid composition is formed, a surface thereof is a region having high wettability by the liquid composition (hereinafter also referred to as a high wettability region).

To change wettability means changing also a contact angle of a liquid composition. When a contact angle is large, a liquid composition having fluidity does not spread on a region surface and the surface repels the composition, so the surface is not wetted. When a contact angle is small, a composition having fluidity spreads on a surface, and the surface is wetted well. Therefore, regions having difference wettability have different surface energy. The region having low wettability has low surface energy, and the region having high wettability has high surface energy. Wettability may be uniform, and regions having a difference in wettability, like a high wettability region and a low wettability region, may be formed over the substrate by selectively controlling wettability.

First, as a material which can affect and control wettability, a material containing a fluorocarbon group (fluorocarbon chain) or a silane coupling agent can be used. The silane coupling agent is expressed by the chemical formula: $R_n$—Si—$X_{(4-n)}$ (n=1, 2, 3). In this chemical formula, R represents a material containing a relatively inert group such as an alkyl group. X represents a hydrolytic group such as halogen, a methoxy group, an ethoxy group, or an acetoxy group that is bondable by a condensation of a hydroxyl group or adsorbed water on a base material surface.

By using a fluorine-based silane coupling agent which has a fluoroalkyl group for R, (such as fluoroalkylsilane (hereinafter also referred to as FAS)), as the silane coupling agent, the wettability can further be lowered. R in FAS has a structure expressed by $(CF_3)(CF_2)_X(CH_2)_Y$ (X is an integer in the range of 0 to 10, and Y is an integer in the range of 0 to 4). When a plurality of Rs or Xs is bonded with Si, the Rs or Xs may be all the same or different from one another. The following can be given as typical FAS: heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane.

A material having an alkyl group without a fluorocarbon chain being provided in R of a silane coupling agent can be used. Octadecyl trimethoxysilane or the like can be used as, for example, organosilane.

As a solvent, a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalane; tetrahydrofuran; or the like is used.

Further, a material having a fluorocarbon chain (a fluorine-based resin) can be used. As the fluorine-based resin, the following can be used: polytetrafluoroethylene (PTFE) or a tetrafluoroethylene resin; perfluoroalkoxyalkane (PFA) or a tetrafluoroethylene perfluoroalkylvinylether copolymer resin; perfluoroethylene propene copolymer (PFEP) or a tetrafluoroethylene-hexafluoropropylene copolymer resin; ethylene-tetrafluoroethylene copolymer (ETFE) or a tetrafluoroethylene-ethylene copolymer resin; a polyvinylidene fluoride (PVDF) resin or a vinylidene fluoride resin; polychlorotrifluoro ethylene (PCTFE) or a polytrifluorochloroethylene resin; ethylene-chlorotrifluoroethylene copolymer (ECTFE) or a polytrifluorochloroethylene-ethylene copolymer resin; polytetrafluoroethylene-perfluorodioxole copolymer (TFE/PDD); polyvinyl fluoride (PVF) or a vinyl fluoride resin; or the like.

In addition, treatment with $CF_4$ plasma or the like may be performed on an inorganic material or an organic material.

In this embodiment mode, an example of activating a photocatalyst material by backside light exposure to deposit a plating catalyst material by its photocatalytic function is described. By a method in which a mask film is formed over the photocatalyst material as in Embodiment Modes 2 and 3, the mask film remains in formation regions of the wire layer 221 and the wire layer 222. Before forming the wire layer 221 and the wire layer 222, the photocatalyst material is activated here by being irradiated with light not through the substrate 200 but from the side where the gate electrode layer or the like is formed. The mask film over the photocatalyst material is removed by a photocatalytic function, and the mask film in the formation region of the wire layer 221 and the wire layer 222 is selectively removed. When using a mask film which has liquid repellency to a conductive material forming the wire layer, a liquid composition containing a conductive material is repelled by the peripheral mask film and is not spread; therefore, the wire layer 221 and the wire layer 222 can be selectively formed in a minute shape with high controllability.

Thus, it is preferable to appropriately select a material of the mask film and control wettability by a composition containing a conductive material forming the wire layer. The degree of wettability may be appropriately set in accordance with a line width or a pattern shape of a conductive layer or an insulating layer to be formed.

A semiconductor layer 211 is formed using pentacene by a droplet discharge method so as to be in contact with the metal film 215, the metal film 216, and the metal film 217 over the source electrode layer or drain electrode layer 208, the source electrode layer or drain electrode layer 209, and the source electrode layer or drain electrode layer 210 to form a coplanar thin film transistor 220. In addition, a capacitor 225 is also formed.

An insulating layer 212 and an insulating layer 213 are formed over the thin film transistor 220 and the capacitor 225. The insulating layer 213 functions as a planarizing film.

The insulating layer 212 and the insulating layer 213 can be formed using a material selected from silicon oxide, silicon nitride, silicon oxynitride, silicon nitride oxide, aluminum nitride (AlN), aluminum oxynitride (AlON), aluminum nitride oxide having more nitrogen content than oxygen content (AlNO), aluminum oxide, diamond-like carbon (DLC), a nitrogen-containing carbon (CN) film, a PSG (phosphorus glass), a BPSG (boron phosphorus glass), an alumina film, polysilazane, and other substances containing an inorganic insulating material. Further, a siloxane resin may be employed. A photosensitive or non-photosensitive organic insulating material may be employed, for example, polyimide, acrylic, polyamide, polyimide amide, resist, benzocyclobutene, or a low dielectric material can be used.

After forming the insulating layer 212 and the insulating layer 213 by discharging a composition, a surface of the insulating layer 212 and the insulating layer 213 may be planarized by pressing with pressure to improve its planarity. As a pressing method, unevenness may be smoothed by moving a roller-shaped object over the surface, or the surface may be perpendicularly pressed with a flat plate-shaped object. Alternatively, an uneven portion on the surface may be eliminated with an air knife after softening or melting the surface with a solvent or the like. A CMP method may also be used for polishing the surface. This step can be employed in planarizing a surface when unevenness is generated by a formation method. When the planarity is improved through this step, display unevenness or the like of the display panel can be prevented; therefore, a high-definition image can be displayed.

Subsequently, an opening reaching the metal film 217 is formed in the insulating layer 212 and the insulating layer 213, and a pixel electrode layer 235 is formed in contact with the metal film 217 over the source electrode layer or drain electrode layer 210. The pixel electrode layer 235 can be formed using a similar material to the above-described first electrode layer 117. In the case of manufacturing a transmissive liquid crystal display panel, indium oxide containing tungsten oxide, indium zinc oxide containing tungsten oxide, indium oxide containing titanium oxide, indium tin oxide containing titanium oxide, or the like can be used. Naturally, indium tin oxide (ITO), indium zinc oxide (IZO), indium tin oxide to which silicon oxide is added (ITSO), or the like can also be used. As a reflective metal thin film, a conductive film formed of titanium, tungsten, nickel, gold, platinum, silver, aluminum, magnesium, calcium, lithium, an alloy thereof, or the like can be employed.

The pixel electrode layer 235 can be formed using an evaporation method, a sputtering method, a CVD method, a printing method, a droplet discharge method, or the like. In this embodiment mode, indium tin oxide (ITO) is used for the pixel electrode layer 235.

Next, an insulating layer 231 referred to as an orientation film is formed by a printing method or a spin coating method to cover the pixel electrode layer 235 and the insulating layer 213. Note that the insulating layer 231 can be selectively formed by using a screen printing method or an offset printing method. Thereafter, rubbing is performed. Then, a sealant 282 is formed by a droplet discharge method at the periphery of a region where the pixels are formed.

Then, an opposite substrate 236 provided with an insulating layer 233 serving as an orientation film, a conductive layer 239 serving as an opposite electrode, a colored layer 234 serving as a color filter, and a polarizing plate 237 is attached to the substrate 200 that is a TFT substrate with a spacer 281 interposed therebetween. By providing a space with a liquid crystal layer 232, a liquid crystal display panel can be manufactured (see FIGS. 18A to 19B). A polarizing plate 238 is formed also on a side opposite to the side of the substrate 200 where elements are formed. The sealant may be mixed with a filler, and further, the opposite substrate 236 may be provided with a shielding film (black matrix) or the like. Note that a dispenser method (a dropping method) or a dip method (a pumping method) by which a liquid crystal is injected utilizing a capillary phenomenon after attaching the substrate 200 having elements to the opposite substrate 236 can be used as a method for forming the liquid crystal layer.

Figure 21:
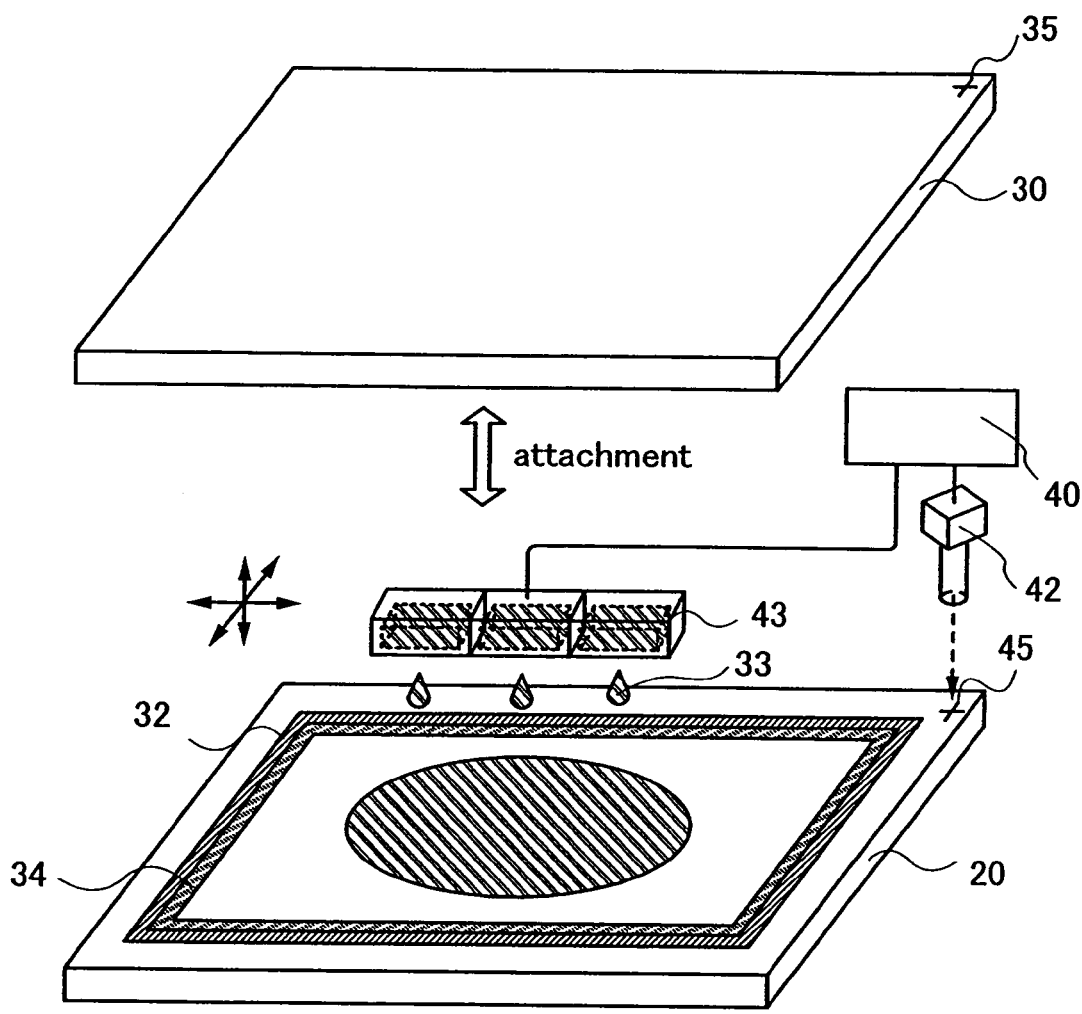
FIG. 21 is a diagram explaining a structure of a droplet drip apparatus applicable to the present invention.

A liquid crystal dropping method employing the dispenser method is explained with reference to FIG. 21. In the liquid crystal dropping method shown in FIG. 21, a control device 40, an imaging means 42, a head 43, a liquid crystal 33, markers 35 and 45, a barrier layer 34, a sealant 32, a TFT substrate 30, and an opposite substrate 20 are used. A closed loop is formed with the sealant 32, and the liquid crystal 33 is dropped once or plural times in the closed loop from the head 43. When the liquid crystal material has high viscosity, the liquid crystal material is continuously discharged and attached to a liquid crystal formation region without a break. On the other hand, when the liquid crystal material has low viscosity, the liquid crystal material is intermittently discharged to drop a droplet as shown in FIG. 21. At this time, the barrier layer 34 is provided to prevent the sealant 32 and the liquid crystal 33 from reacting with each other. Subsequently, the substrates are attached to each other in vacuum, and then, ultraviolet curing is performed to make the space filled with the liquid crystal. Alternatively, a sealant may be formed on a TFT substrate side, and a liquid crystal may be dropped.

The spacer may be provided by dispersing particles of several micrometers; however, in this embodiment mode, the spacer is provided by forming a resin film over the entire surface of the substrate and then etching it. After coating the substrate with such a spacer material using a spinner, the spacer material is formed into a predetermined pattern by light exposure and developing treatment. Further, the pattern is cured by heating at a temperature of 150° C. to 200° C. with a clean oven. The spacer manufactured in this manner can have different shapes depending on the conditions of the light exposure and the developing treatment. It is preferable that the spacer has a pillar shape with a flat top portion since the mechanical strength as a liquid crystal display device can be secured when the opposite substrate is attached to the substrate. The shape of the spacer is not specifically limited, and it may have a shape of a circular cone or a pyramid.

A connection portion is formed to connect the inside of the display device formed through the above steps to an external wiring board. The insulating layer in the connection portion is removed by ashing treatment using an oxygen gas under atmospheric pressure or pressure close to the atmospheric pressure. This treatment is performed by using an oxygen gas and one or more gases of hydrogen, $CF_4$, $NF_3$, $H_2O$, and $CHF_3$. In this step, the ashing treatment is performed after sealing with the opposite substrate to prevent damage or destruction due to static electricity; however, the ashing treatment may be performed at any timing when there are few effects of static electricity.

Subsequently, a terminal electrode layer 287 which is electrically connected to the pixel portion is provided with an FPC 286 which is a connection wiring board with an anisotropic conductive layer 285 interposed therebetween. The FPC 286 has a function of transmitting a signal or an electric potential from the external. Through the above-mentioned steps, a liquid crystal display device having a display function can be manufactured.

FIG. 19A shows a top view of liquid crystal display device. As shown in FIG. 19A, a pixel portion 290 and scan line driver regions 291a and 291b are sealed between the substrate 200 and the opposite substrate 280 with the sealant 282, and a signal line driver circuit 292 formed with a driver IC is provided over the substrate 200. A driver circuit having thin film transistors 283 and 284 is provided in a driver region.

Since the thin film transistors 283 and 284 are n-channel thin film transistors, an NMOS circuit including the thin film transistors 283 and 284 is provided as a peripheral driver circuit in this embodiment mode.

In this embodiment mode, an NMOS structure is used in a driver circuit region so as to function as an inverter. In the case of thus using only a PMOS structure or an NMOS structure, gate electrode layers of a part of TFTs are connected to source or drain electrode layers thereof.

In this embodiment mode, although a switching TFT has a double gate structure, it may have a single gate structure or a multi-gate structure. In the case where a semiconductor is manufactured using a SAS or a crystalline semiconductor, an impurity region can be formed by adding an impurity which imparts one conductivity type. In this case, the semiconductor layer may have impurity regions having different concentrations. For example, the semiconductor layer may have a low concentration impurity region in the vicinity of a channel formation region and a region which is overlapped with a gate electrode layer, and may have a high concentration impurity region outside thereof.

As described above, the process can be simplified in this embodiment mode. Also, by forming various kinds of components (parts) and a mask layer directly over a substrate using a droplet discharge method, a display panel can be easily manufactured even in the case of using a glass substrate of the fifth generation or later having a side of 1000 mm or more.

In this embodiment mode, a photocatalyst material which adsorbs a plating catalyst element is selectively irradiated with light by backside light exposure to adsorb the plating catalyst element onto the light-exposed photocatalyst material, thereby forming a source electrode layer and a drain electrode layer in a self-aligned manner. Accordingly, a defective shape or the like due to misalignment of a mask is not generated, and a wire can be formed with high controllability. Therefore, a high-reliability semiconductor device, display device, or the like can be manufactured with high yield by using the present invention.

In addition, a plating method is used; therefore, the thickness or size of a wire layer can be controlled relatively easily, and a wire layer can be manufactured to suit application. Therefore, a high-performance and high-reliability semiconductor device which can operate at high speed can also be manufactured.

Embodiment Mode 6

A thin film transistor can be formed using the present invention, and a display device can be formed using the thin film transistor. In addition, when a light emitting element is used and an n-channel transistor is used as a transistor which drives the light emitting element, light emitted from the light emitting element performs any one of bottom emission, top emission, and dual emission. Here, a lamination structure of the light emitting element corresponding to each emission type is explained with reference to FIGS. 12A to 12C.

In this embodiment mode, thin film transistors 461, 471, and 481 are used, each of which is the coplanar thin film transistor manufactured in Embodiment Mode 4. The thin film transistor 481 is provided over a substrate 480 having a light transmitting property and includes a gate electrode layer 493, a gate insulating layer 497, a semiconductor layer 496, a source electrode layer or drain electrode layer 487a, and a source electrode layer or drain electrode layer 487b. The source electrode layer or drain electrode layer 487a and the source electrode layer or drain electrode layer 487b are formed by a plating method in a self-aligned manner by activating a photocatalyst material 495a and a photocatalyst material 495b by backside light exposure with the use of the gate electrode layer 493 as a mask. In addition, in this embodiment mode, the gate electrode layer 493 is also formed by a plating method using a photocatalyst material or a material having an amino group 482, which functions to adsorb or deposit a plating catalyst material.

The photocatalyst material or material having an amino group 482 may be processed into a desired shape after being formed over the substrate or may be selectively formed using a droplet discharge method, a printing method, or the like. In the case of using a photocatalytic function by light irradiation of the photocatalyst material, selective light irradiation can be performed using a photomask. The photocatalyst material or material having an amino group 482 is the first object that is formed over the substrate. Therefore, by using a photomask in a formation step of the photocatalyst material or material having an amino group 482 which is relatively unaffected by misalignment of the photomask and subsequently forming the source electrode layer or drain electrode layer in a self-aligned manner with the use of backside light exposure, a precise semiconductor device can be manufactured with high yield. As the photomask, a mask formed by providing a substrate formed of a light transmitting material with a mask formed of a light blocking material. For example, an ultraviolet lamp may be used as a light source; a quartz substrate, as the substrate; a metal mask formed of metal, as the mask. When the photocatalyst material or material having an amino group 482 is selectively formed by a droplet discharge method as in this embodiment mode, a manufacturing process is more simplified.

Figure 12A:
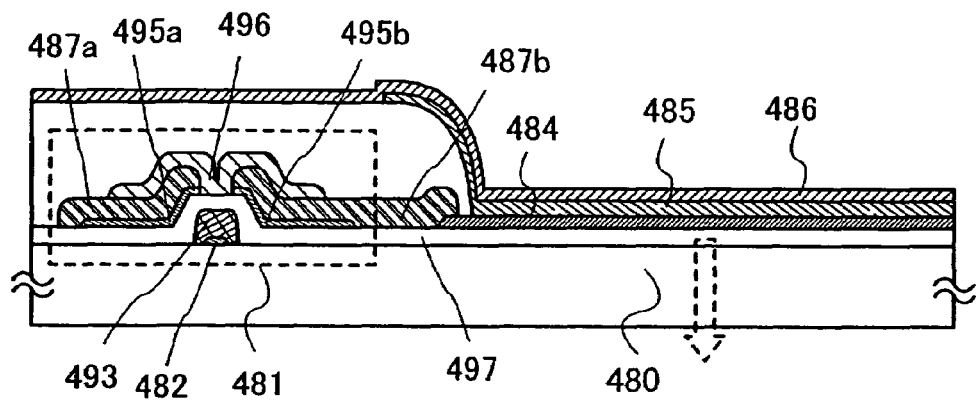
FIGS. 12A to 12C are diagrams explaining a method for manufacturing a display device of the present invention.
Figure 12B:
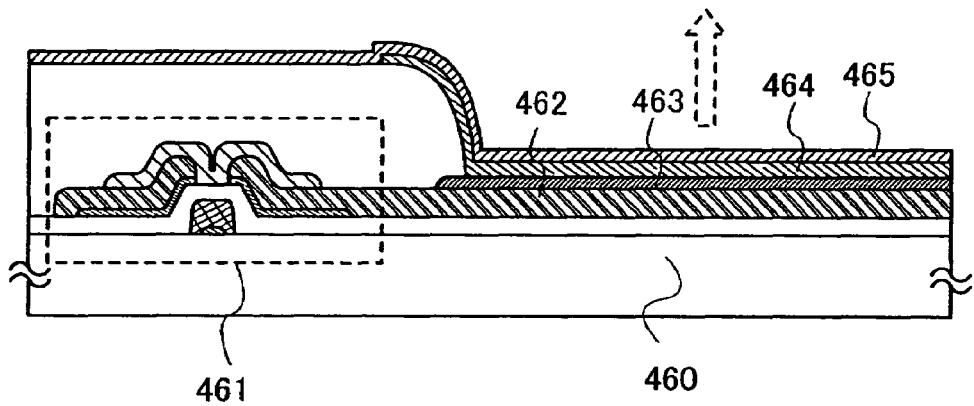
Figure 12C:
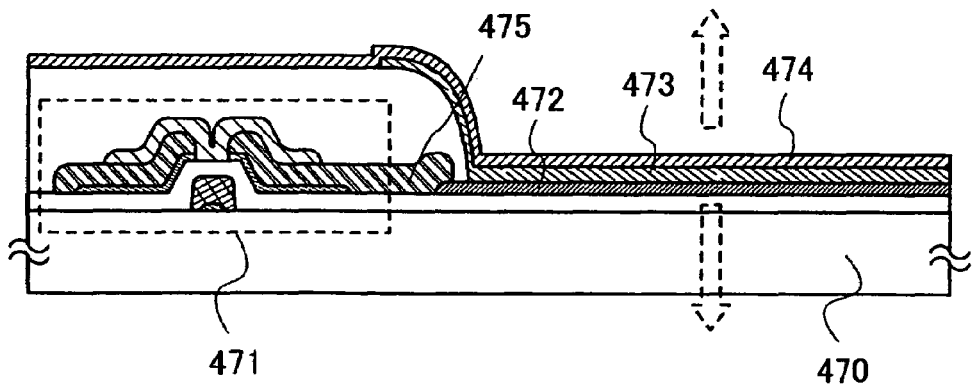

First, the case of emitting light to the substrate 480 side, in other words, the case of bottom emission, is explained with reference to FIG. 12A. In this case, a first electrode layer 484 in contact with the source or drain electrode layer 487b to be electrically connected to the thin film transistor 481, an electroluminescent layer 485, and a second electrode layer 486 are sequentially laminated. The substrate 480 through which light passes is required to transmit at least visible light. Next, the case of emitting light to the side opposite to a substrate 460, in other words, the case of top emission, is explained with reference to FIG. 12B. The thin film transistor 461 can be formed in a similar manner to the above described thin film transistor.

A source electrode layer or drain electrode layer 462 electrically connected to the thin film transistor 461 is in contact with and electrically connected to a first electrode layer 463. The first electrode layer 463, an electroluminescent layer 464, and a second electrode layer 465 are sequentially laminated. The source electrode layer or drain electrode layer 462 is a reflective metal layer and reflects light, which is emitted from a light emitting element, upward as indicated by an arrow. The source electrode layer or drain electrode layer 462 and the first electrode layer 463 are laminated, and therefore, when the first electrode layer 463 is formed using a light-transmitting material and transmits light, the light is reflected by the source electrode layer or drain electrode layer 462 and is then emitted to the side opposite to the substrate 460. Naturally, the first electrode layer 463 may be formed using a reflective metal film. Since light generated in the light emitting element is emitted through the second electrode layer 465, the second electrode layer 465 is formed using a material which transmits at least visible light. Lastly, the case of emitting light to both a substrate 470 side and a side opposite thereto, in other words, the case of dual emission, is explained with reference to FIG. 12C. The thin film transistor 471 is also a channel protective thin film transistor. A source electrode layer or drain electrode layer 477 electrically connected to a semiconductor layer of the thin film transistor 471 is electrically connected to a first electrode layer 472. The first electrode layer 472, an electroluminescent layer 473, and a second electrode layer 474 are sequentially laminated. When both the first electrode layer 472 and the second electrode layer 474 are formed using a material which transmits at least light in the visible region or formed to have such thicknesses as to transmit light, the dual emission is realized. In this case, an insulating layer and the substrate 470 through which light passes are also required to transmit at least light in the visible region.

Modes of light emitting elements that can be applied to this embodiment mode are shown in FIGS. 11A to 11D. FIGS. 11A to 11D each show a structure of a light emitting element. Each light emitting element has a structure in which an electroluminescent layer 860, in which an organic compound and an inorganic compound are mixed, is interposed between a first electrode layer 870 and a second electrode layer 850. The electroluminescent layer 860 includes a first layer 804, a second layer 803, and a third layer 802 as shown in FIGS. 11A to 11D.

The first layer 804 is a layer which has a function to transport holes to the second layer 803, and includes at least a first organic compound and a first inorganic compound showing an electron-accepting property to the first organic compound. What is important is that the first organic compound and the first inorganic compound are not only simply mixed, but the first inorganic compound shows an electron-accepting property to the first organic compound. This structure generates many hole-carriers in the first organic compound, which originally has almost no inherent carriers, and thus, a highly excellent hole-injecting property and a highly excellent hole-transporting property can be obtained.

Therefore, as for the first layer 804, not only an advantageous effect that is considered to be obtained by mixing an inorganic compound (such as improvement in heat resistance) but also excellent conductivity (in particular, a hole-injecting property and a hole-transporting property in the first layer 804) can be obtained. This excellent conductivity is advantageous effect that cannot be obtained in a conventional hole-transporting layer in which an organic compound and an inorganic compound, which do not electronically interact with each other, are simply mixed. This advantageous effect can make a drive voltage lower than conventional one. In addition, since the first layer 804 can be made thicker without causing an increase in drive voltage, short circuit of the element due to dust and the like can be suppressed.

It is preferable to use a hole-transporting organic compound as the first organic compound since hole-carriers are generated in the first organic compound as described above. Examples of the hole-transporting organic compound include, but are not limited to, phthalocyanine (abbreviated as $H_2Pc$), copper phthalocyanine (abbreviated as CuPc), vanadyl phthalocyanine (abbreviated as VOPc), 4,4',4"-tris(N,N-diphenylamino)triphenylamine (abbreviated as TDATA), 4,4',4"-tris[N-(3-methylphenyl)-N-phenylamino]triphenylamine (abbreviated as MTDATA), 1,3,5-tris[N,N-di(m-tolyl)amino]benzene (abbreviated as m-MTDAB), N,N'- diphenyl-N,N'-bis(3-methylphenyl)-1,1'-biphenyl-4,4'-diamine (abbreviated as TPD), 4,4'-bis[N-(1-naphthyl)-N-phenylamino]biphenyl (abbreviated as NPB), 4,4'-bis{N-[4-di(m-tolyl)amino]phenyl-N-phenylamino}biphenyl (abbreviated as DNTPD), 4,4',4''-tris(N-carbazolyl)triphenylamine (abbreviated as TCTA), and the like. In addition, among the compounds mentioned above, aromatic amine compounds as typified by TDATA, MTDATA, m-MTDAB, TPD, NPB, DNTPD, and TCTA can easily generate hole-carriers, and are a suitable group of compounds for the first organic compound.

On the other hand, the first inorganic compound may be any material as long as the material can easily accept electrons from the first organic compound, and various kinds of metal oxides and metal nitrides can be used. An oxide of a transition metal that belongs to any of Groups 4 to 12 of the periodic table is preferable since such oxide of a transition metal easily show an electron-accepting property. Specifically, titanium oxide, zirconium oxide, vanadium oxide, molybdenum oxide, tungsten oxide, rhenium oxide, ruthenium oxide, zinc oxide, and the like can be used. In addition, among the metal oxides mentioned above, oxides of transition metals that belong to any of Groups 4 to 8 have a higher electron-accepting property, which are a preferable group of compounds. In particular, vanadium oxide, molybdenum oxide, tungsten oxide, and rhenium oxide are preferable since they can be formed by vacuum evaporation and can be easily handled.

Note that the first layer 804 may be formed by laminating a plurality of layers each including a combination of the organic compound and the inorganic compound as described above, or may further include another organic compound or another inorganic compound.

Next, the third layer 802 is explained. The third layer 802 is a layer which has a function to transport electrons to the second layer 803, and includes at least a third organic compound and a third inorganic compound showing an electron-donating property to the third organic compound. What is important is that the third organic compound and the third inorganic compound are not only simply mixed but also the third inorganic compound shows an electron-donating property to the third organic compound. This structure generates many electron-carriers in the third organic compound which has originally almost no inherent carriers, and a highly excellent electron-injecting property and a highly excellent electron-transporting property can be obtained.

Therefore, as for the third layer 802, not only an advantageous effect that is considered to be obtained by mixing an inorganic compound (such as improvement in heat resistance) but also excellent conductivity (in particular, an electron-injecting property and an electron-transporting property in the third layer 802) can also be obtained. This excellent conductivity is an advantageous effect that cannot be obtained in a conventional electron-transporting layer in which an organic compound and an inorganic compound, which do not electronically interact with each other, are simply mixed. This advantageous effect can make a drive voltage lower than the conventional one. In addition, since the third layer 802 can be made thick without causing an increase in drive voltage, short circuit of the element due to dust and the like can be suppressed.

It is preferable to use an electron-transporting organic compound as the third organic compound since electron-carriers are generated in the third organic compound as described above. Examples of the electron-transporting organic compound include, but are not limited to, tris(8-quinolinolato) aluminum (abbreviated as $Alq_3$), tris(4-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)(4-phenylphenolato) aluminum (abbreviated as BAlq), bis[2-(2'-hydroxyphenyl) benzoxazolato]zinc (abbreviated as $Zn(BOX)_2$), bis[2-(2'-hydroxyphenyl)benzothiazolato]zinc (abbreviated as $Zn(BTZ)_2$), bathophenanthroline (abbreviated as BPhen), bathocuproin (abbreviated as BCP), 2-(4-biphenylyl)-5-(4-tert-butylphenyl)-1,3,4-oxadiazole (abbreviated as PBD), 1,3-bis[5-(4-tert-butylphenyl)-1,3,4-oxadiazol-2-yl]benzene (abbreviated as OXD-7), 2,2',2''-(1,3,5-benzenetriyl)-tris(1-phenyl-1H-benzimidazole) (abbreviated as TPBI), 3-(4-biphenylyl)-4-phenyl-5-(4-tert-butylphenyl)-1,2,4-triazole (abbreviated as TAZ), 3-(4-biphenylyl)-4-(4-ethylphenyl)-5-(4-tert-butylphenyl)-1,2,4-triazole (abbreviated as p-EtTAZ), and the like. In addition, among the compounds mentioned above, chelate metal complexes each having a chelate ligand including an aromatic ring as typified by $Alq_3$, $Almq_3$, $BeBq_2$, BAlq, $Zn(BOX)_2$, $Zn(BTZ)_2$, and the like; organic compounds each having a phenanthroline skeleton as typified by BPhen, BCP, and the like; and organic compounds having an oxadiazole skeleton as typified by PBD, OXD-7, and the like can easily generate electron-carriers, and are suitable groups of compounds for the third organic compound.

On the other hand, the third inorganic compound may be any material as long as the material can easily donate electrons to the third organic compound, and various kinds of metal oxide and metal nitride can be used. Alkali metal oxide, alkaline earth metal oxide, rare earth metal oxide, alkali metal nitride, alkaline earth metal nitride, and rare earth metal nitride are preferable since they easily show an electron-donating property. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable since they can be formed by vacuum evaporation and can be easily handled.

Note that the third layer 802 may be formed by laminating a plurality of layers each including a combination of the organic compound and the inorganic compound as described above, or may further include another organic compound or another inorganic compound.

Next, the second layer 803 is explained. The second layer 803 is a layer which has a function to emit light, and includes a second organic compound that has a light emitting property. A second inorganic compound may also be included. The second layer 803 can be formed by using various light emitting organic compounds and inorganic compounds. However, since it is believed to be hard to make a current flow through the second layer 803 as compared with the first layer 804 or the third layer 802, the thickness of the second layer 803 is preferably approximately 10 nm to 100 nm.

The second organic compound is not particularly limited as long as it is a light-emitting organic compound, and examples of the second organic compound include, for example, 9,10-di(2-naphthyl)anthracene (abbreviated as DNA), 9,10-di(2-naphthyl)-2-tert-butylanthracene (abbreviated as t-BuDNA), 4,4'-bis(2,2-diphenylvinyl)biphenyl (abbreviated as DPVBi), coumarin 30, coumarin 6, coumarin 545, coumarin 545T, perylene, rubrene, periflanthene, 2,5,8,11-tetra(tert-butyl) perylene (abbreviated as TBP), 9,10-diphenylanthracene (abbreviated as DPA), 5,12-diphenyltetracene, 4-(dicyanomethylene)-2-methyl-6-[p-(dimethylamino)styryl]-4H-pyran (abbreviated as DCM1), 4-(dicyanomethylene)-2-methyl-6-[2-julolidine-9-yl)ethenyl]-4H-pyran (abbreviated as DCM2), 4-(dicyanomethylene)-2,6-bis[p-(dimethylamino)

styryl]-4H-pyran (abbreviated as BisDCM), and the like. In addition, it is also possible to use a compound capable of emitting phosphorescence such as bis[2-(4',6'-difluorophenyl)pyridinato-N,C$^{2'}$]iridium(picolinate) (abbreviated as FIrpic), bis{2-[3',5'-bis(trifluoromethyl)phenyl]pyridinato-N,C$^{2'}$}iridium(picolinate) (abbreviated as Ir(CF$_3$ ppy)$_2$(pic)), tris(2-phenylpyridinato-N,C$^{2'}$)iridium (abbreviated as Ir(ppy)$_3$), bis(2-phenylpyridinato-N,C$^{2'}$)iridium(acetylacetonate) (abbreviated as Ir(ppy)$_2$(acac)), bis[2-(2'-thienyl)pyridinato-N,C$^{3'}$]iridium(acetylacetonate) (abbreviated as Ir(thp)$_2$(acac)), bis(2-phenylquinolinato-N,C$^{2'}$)iridium (acetylacetonate) (abbreviated as Ir(pq)$_2$(acac)), or bis[2-(2'-benzothienyl)pyridinato-N,C$^{3'}$]iridium(acetylacetonate) (abbreviated as Ir(btp)$_2$(acac)).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only a small amount of current needs to be applied to a light-emitting element, and thus, reliability can be improved. A pixel emitting red light and a pixel emitting green light may be formed by using a triplet excitation light-emitting material and a pixel emitting blue light may be formed by using a singlet excitation light-emitting material to achieve lower power consumption as well. Low power consumption can be further achieved by forming a light-emitting element emitting green light that is highly visible to human eyes by using a triplet excitation light-emitting material.

The second layer 803 may include not only the second organic compound as described above, which produces light emission, but also another organic compound. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviated as CBP), 1,3,5-tris[4-(N-carbazolyl)phenyl]benzene (abbreviated as TCPB), and the like. It is preferable that the organic compound, which is added in addition to the second organic compound, have higher excitation energy than that of the second organic compound and be added in larger amounts than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure in which light emitting layers having different light emission wavelength bands are each formed in pixels so as to perform color display. Typically, light emitting layers corresponding to respective luminescent colors of R (red), G (green), and B (blue) are formed. In this case, color purity can be improved and specular reflection (glare) of a pixel portion can be prevented by providing a filter that transmits light of a certain light emission wavelength band on a light emission side of the pixels. By providing the filter, a circular polarizing plate or the like, which has been conventionally thought to be required, can be omitted, thereby reducing loss of light emitted from the light emitting layers. In addition, a change in hue, which is caused in the case where a pixel portion (a display screen) is seen obliquely, can be reduced.

The material which can be used with second layer 803 is preferable in both a low-molecular organic light-emitting material and a high molecular organic light emitting material. A high molecular organic light emitting material has high physical strength in comparison with a low molecular material, and a durability of an element is high. In addition, manufacturing of an element is relatively since a high molecular organic light emitting material can be formed by coating.

Since the luminescent color is determined by a material of the light emitting layer, a light emitting element that emits light of a desired color can be formed by selecting the material. As the high molecular electroluminescent material that can be used to form the light emitting layer, a polyparaphenylene vinylene based material, a polyparaphenylene based material, a polythiophene based material, or a polyfluorene based material can be given.

As the polyparaphenylene vinylene based material, a derivative of poly(paraphenylenevinylene) [PPV]: poly(2,5-dialkoxy-1,4-phenylenevinylene) [RO—PPV]; poly[2-(2'-ethyl-hexoxy)-5-methoxy-1,4-phenylenevinylene] [MEH—PPV]; poly[2-(dialkoxyphenyl)-1,4-phenylenevinylene] [ROPh-PPV]; or the like can be used. As the polyparaphenylene based material, a derivative of polyparaphenylene [PPP]: poly(2,5-dialkoxy-1,4-phenylene) [RO—PPP]; poly (2,5-dihexoxy-1,4-phenylene); or the like can be used. As the polythiophene based material, a derivative of polythiophene [PT]: poly(3-alkylthiophene) [PAT]; poly(3-hexylthiophene) [PHT]; poly(3-cyclohexylthiophene) [PCHT]; poly(3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2-bithiophene] [PTOPT]; or the like can be used. As the polyfluorene based material, a derivative of polyfluorene [PF]: poly(9,9-dialkylfluorene) [PDAF]; poly(9,9-dioctylfluorene) [PDOF]; or the like can be given.

The second inorganic compound may be any inorganic compound as long as light-emission of the second organic compound is not easily quenched by the inorganic compound, and various kinds of metal oxide and metal nitride can be used. In particular, an oxide of a metal that belongs to Group 13 or 14 of the periodic table is preferable since light-emission of the second organic compound is not easily quenched by such an oxide, and specifically, aluminum oxide, gallium oxide, silicon oxide, and germanium oxide are preferable. However, the second inorganic compound is not limited thereto.

Note that the second layer 803 may be formed by laminating a plurality of layers each including a combination of the organic compound and the inorganic compound as described above, or may further include another organic compound or another inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light emitting element formed using the above-described material emits light when biased in a forward direction. A pixel of a display device formed with the light emitting element can be driven by a simple matrix (passive matrix) mode or an active matrix mode. In either mode, each pixel is made to emit light by applying a forward bias thereto in specific timing, and the pixel is in a non-light-emitting state for a certain period. By applying a backward bias at this non-light-emitting time, reliability of the light emitting element can be improved. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of the light emitting device can be improved. The alternating driving can be applied to both digital drive and analog drive.

Thus, a color filter (colored layer) may be formed over a sealing substrate. The color filter (colored layer) can be formed by an evaporation method or a droplet discharge method. When the color filter (colored filter) is used, high-definition display can also be performed. This is because broad peaks of the emission spectra of R, G, and B can be corrected to sharp peaks by the color filter (colored layer).

Full color display can be achieved by forming a material exhibiting monochromatic light in combination with a color filter or a color conversion layer. For example, the color filter (colored layer) or the color conversion layer may be formed over the sealing substrate and then attached to the substrate.

Naturally, monochromatic light emitting display may be performed. For instance, an area color display device using the monochromatic light may be formed. A passive matrix display portion is suitable for the area color display device, and characters and symbols can be mainly displayed thereon.

Materials of the first electrode layer 870 and the second electrode layer 850 are required to be selected considering the work function. The first electrode layer 870 and the second electrode layer 850 can be either an anode or a cathode depending on the pixel structure. In the case where polarity of a driving thin film transistor is a p-channel type, the first electrode layer 870 may serve as an anode and the second electrode layer 850 may serve as a cathode as shown in FIG. 11A. In the case where polarity of the driving thin film transistor is an n-channel type, the first electrode layer 870 may serve as a cathode and the second electrode layer 850 may serve as an anode as shown in FIG. 11B. Materials that can be used for the first electrode layer 870 and the second electrode layer 850 is explained. It is preferable to use a material having a higher work function (specifically, a material having a work function of 4.5 eV or higher) for one of the first electrode layer 870 and the second electrode layer 850, which serves as an anode, and a material having a lower work function (specifically, a material having a work function of 3.5 eV or lower) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements shown in FIGS. 11A and 11B have a structure in which light is extracted through the first electrode layer 870, and thus, the second electrode layer 850 is not necessarily required to have a light-transmitting property. The second electrode layer 850 may be formed of a film mainly including an element selected from Ti, TiN, $TiS_xN_y$, Ni, W, $WSi_x$, $WN_x$, $WSi_xN_y$, NbN, Cr, Pt, Zn, Sn, In, Ta, Al, Cu, Au, Ag, Mg, Ca, Li, or Mo, or an alloy material or a compound material containing the element as its main component, or a laminated film thereof in a total thickness range of 100 nm to 800 nm.

The second electrode layer 850 can be formed by an evaporation method, a sputtering method, a CVD method, a printing method, a droplet discharge method, or the like.

In addition, when the second electrode layer 850 is formed by using a light-transmitting conductive material, like the material used for the first electrode layer 870, light is also extracted from the second electrode layer 850, and a dual emission mode can be obtained, in which light emitted from the light-emitting element is emitted to both of the first electrode layer 870 side and the second electrode layer 850 side.

Note that the light emitting element according to the present invention has many variations by changing types of the first electrode layer 870 and the second electrode layer 850.

FIG. 11B shows the case where the third layer 802, the second layer 803, and the first layer 804 are provided in this order from the first electrode layer 870 side in the electroluminescent layer 860.

As described above, in the light-emitting element of the present invention, layers interposed between the first electrode layer 870 and the second electrode layer 850 are formed from the electroluminescent layer 860 including a layer in which an organic compound and an inorganic compound are combined. The light emitting element is an organic-inorganic composite light-emitting element provided with layers (that is, the first layer 804 and the third layer 802) that provide functions called a high carrier-injecting property and a carrier-transporting property by mixing an organic compound and an inorganic compound, where the functions are not obtainable with either the organic compound or the inorganic compound. Further, the first layer 804 and the third layer 802 are required to be layers in which an organic compound and an inorganic compound are combined, particularly when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the methods also include a method of sputtering an inorganic compound while evaporating an organic compound by resistance heating to deposit the both at the same time. In addition, the electroluminescent layer may also be formed by a wet process.

Similarly, for the first electrode layer 870 and the second electrode layer 850, evaporation by resistance heating, EB evaporation, sputtering, a wet process, and the like can be used.

In FIG. 11C, an electrode layer having reflectivity is used for the first electrode layer 870, and an electrode layer having a light-transmitting property is used for the second electrode layer 850 in the structure of FIG. 11A. Light emitted from the light-emitting element is reflected by the first electrode layer 870, then, transmitted through the second electrode layer 850, and is emitted to outside. Similarly, in FIG. 11D, an electrode layer having reflectivity is used for the first electrode layer 870, and an electrode layer having a light-transmitting property is used for the second electrode layer 850 in the structure of FIG. 11B. Light emitted from the light-emitting element is reflected by the first electrode layer 870, then, transmitted through the second electrode layer 850, and is emitted to outside. This embodiment mode can be freely combined with Embodiment Modes 1 to 5.

Embodiment Mode 7

Next, explanation is made of a mode of mounting a driver circuit for driving on a display panel manufactured in accordance with Embodiment Modes 4 to 6.

First, a display device employing a COG method is explained with reference to FIG. 28A. A pixel portion 2701 for displaying information of characters, images, or the like is provided over a substrate 2700. A substrate provided with a plurality of driver circuits is divided into rectangles, and a driver circuit 2751 after division (also referred to as a driver IC) is mounted on the substrate 2700. FIG. 28A shows a mode of mounting a plurality of driver ICs 2751 and FPCs 2750 on the end of the driver ICs 2751. In addition, the size obtained after division may be made almost the same as the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 28B. Similarly to the case of a COG method, a single driver IC may be mounted on a single tape. In this case, a metal piece or the like for fixing the driver IC may be attached together in terms of intensity.

A plurality of driver ICs to be mounted on a display panel is preferably formed over a rectangular substrate having a side of 300 mm to 1000 mm or a side longer than 1000 mm for improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or that of adding a side length of the pixel portion to a side length of each driver circuit.

An advantage of the external dimension of the driver IC over an IC chip is the length of the long side. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased since there is no limitation on the shape of a substrate used as a mother body. This is a great advantage compared with the case of taking the IC chip out of a circular silicon wafer.

When a scan line driver circuit 3702 is integrated with a substrate as shown in FIG. 27B, a driver IC provided with a signal line driver circuit is mounted on a region outside a pixel portion 3701. The driver IC is a signal line driver circuit. In order to form a pixel portion corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by being irradiated with continuous wave laser light. Therefore, a continuous wave solid-state or gas laser is used for an oscillator for generating the laser light. There are few crystal defects when a continuous wave laser is used, and as a result, a transistor can be manufactured by using a polycrystalline semiconductor layer having a large grain size. In addition, high-speed driving is possible since mobility or response speed is favorable, and it is possible to further improve an operating frequency of an element than that of the conventional element. Therefore, high reliability can be obtained since there is little variation in characteristics. Note that the channel-length direction of the transistor and a moving direction of laser light over the substrate may be arranged in the same direction to further improve the operating frequency. This is because the highest mobility can be obtained when a channel length direction of a transistor and a moving direction of laser light over a substrate are almost parallel to each other (preferably, −30° to 30°) in a step of laser crystallization with a continuous wave laser. Note that the channel length direction corresponds to a current flowing direction, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to significantly narrow the laser light, and the shape of the laser light (beam spot) preferably has the same width as that of a short side of the driver ICs, approximately 1 mm to 3 mm. In addition, in order to secure an enough and effective energy density for an object to be irradiated, an irradiated region with the laser light preferably has a linear shape. The term "linear" used herein refers to not a line in a strict sense but a rectangle or an oblong with a large aspect ratio. For example, the linear shape refers to a rectangle or an oblong with an aspect ratio of 2 or more (preferably 10 to 10000). Thus, by making a width of the laser light shape (beam spot) the same length as a short side of the driver ICs, a method for manufacturing a display device, of which productivity is improved, can be provided.

As shown in FIGS. 28A and 28B, driver ICs may be mounted as both the scan line driver circuit and the signal line driver circuit. In this case, it is preferable to use the driver ICs having different specifications for the scan line driver circuit and the signal line driver circuit.

In the pixel portion, the signal line and the scan line intersect to form a matrix, and transistors are arranged in accordance with each intersection. One feature of the present invention is that a TFT having an amorphous semiconductor or a semiamorphous semiconductor as a channel portion is used as the transistor arranged in the pixel portion. The amorphous semiconductor is formed by a method such as a plasma CVD method or a sputtering method. The semiamorphous semiconductor can be formed by a plasma CVD method at a temperature of 300° C. or less. A film thickness necessary to form the transistor is formed in a short time even in the case of, for example, a non-alkaline glass substrate having an external size of 550 mm×650 mm. The feature of such a manufacturing technique is effective in manufacturing a large-sized display device. In addition, a semiamorphous TFT can obtain field effect mobility of 2 $cm^2$/V-sec to 10 $cm^2$/V-sec by forming a channel formation region using a SAS. When the present invention is applied, a minute wire can be stably formed without a defect such as a short circuit since a pattern can be formed into a desired shape with high controllability. Accordingly, a TFT having electric characteristics required to operate pixels sufficiently can be formed. Therefore, this TFT can be used as a switching element of the pixel or as an element included in the scan line driver circuit. Thus, a display panel in which system-on-panel is realized can be manufactured.

The scan line driver circuit can also be integrated with the substrate by using a TFT having a semiconductor layer formed of a SAS. In the case of using a TFT having a semiconductor layer formed of an AS, the driver ICs may be mounted as both the scan line driver circuit and the signal line driver circuit.

In that case, it is preferable to use the driver ICs having different specifications for the scan line driver circuit and the signal line driver circuit. For example, a transistor included in the scan line driver IC is required to withstand a voltage of approximately 30 V; however, a drive frequency is 100 kHz or less, and high-speed operation is not comparatively required. Therefore, it is preferable to set a channel length (L) of the transistor included in the scan line driver sufficiently long. On the other hand, a transistor of the signal line driver IC is required to withstand a voltage of only approximately 12 V; however, a drive frequency is around 65 MHz at 3 V, and high-speed operation is required. Therefore, it is preferable to set a channel length or the like of the transistor included in a driver on a micron rule. By using the present invention, a minute pattern can be formed with high controllability. Therefore, the present invention can handle such a micron rule sufficiently.

A method for mounting the driver IC is not particularly limited, and a COG method, a wire bonding method, or a TAB method can be employed.

When the thicknesses of the driver IC and the opposite substrate are set equal to each other, a distance therebetween is almost constant, which contributes to thinning of a display device as a whole. When both substrates are formed of the same material, thermal stress is not generated and characteristics of a circuit formed of a TFT are not damaged even when a temperature change is caused in the display device. Furthermore, the number of the driver ICs to be mounted on one pixel portion can be reduced by mounting longer driver ICs than IC chips as driver circuits as described in this embodiment mode.

As described above, a driver circuit can be incorporated in a display panel.

Embodiment Mode 8

Explanation is made of an example of a protective circuit included in a display device of the present invention.

As shown in FIGS. 31A to 31E, a protective circuit 2713 can be formed between an external circuit and an internal circuit. The protective circuit includes one or more elements selected from a TFT, a diode, a resistor element, a capacitor element, and the like. Explained below are several structures of the protective circuit and the operation thereof. First, the structure of an equivalent circuit of a protective circuit which is disposed between an external circuit and an internal circuit and which corresponds to one input terminal is explained with reference to FIGS. 31A to 31E. The protective circuit shown in FIG. 31A includes p-channel thin film transistors 7220 and 7230, capacitor elements 7210 and 7240, and a resistor element 7250. The resistor element 7250 has two terminals; one of which is supplied with an input voltage Vin (hereinafter referred to as Vin), and the other of which is supplied with a low-potential voltage VSS (hereinafter referred to as VSS).

Figure 31A:
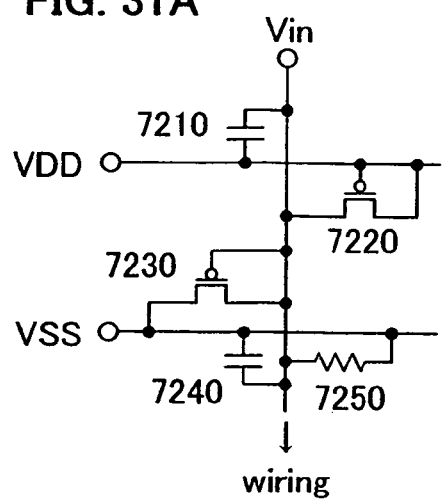
FIGS. 31A to 31E are diagrams showing protective circuits to which the present invention is applied.
Figure 31D:
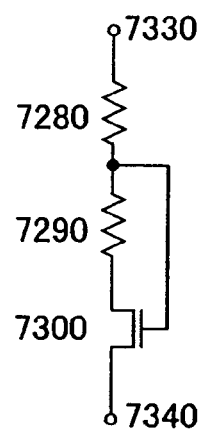
Figure 31B:
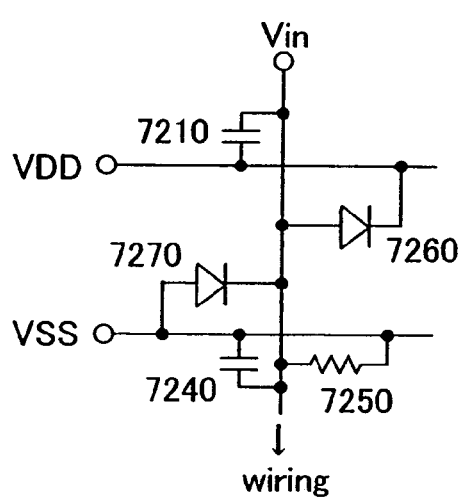
Figure 31E:
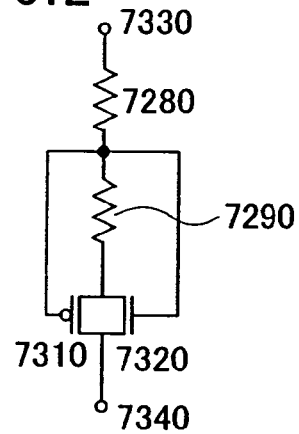
Figure 31C:
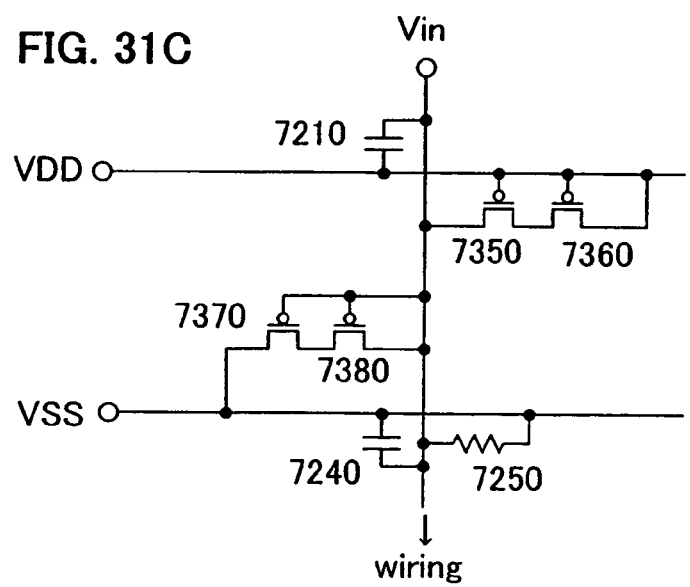

FIG. 31B is an equivalent circuit diagram showing a protective circuit in which the p-channel thin film transistors 7220 and 7230 are substituted by rectifying diodes 7260 and 7270. FIG. 31C is an equivalent circuit diagram showing a protective circuit in which the p-channel thin film transistors 7220 and 7230 are substituted by TFTs 7350, 7360, 7370, and 7380. In addition, as a protective circuit having a different structure from the above structures, FIG. 31D shows a protective circuit which includes resistors 7280 and 7290 and an n-channel thin film transistor 7300. A protective circuit shown in FIG. 31E includes resistors 7280 and 7290, a p-channel thin film transistor 7310, and an n-channel thin film transistor 7320. By providing the protective circuit, a sudden surge in potential can be prevented, and element breakdown or damage can be prevented, which improves reliability. Note that an element having the aforementioned protective circuit is preferably formed using an amorphous semiconductor that can withstand high voltage. This embodiment mode can be freely combined with the aforementioned embodiment mode.

This embodiment mode can be combined with any one of Embodiment Modes 1 to 7.

Embodiment Mode 9

A structure of a pixel of a display panel shown in this embodiment mode is explained with reference to equivalent circuit diagrams shown in FIGS. 10A to 10F. This embodiment mode describes an example in which a light emitting element (EL element) is used as a display element of the pixel.

Figure 10A:
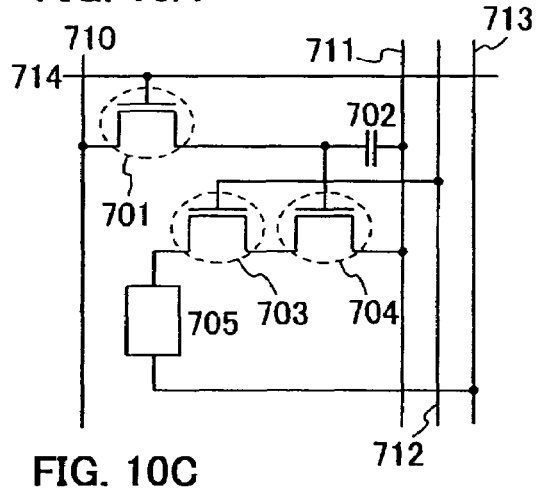
FIGS. 10A to 10F are circuit diagrams explaining structures of pixels applicable to an EL display panel of the present invention.

In a pixel shown in FIG. 10A, a signal line 710 and power supply lines 711, 712, and 713 are arranged in a column direction, and a scan line 714 is arranged in a row direction. The pixel also includes a TFT 701 that is a switching TFT, a TFT 703 that is a driver TFT, a TFT 704 that is a current control TFT, a capacitor element 702, and a light emitting element 705.

Figure 10B:
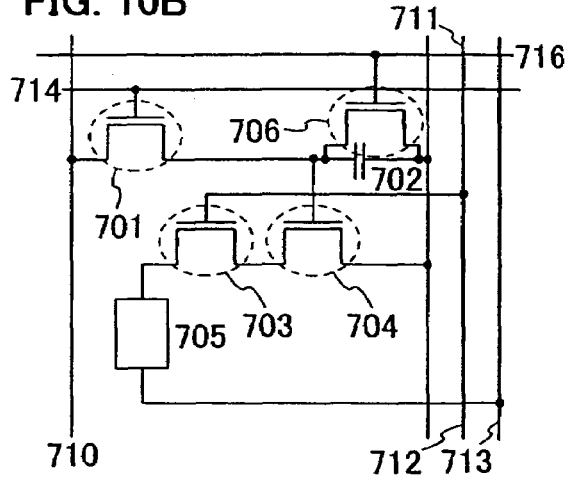
Figure 10C:
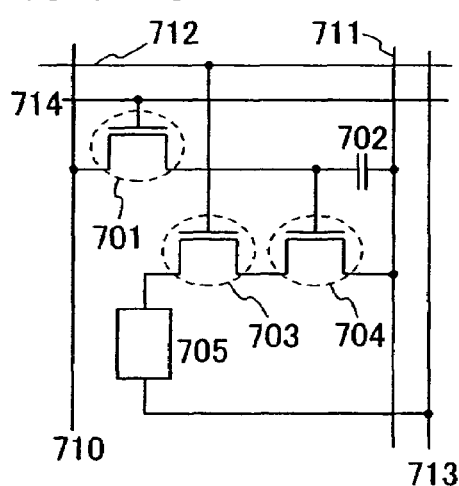
Figure 10D:
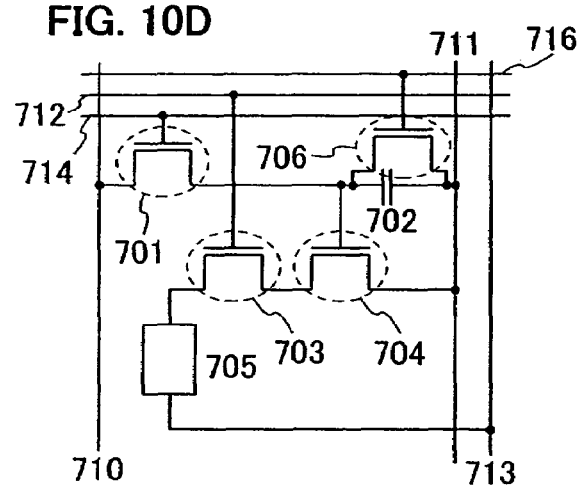

A pixel shown in FIG. 10C has the same structure as that shown in FIG. 10A, except that a gate electrode of the TFT 703 is connected to the power supply line 712 arranged in a row direction. In other words, both pixels shown in FIGS. 10A and 10C show the same equivalent circuit diagrams. However, power supply lines are formed of conductive layers in different layers between the cases where the power supply line 712 is arranged in a column direction (FIG. 10A) and where the power supply line 712 is arranged in a row direction (FIG. 10C). Here, a wire to which the gate electrode of the TFT 703 is connected is focused and the figures are separately shown in FIGS. 10A and 10C to show that the wires are formed in different layers.

In the pixels shown in FIGS. 10A and 10C, the TFTs 703 and 704 are connected to each other in series, and a channel length $L_3$ and a channel width $W_3$ of the TFT 703 and a channel length $L_4$ and a channel width $W_4$ of the TFT 704 are preferably set to satisfy $L_3/W_3$: $L_4/W_4$=5 to 6000:1. For example, when $L_3$, $W_3$, $L_4$, and $W_4$ are respectively 500 μm, 3 μm, 3 μm, and 100 μm, the ratio 6000:1 can be satisfied.

Note that the TFT 703 is operated in a saturation region and functions to control the amount of current flowing into the light emitting element 705, whereas the TFT 704 is operated in a linear region and functions to control current supply to the light emitting element 705. The TFTs 703 and 704 preferably have the same conductivity in view of the manufacturing step. For the TFT 703, a depletion mode TFT as well as an enhancement mode TFT may be used. In the present invention having the above structure, slight variations in $V_{GS}$ of the TFT 704 does not affect the amount of current flowing into the light emitting element 705, since the TFT 704 is operated in a linear region. In other words, the amount of current flowing into the light emitting element 705 is determined by the TFT 703 operated in the saturation region. The present invention having the above structure can provide a display device in which image quality is improved by reducing variations in luminance of the light emitting element due to the variation in the TFT characteristics.

The TFT 701 of pixels shown in FIGS. 10A to 10D controls a video signal input to the pixel. When the TFT 701 is turned on and a video signal is input to the pixel, the video signal is held by the capacitor element 702. Although FIGS. 10A and 10C show structures provided with the capacitor element 702, the present invention is not limited thereto. When a gate capacitance or the like can serve as a capacitor holding a video signal, the capacitor element 702 is not necessarily provided explicitly.

The light emitting element 705 has a structure in which an electroluminescent layer is interposed between a pair of electrodes. A pixel electrode and an opposite electrode (an anode and a cathode) have a potential difference therebetween so that a forward bias voltage is applied. The electroluminescent layer is formed of a wide range of materials such as an organic material and an inorganic material. The luminescence in the electroluminescent layer includes light emission that is generated in returning from a singlet excited state to a ground state (fluorescence) and light emission that is generated in returning from a triplet exited state to a ground state (phosphorescence).

A pixel shown in FIG. 10B has the same structure as that shown in FIG. 10A, except that a TFT 706 and a scan line 716 are added. Similarly, a pixel shown in FIG. 10D has the same structure as that shown in FIG. 10C, except that a TFT 706 and a scan line 716 are added.

The TFT 706 is controlled to be turned on or off by the newly arranged scan line 716. When the TFT 706 is turned on, charges held at the capacitor element 702 are discharged, thereby turning off the TFT 704. In other words, supply of a current to the light emitting element 705 can be forcibly stopped by providing the TFT 706. Therefore, by employing the structures shown in FIGS. 10B and 10D, a lighting period can start simultaneously with or shortly after a start of a writing period without waiting until signals are written into all the pixels; thus, a duty ratio can be improved.

Figure 10E:
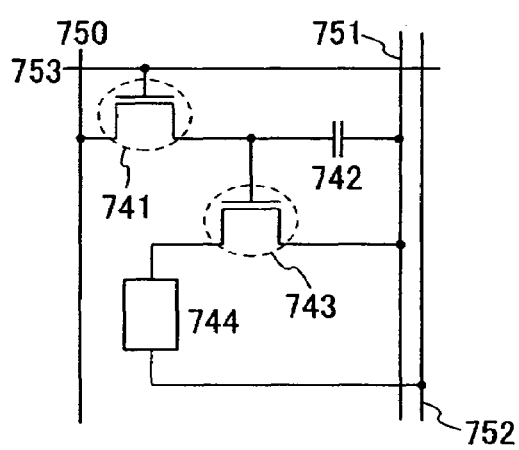
Figure 10F:
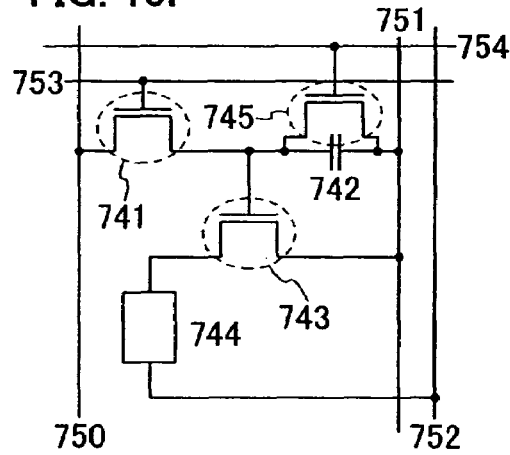

In a pixel shown in FIG. 10E, a signal line 750 and power supply lines 751 and 752 are arranged in a column direction, and a scan line 753 is arranged in a row direction. The pixel further includes a TFT 741 that is a switching TFT, a TFT 743 that is a driver TFT, a capacitor element 742, and a light emitting element 744. A pixel shown in FIG. 10F has the same structure as that shown in FIG. 10E, except that a TFT 745 and a scan line 754 are added. The structure of FIG. 10F can also improve a duty ratio by providing the TFT 745.

As described above, in accordance with the present invention, a wire can be precisely and stably formed without a formation defect. Therefore, a TFT can be provided with high electric characteristics and reliability, and the present invention can be satisfactorily used for an applied technique for improving display capability of a pixel in accordance with the intended use.

This embodiment mode can be combined with any one of Embodiment Modes 1 to 4 and 6 to 8.

Embodiment Mode 10

Figure 22:
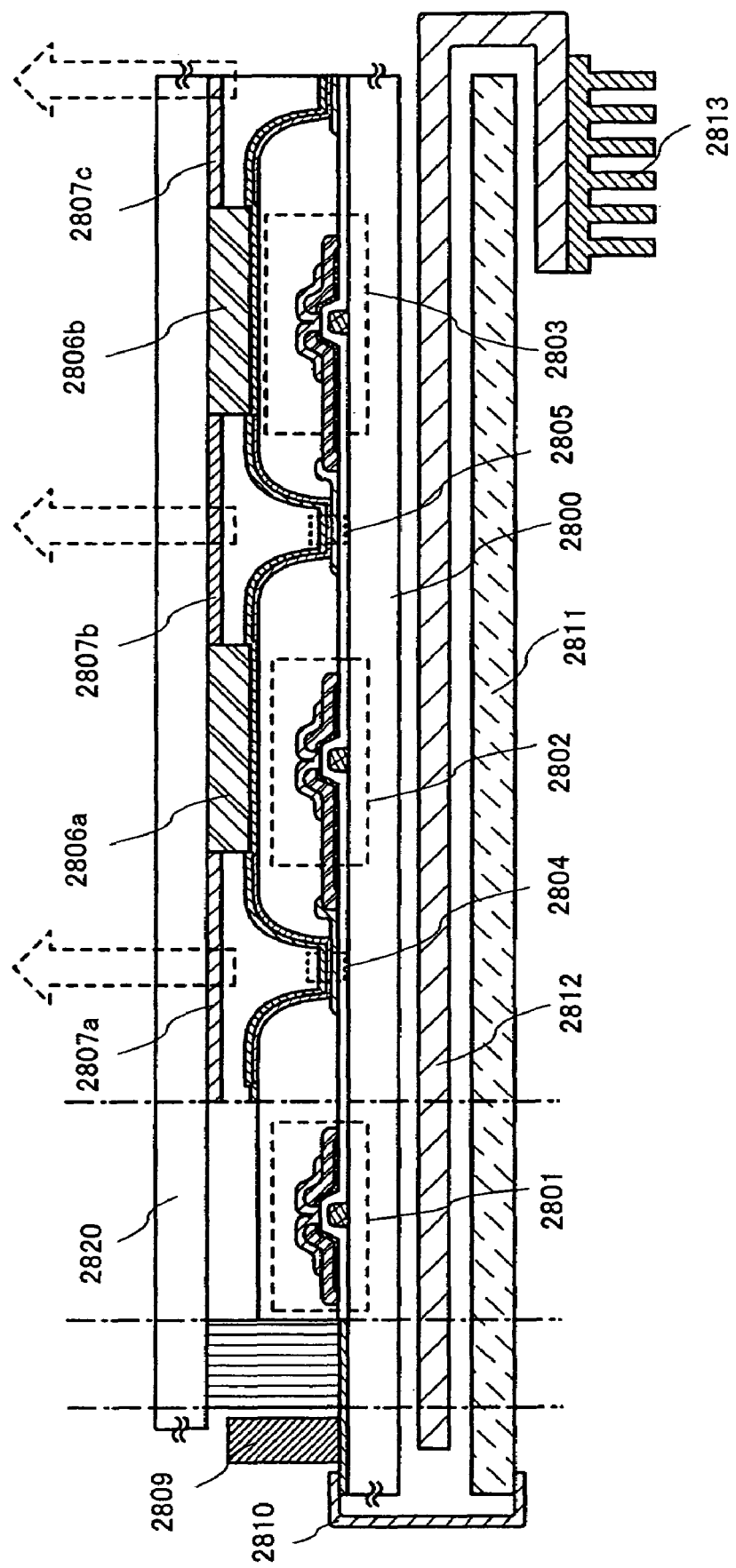
FIG. 22 is a cross-sectional view explaining a structure example of an EL display module of the present invention.

This embodiment mode is explained with reference to FIG. 22. FIG. 22 shows an example of forming an EL display module using a TFT substrate 2800 manufactured in accordance with the present invention. In FIG. 22, a pixel portion including pixels is formed over the TFT substrate 2800.

In FIG. 22, a TFT which has the same structure as that formed in the pixel, or a protective circuit portion 2801 operated in the same manner as a diode by connecting a gate to either a source or a drain of the TFT is provided between a driver circuit and the pixel and outside the pixel portion. A driver IC formed of a single crystalline semiconductor, a stick driver IC formed of a polycrystalline semiconductor film over a glass substrate, a driver circuit formed of a SAS, or the like is applied to a driver circuit 2809.

The TFT substrate 2800 is fixed to a sealing substrate 2820 with spacers 2806*a* and 2806*b* formed by a droplet discharge method interposed therebetween. The spacers are preferably provided to keep a distance between two substrates constant even when the substrate is thin or an area of the pixel portion is enlarged. A space between the TFT substrate 2800 and the sealing substrate 2820 over light emitting elements 2804 and 2805 connected to TFTs 2802 and 2803 respectively may be filled with a resin material which transmits at least light in the visible region and the resin material may be solidified, or may be filled with anhydrous nitrogen or an inert gas.

FIG. 22 shows the case where the light emitting elements 2804 and 2805 and a light emitting element 2815 have a structure of top emission type, which emit light in the direction of arrows shown in the drawing. Multicolor display can be performed by making the pixels to emit light of different colors of red, green, and blue. At this time, color purity of the light emitted outside can be improved by forming colored layers 2807*a* to 2807*c* corresponding to respective colors on the sealing substrate 2820 side. Moreover, pixels which emit white light may be used and may be combined with the colored layers 2807*a* to 2807*c*.

The driver circuit 2809 which is an external circuit is connected to a scan line or a signal line connection terminal which is provided at one end of the TFT substrate 2800 with a wire board 2810. In addition, a heat pipe 2813 and a heat sink 2812 may be provided in contact with or adjacent to the TFT substrate 2800 to increase a heat dissipation effect.

Note that FIG. 22 shows the top emission EL module; however, a bottom emission structure may be employed by changing the structure of the light emitting element or the disposition of the external circuit board. Naturally, a dual emission structure in which light is emitted from both sides of the top and bottom surfaces may be used. In the case of the top emission structure, the insulating layer serving as a partition wall may be colored and used as a black matrix. This partition wall can be formed by a droplet discharge method and it may be formed by mixing a black resin of a pigment material, carbon black, or the like into a resin material such as polyimide. A lamination thereof may alternatively be used.

In addition, reflected light of light entering from outside may be blocked by using a retardation film or a polarizing plate in the EL display module. In the case of a top emission display device, an insulating layer serving as a partition wall may be colored and used as a black matrix. This partition wall can be formed by a droplet discharge method or the like. Carbon black or the like may be mixed into a black resin of a pigment material or a resin material such as polyimide, and a lamination thereof may also be used. By a droplet discharge method, different materials may be discharged to the same region plural times to form the partition wall. A quarter wave plate and a half wave plate may be used as the retardation films and may be designed to be able to control light. As the structure, the light emitting element, the sealing substrate (sealant), the retardation film (quarter wave plate), the retardation film (half wave plate), and the polarizing plate are sequentially laminated over a TFT element substrate, in which light emitted from the light emitting element is transmitted therethrough and emitted outside from the polarizing plate side. The retardation films or polarizing plate may be provided on a side where light is emitted or may be provided on both sides in the case of a dual emission display device in which light is emitted from the both surfaces. In addition, an anti-reflection film may be provided on the outer side of the polarizing plate. Accordingly, a higher-definition and more accurate image can be displayed.

As for the TFT substrate 2800, a sealing structure may be formed by attaching a resin film to the side where the pixel portion is formed with the use of a sealant or an adhesive resin. In this embodiment mode, glass sealing using a glass substrate is described; however, various sealing methods such as resin sealing using a resin, plastic sealing using plastic, and film sealing using a film can be used. A gas barrier film which prevents moisture from penetrating the resin film is preferably provided over the surface of the resin film. By employing a film sealing structure, further reduction in thickness and weight can be achieved.

In this embodiment mode, a manufacturing process can be simplified as described above. By forming various components (parts) directly over a substrate using a droplet discharge method, a display panel can be easily manufactured even using a glass substrate of the fifth generation or later having a side of 1000 mm or more.

According to the present invention, a conductive layer included in a display device (the source electrode layer and the drain electrode layer of a TFT in FIG. 22) can be manufactured in a self-aligned manner. Thus, a process is simplified, and cost reduction can be achieved. In addition, a plating method is used; therefore, the thickness or size of a wire layer can be controlled relatively easily, and a wire layer can be manufactured to suit application. Therefore, a high-performance and high-reliability display device which can operate at high speed can be manufactured.

This embodiment mode can be combined with any one of Embodiment Modes 1 to 3 and 6 to 9.

Embodiment Mode 11

This embodiment mode is explained with reference to FIGS. 23A and 23B. FIGS. 23A and 23B show examples of forming a liquid crystal display module by using a TFT substrate 2600 manufactured in accordance with the present invention.

FIG. 23A shows an example of a liquid crystal display module, in which the TFT substrate 2600 and an opposite substrate 2601 are fixed to each other with a sealant 2602, and a pixel portion 2603 and a liquid crystal layer 2604 are provided between the substrates to form a display region. A colored layer 2605 is necessary to perform color display. In the case of the RGB system, colored layers corresponding to respective colors of red, green, and blue are provided for respective pixels. The outer sides of the TFT substrate 2600 and the opposite substrate 2601 are provided with polarizing plates 2606 and 2607, and a lens film 2613. A light source includes a cold-cathode tube 2610 and a reflecting plate 2611. A circuit board 2612 is connected to the TFT substrate 2600 by a flexible wiring board 2609. External circuits such as a control circuit and a power supply circuit are incorporated in the circuit board 2612. The liquid crystal display module can employ a TN (Twisted Nematic) mode, an IPS (In-Plane-Switching) mode, an MVA (Multi-domain Vertical Alignment) mode, an ASM (Axially Symmetric aligned Microcell) mode, an OCB mode, or the like.

Performance of the display device manufactured according to the present invention can be improved by using the OCB mode among them that can respond at high speed. FIG. 23B shows an example of applying the OCB mode to the liquid crystal display module of FIG. 23A, so that this liquid crystal display module becomes an FS-LCD (Field Sequential-LCD). The FS-LCD performs red, green, and blue light emissions in one frame period. Color display can be performed by composing an image by a time division method. Also, emission of respective colors is performed using a light emitting diode, a cold-cathode tube, or the like; hence, a color filter is not required. Therefore, since the arrangement of color filters of three primary colors is not required, nine times as many pixels as those in the case of using the color filters can be provided in the same area. On the other hand, light emission of three colors is performed in one frame period; therefore, high speed response of liquid crystal is required. When an FS system or the OCB mode is applied to the display device of the present invention, a display device or a liquid crystal television device having higher performance and higher definition can be completed.

A liquid crystal layer of the OCB mode has, what is called, a π cell structure. In the π cell structure, liquid crystal molecules are oriented such that pretilt angles of the molecules are symmetrical with respect to the center plane between the active matrix substrate and the opposite substrate. The orientation in the π cell structure is a splay orientation when a voltage is not applied between the substrates, and shifts into a bend orientation when the voltage is applied. Further application of the voltage makes the liquid crystal molecules in the bend orientation orientated perpendicular to the substrates, which allows light to pass therethrough. Note that approximately ten times as high response speed as a conventional TN mode can be achieved by using the OCB mode.

Further, as a mode corresponding to the FS system, an HV-FLC, an SS-FLC, or the like using a ferroelectric liquid crystal (FLC) that can be operated at high speed can also be used. A nematic liquid crystal that has relatively low viscosity is used for the OCB mode. A smectic liquid crystal is used for the HV-FLC or the SS-FLC. As a liquid crystal material, an FLC, a nematic liquid crystal, a smectic liquid crystal, or the like can be used.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch or a dot pitch of a pixel portion of a TN mode liquid crystal display module is 30 μm or less.

The liquid crystal display module of FIG. 23B is a transmissive type, in which a red light source 2910a, a green light source 2910b, and a blue light source 2910c are provided as light sources. A control portion 2912 is provided in the liquid crystal display module to separately control the red light source 2910a, the green light source 2910b, and the blue light source 2910c to be turned on or off. The light emission of respective colors is controlled by the control portion 2912, and light enters the liquid crystal to compose an image using the time division, thereby performing color display.

In this embodiment mode, a manufacturing process can be simplified as described above. By forming various components (parts) directly over a substrate using a droplet discharge method, a display panel can be easily manufactured even when using a glass substrate of the fifth generation or later having a side of 1000 mm or more.

According to the present invention, a conductive layer included in a display device can be manufactured through the simplified process. Therefore, cost reduction can be achieved. In addition, a plating method is used; therefore, the thickness or size of a wire layer can be controlled relatively easily, and a wire layer can be manufactured to suit application. Therefore, a high-performance and high-reliability display device which can operate at high speed can be manufactured.

This embodiment mode can be combined with any one of Embodiment Modes 1 to 3, 5, 7, and 8.

Embodiment Mode 12

Figure 24:
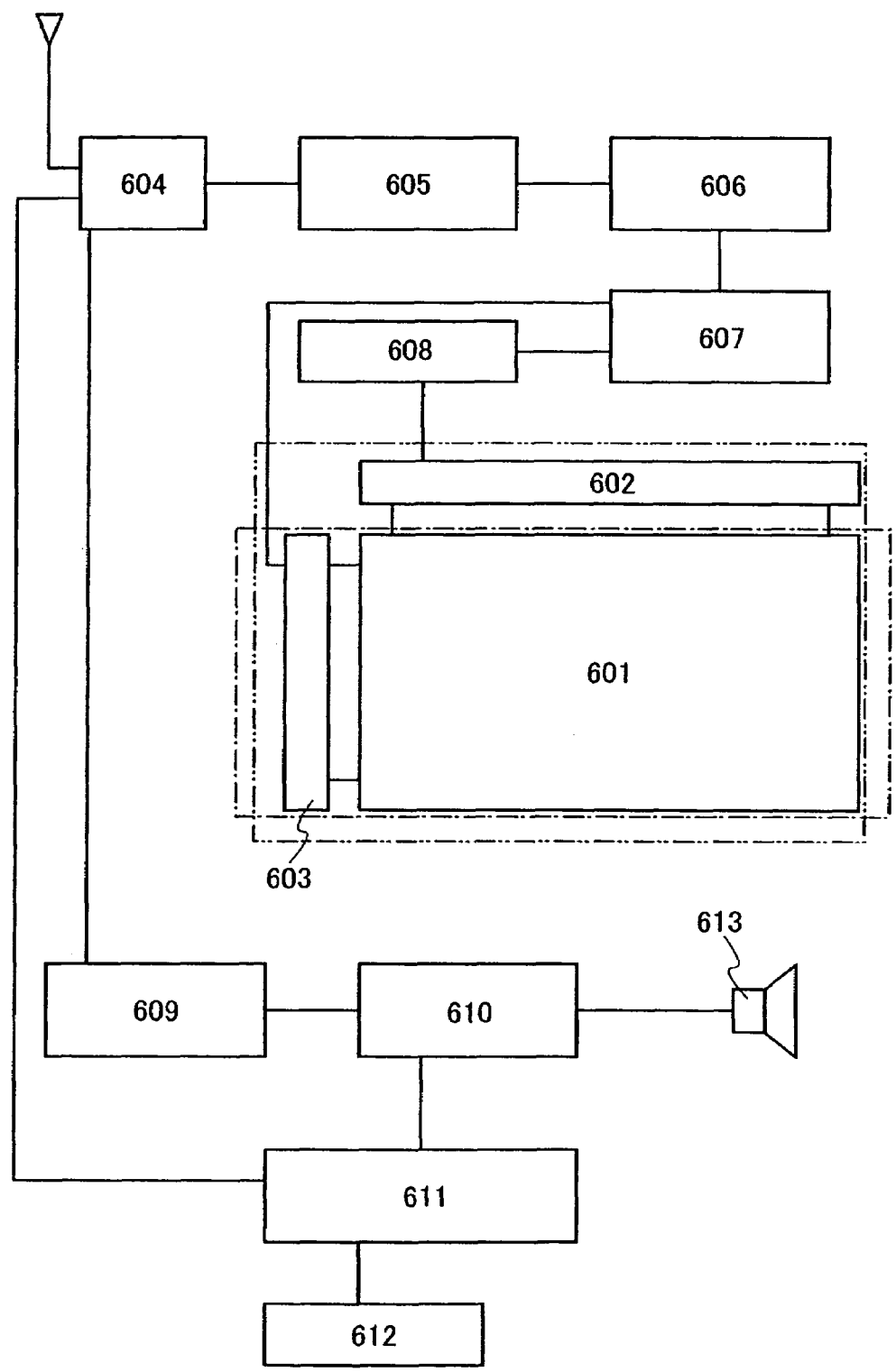
FIG. 24 is a block diagram showing a main structure of an electronic device to which the present invention is applied.

A television device can be completed by using the display device formed in accordance with the present invention. FIG. 24 is a block diagram showing a main structure of the television device. As for the display panel, there are a case in which only a pixel portion 601 is formed as shown in FIG. 27A and a scan line driver circuit 603 and a signal line driver circuit 602 are mounted by a TAB method as shown in FIG. 28B; a case in which the scan line driver circuit 603 and the signal line driver circuit 602 are mounted by a COG method as shown in FIG. 28A; a case in which a TFT is formed as shown in FIG. 27B, the pixel portion 601 and the scan line driver circuit 603 are formed over a substrate, and the signal line driver circuit 602 is separately mounted as a driver IC; a case in which the pixel portion 601, the signal line driver circuit 602, and the scan line driver circuit 603 are integrated with a substrate as shown in FIG. 27C; and the like. The display panel may have any of the structures.

As another external circuit, a video signal amplifier circuit 605 which amplifies a video signal among signals received by a tuner 604, a video signal processing circuit 606 which converts the signals output from the video signal amplifier circuit 605 into chrominance signals corresponding to respective colors of red, green, and blue, a control circuit 607 which converts the video signal into an input specification of the driver IC, and the like are provided on an input side of the video signal. The control circuit 607 outputs signals to both a scan line side and a signal line side. In the case of digital driving, a signal dividing circuit 608 may be provided on the signal line side and an input digital signal may be divided into m pieces and supplied.

An audio signal among signals received by the tuner 604 is sent to an audio signal amplifier circuit 609 and is supplied to a speaker 613 through an audio signal processing circuit 610. A control circuit 611 receives control information of a receiving station (reception frequency) or sound volume from an input portion 612 and transmits signals to the tuner 604 and the audio signal processing circuit 610.

A television device can be completed by incorporating such a liquid crystal display module or an EL display module into a chassis as shown in FIGS. 25A and 25B. When an EL display module as shown in FIG. 22 is used, an EL television device can be obtained. When a liquid crystal display module as shown in FIG. 23A or FIG. 23B is used, a liquid crystal television device can be obtained. A main screen 2003 is formed by using the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received by a receiver 2005. When the display device is connected to a communication network by wired or wireless connections via a modem 2004, one-way (from a sender to a receiver) or two-way (between a sender and a receiver or between receivers) information communication can be performed. The television device can be operated by using a switch built in the chassis 2001 or a remote control unit 2006. A display portion 2007 for displaying output information may also be provided in the remote control unit 2006.

Further, the television device may also include a sub screen 2008 formed using a second display panel so as to display channels, volume, or the like, in addition to the main screen 2003. In this structure, the main screen 2003 may be formed using an EL display panel having a wide viewing angle, and the sub screen 2008 may be formed using a liquid crystal display panel capable of displaying images with lower power consumption. In order to reduce the power consumption preferentially, the main screen 2003 may be formed using a liquid crystal display panel, and the sub screen may be formed using an EL display panel, which can be switched on and off. In accordance with the present invention, a high-reliability display device can be formed even when a large-sized substrate is used and a large number of TFTs or electronic components are used.

FIG. 25B shows a television device having a large-sized display portion, for example, a 20-inch to 80-inch display portion. The television device includes a chassis 2010, a display portion 2011, a remote control device 2012 that is an operation portion, a speaker portion 2013, and the like. The present invention is applied to manufacturing of the display portion 2011. Since the television device in FIG. 25B is a wall-hanging type, it does not require a large installation space.

Naturally, the invention is not limited to the television device, and can be applied to various use applications as a large-area display medium such as an information display board at a train station, an airport, or the like, or an advertisement display board on the street, as well as a monitor of a personal computer.

Embodiment Mode 13

By applying the invention, various kinds of display devices can be manufactured. In other words, the invention can be applied to various kinds of electronic devices in which such display devices are incorporated in display portions.

Examples of such electronic devices can be as follows: a camera such as a video camera or a digital camera, a projector, a head-mounted display (a goggle type display), a car navigation system, a car stereo, a personal computer, a game machine, a portable information terminal (such as a mobile computer, a cellular phone, or an electronic book), an image reproducing device provided with a recording medium reading portion (specifically, a device which can reproduce a recording medium such as a digital versatile disc (DVD) and includes a display portion capable of displaying images thereof), and the like. Specific examples thereof are shown in FIGS. 26A to 26D.

Figure 26A:
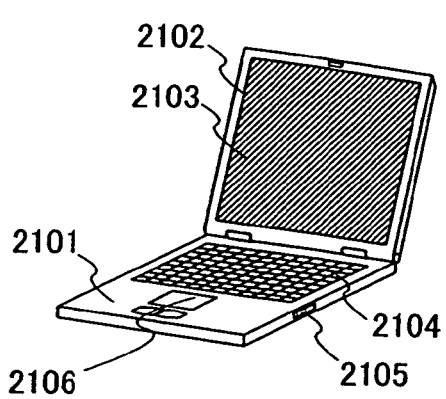
FIGS. 26A to 26D are diagrams showing electronic devices to which the present invention is applied.

FIG. 26A shows a personal computer, which includes a main body 2101, a chassis 2102, a display portion 2103, a keyboard 2104, an external connection port 2105, a pointing mouse 2106, or the like. The invention can be applied to manufacturing of the display portion 2103. By using the present invention, the thickness or size of a wire layer can be controlled relatively easily, and a wire layer can be manufactured to suit application. Further, improvement in performance and reliability can be achieved.

Figure 26B:
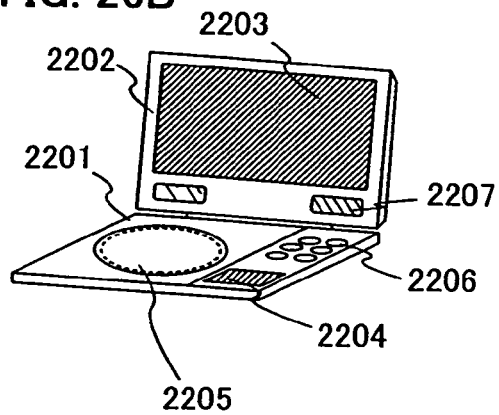

FIG. 26B shows an image reproducing device (specifically, a DVD reproducing device) including a recording medium reading portion, which includes a main body 2201, a chassis 2202, a display portion A 2203, a display portion B 2204, a recording medium (a DVD or the like) reading portion 2205, an operation key 2206, a speaker portion 2207, or the like. The display portion A 2203 mainly displays image information, and the display portion B 2204 mainly displays character information. The invention can be applied to manufacturing of the display portion A 2203 and the display portion B 2204. By using the present invention, the thickness or size of a wire layer can be controlled relatively easily, and a wire layer can be manufactured to suit application. Further, improvement in performance and reliability can be achieved.

Figure 26C:
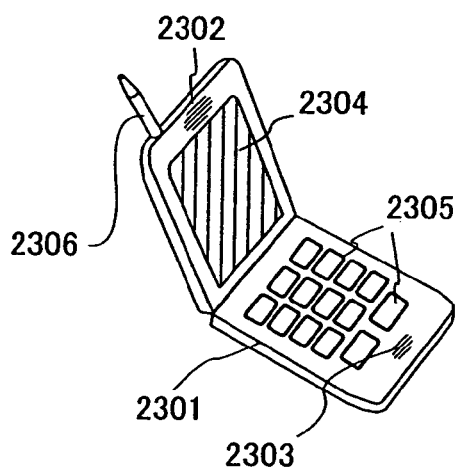

FIG. 26C shows a cellular phone, which includes a main body 2301, an audio output portion 2302, an audio input portion 2303, a display portion 2304, an operation switch 2305, an antenna 2306, or the like. By applying the display device manufactured according to the present invention to the display portion 2304, the thickness or size of a wire layer can be controlled relatively easily, and a wire layer can be manufactured to suit application. Further, improvement in performance and reliability can be achieved.

Figure 26D:
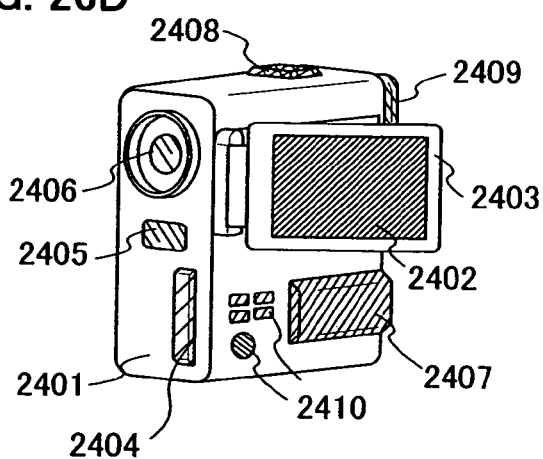

FIG. 26D shows a video camera, which includes a main body 2401, a display portion 2402, a chassis 2403, an external connection port 2404, a remote control receiving portion 2405, an image receiving portion 2406, a battery 2407, an audio input portion 2408, an eye piece portion 2409, operation keys 2410, or the like. The present invention can be applied to the display portion 2402. By applying the display device manufactured according to the present invention to the display portion 2402, the thickness or size of a wire layer can be controlled relatively easily, and a wire layer can be manufactured to suit application. Further, improvement in performance and reliability can be achieved. This embodiment mode can be freely combined with any of the above-described embodiment modes.

Embodiment Mode 14

In accordance with the present invention, a semiconductor device functioning as a processor chip (also referred to as a wireless chip, a wireless processor, a wireless memory, or a wireless tag) can be formed. The application of the semiconductor device of the invention is wide-ranging. For example, the semiconductor device of the invention can be used when provided in paper money, coins, securities, certificates, bearer bonds, packing containers, books, recording media, personal belongings, vehicles, food, clothing, health products, commodities, medicine, electronic devices, and the like.

Figure 30A:
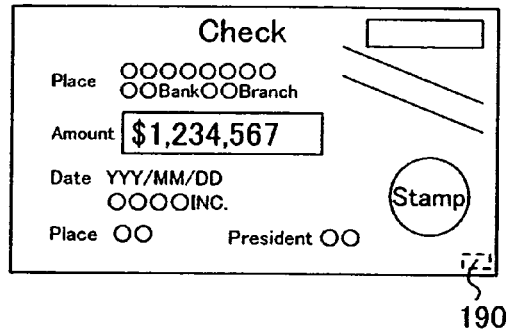
FIGS. 30A to 30G are diagrams showing semiconductor devices to which the present invention is applied.
Figure 30B:
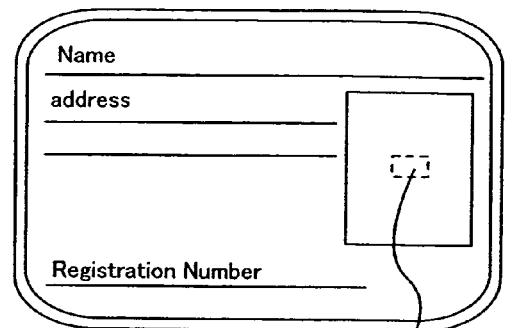
Figure 30C:
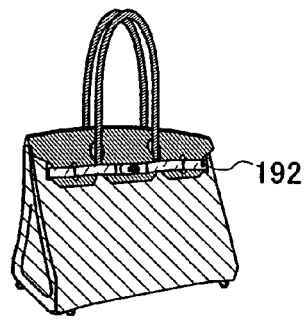
Figure 30D:
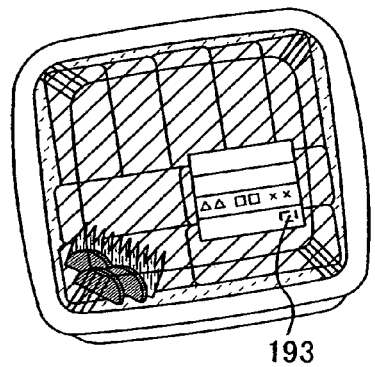
Figure 30E:
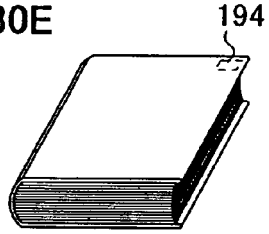
Figure 30F:
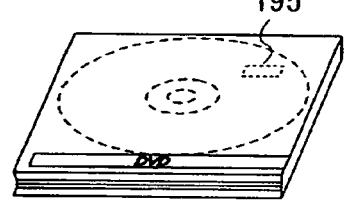
Figure 30G:
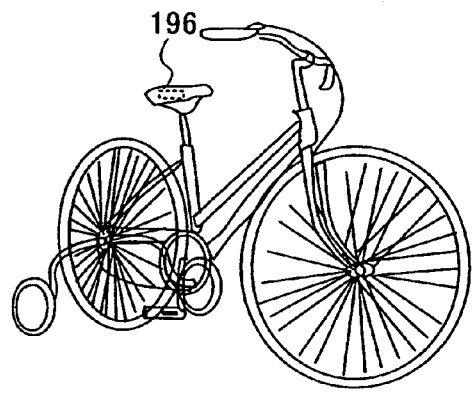

Paper money and coins are money distributed to the market and include ones valid in a certain area (cash voucher), memorial coins, and the like. Securities include checks, certificates, promissory notes, and the like, and can be provided with a processor chip 190 (see FIG. 30A). Certificates include driver's licenses, certificates of residence, and the like, and can be provided with a processor chip 191 (see FIG. 30B). Personal belongings include bags, glasses, and the like, and can be provided with a processor chip 197 (see FIG. 30C). Bearer bonds include stamps, rice coupons, various gift certificates, and the like. Packing containers include wrapping paper for food containers and the like, plastic bottles, and the like, and can be provided with a processor chip 193 (see FIG. 30D). Books include hardbacks, paperbacks, and the like, and can be provided with a processor chip 194 (see FIG. 30E). Recording media include DVD software, video tapes, and the like, and can be provided with a processor chip 195 (see FIG. 30F). Vehicles include wheeled vehicles such as bicycles, ships, and the like, and can be provided with a processor chip 196 (see FIG. 30G). Food includes food articles, drink, and the like. Clothing includes clothes, footwear, and the like. Health products include medical instruments, health instruments, and the like. Commodities include furniture, lighting equipment, and the like. Medicine includes medical products, pesticides, and the like. Electronic devices include liquid crystal display devices, EL display devices, television devices (TV sets and thin TV sets), cellular phones, and the like.

Forgery can be prevented by providing a processor chip in paper money, coins, securities, certificates, bearer bonds, or the like. The efficiency of an inspection system or a system used in a rental shop can be improved by providing a processor chip in packing containers, books, recording media, personal belonging, food, commodities, electronic devices, or the like. By providing a processor chip in vehicles, health products, medicine, or the like, forgery or theft can be prevented; further, medicine can be prevented from being taken mistakenly. The processor chip is provided in the foregoing article by being attached to the surface or being embedded therein. For example, in the case of a book, the processor chip may be embedded in a piece of paper; in the case of a package made from an organic resin, the processor chip may be embedded in the organic resin.

The system can have high functionality by applying the processor chip formed in accordance with the present invention to a management system or a distribution system of articles. For example, information that is recorded in a processor chip provided in a tag is read by a reader/writer provided beside a conveyor belt, information about a distribution process or a delivery destination is then read out, and inspection of merchandise or distribution of goods can be easily performed.

Figure 29:
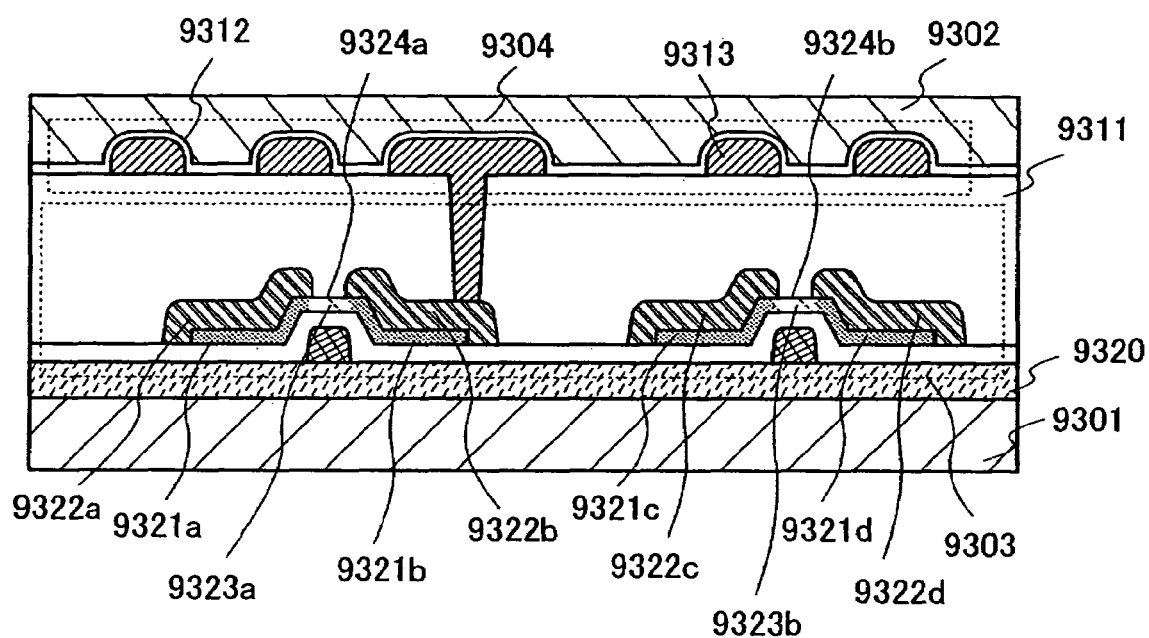
FIG. 29 is a diagram showing a semiconductor device to which the present invention is applied.

A structure of a processor chip which can be formed in accordance with the present invention is explained with reference to FIG. 29. The processor chip is formed using a thin film integrated circuit 9303 and an antenna 9304 connected to the thin film integrated circuit 9303. The thin film integrated circuit 9303 and the antenna 9304 are interposed between cover materials 9301 and 9302. The thin film integrated circuit 9303 may be attached to the cover material 9301 using an adhesive. In FIG. 29, one side of the thin film integrated circuit 9303 is attached to the cover material 9301 with an adhesive 9320 interposed therebetween.

The thin film integrated circuit 9303 is peeled through a peeling step and provided on the cover material. A thin film transistor in this embodiment mode is an inversed staggered thin film transistor. In the thin film transistor of this embodiment mode, an oxide semiconductor having a photocatalytic function is used for a semiconductor layer. Thus, the semiconductor layer functions also as a photocatalyst material, functions as a catalyst for a plating catalyst material, and adsorbs the plating catalyst material. In this embodiment mode, zinc oxide (ZnO) is used as the oxide semiconductor. While immersing a semiconductor layer 9324*a* and a semiconductor layer 9324*b* in a solution containing a plating catalyst material, light irradiation is performed from the substrate side. The semiconductor layer 9324*a* and the semiconductor layer 9324*b* are activated by backside light exposure from the substrate side in a light-exposed region 9321*a*, a light-exposed region 9321*b*, a light-exposed region 9321*c*, and a light-exposed region 9321*d* to deposit the plating catalyst material on their surfaces. On the other hand, a light-unexposed region 9323*a* and a light-unexposed region 9323*b* of the semiconductor layer 9324*a* and the semiconductor layer 9324*b* over a gate electrode layer where light is blocked by the gate electrode layer are not activated. Therefore, the plating catalyst material is not deposited on the surfaces. The semiconductor layer 9324*a* and the semiconductor layer 9324*b* where the plating catalyst material is selectively formed are immersed in a plating solution containing a metal material to form a source electrode layer or drain electrode layer 9322*a*, a source electrode layer or drain electrode layer 9322*b*, a source electrode layer or drain electrode layer 9322*c*, and a source electrode layer or drain electrode layer 9322d in a self-aligned manner. A semiconductor element used in the thin film integrated circuit 9303 is not limited to the above-described element. For example, a memory element, a diode, a photoelectric conversion element, a resistor element, a coil, a capacitor element, an inductor, or the like can be used as well as the TFT.

As shown in FIG. 29, an interlayer insulating film 9311 is formed over the TFT of the thin film integrated circuit 9303, and an antenna 9304 connected to the TFT is formed with the interlayer insulating layer 9311 interposed therebetween. Further, a barrier film 9312 made of a silicon nitride film or the like is formed over the interlayer insulating film 9311 and the antenna 9304.

The antenna 9304 is formed by discharging a droplet including a conductor such as gold, silver, or copper by a droplet discharge method, and drying and baking the droplet. By forming the antenna by a droplet discharge method, the number of steps can be reduced, and accordingly, cost can also be reduced.

For the cover materials 9301 and 9302, it is preferable to use a film (made of polypropylene, polyester, vinyl, polyvinyl fluoride, vinyl chloride, or the like), paper made of a fibrous material, a laminated film of a base material film (polyester, polyamide, an inorganic evaporation film, a variety of paper, or the like) and an adhesive synthetic resin film (an acrylic-based synthetic resin, an epoxy-based synthetic resin, or the like), or the like. The film and an object to be treated are subjected to treatment for attachment by thermocompression. The film is attached to the object by melting an adhesion layer provided on a top surface of the film or a layer provided in an outmost layer (not the adhesion layer) through heat treatment and by applying pressure.

By using an incinerable pollution-free material such as paper, a fiber, carbon graphite, or the like for the cover material, a used processor chip can be incinerated or cut. The processor chip using the above material is pollution-free since it does not generate a poisonous gas even when incinerated.

In FIG. 29, the processor chip is provided over the cover material 9301 with the adhesive 9320 interposed therebetween; however, the processor chip may be attached to an article instead of to the cover material 9301.

Embodiment Mode 15

In this embodiment mode, another structure applicable to the light emitting element of the invention is explained with reference to FIGS. 34A to 34C and FIGS. 35A to 35C.

Light emitting elements utilizing electroluminescence are classified according to whether a light emitting material is an organic compound or an inorganic compound. In general, the former is referred to as an organic EL element, and the latter is referred to as an inorganic EL element.

The inorganic EL elements are classified according to their element structures into a dispersed inorganic EL element and a thin-film inorganic EL element. They are different in that the former includes an electroluminescent layer in which particles of a light emitting material are dispersed in a binder and the latter includes an electroluminescent layer formed of a thin film of a light emitting material; however, they are common in that electrons accelerated by a high electric field are required. Note that a mechanism for obtainable light emission includes a donor-acceptor recombination light emission which utilizes a donor level and an acceptor level and a localized light emission which utilizes inner-shell electron transition of metal ions. In general, it is often the case that the dispersed inorganic EL element performs the donor-acceptor recombination light emission and the thin-film inorganic EL element performs the localized light emission.

A light emitting material which can be used in the present invention includes a base material and an impurity element serving as a light emitting center. Light emission of various colors can be obtained by changing impurity elements to be contained. As a method for producing a light emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

The solid phase method is a method by which a base material and an impurity element or a compound containing an impurity element are weighed, mixed in a mortar, and reacted by heating and baking in an electric furnace to make the impurity element contained in the base material. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form. The method requires baking at a relatively high temperature; however, it is a simple method. Therefore, the method provides good productivity and is suitable for mass production.

The liquid phase method (coprecipitation method) is a method by which a base material or a compound containing a base material is reacted in a solution with an impurity element or a compound containing an impurity element and the reactant is baked after being dried. Particles of the light emitting material are uniformly distributed, a particle size is small, and the reaction proceeds even at a low baking temperature.

As the base material used for a light emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like can also be used. It may be a ternary mixed crystal such as calcium gallium sulfide ($CaGa_2S_4$), strontium gallium sulfide ($SrGa_2S_4$), barium gallium sulfide ($BaGa_2S_4$), or the like.

As the light emitting center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added. The halogen element can be used as a charge compensation.

On the other hand, as the light emitting center of donor-acceptor recombination light emission, a light emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In the case of synthesizing the light emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element or the compound containing the first impurity element, fluorine (F), chlorine (Cl), aluminum sulfate ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light emitting material can be obtained. Furthermore, a high-purity light emitting element can be obtained since an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 atomic % to 10 atomic %, preferably 0.05 atomic % to 5 atomic %.

In the case of the thin-film inorganic EL element, the electroluminescent layer is a layer containing the above-described light emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transfer low pressure CVD, an atomic layer epitaxy (ALE) method, or the like.

Figure 34A:
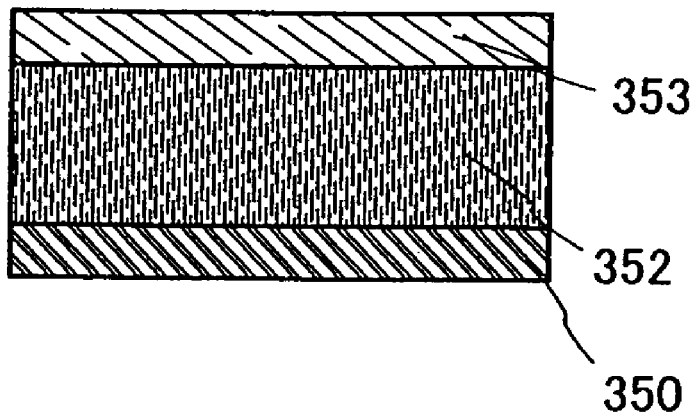
FIGS. 34A to 34C are diagrams explaining structures of light emitting elements applicable to the present invention.
Figure 34B:
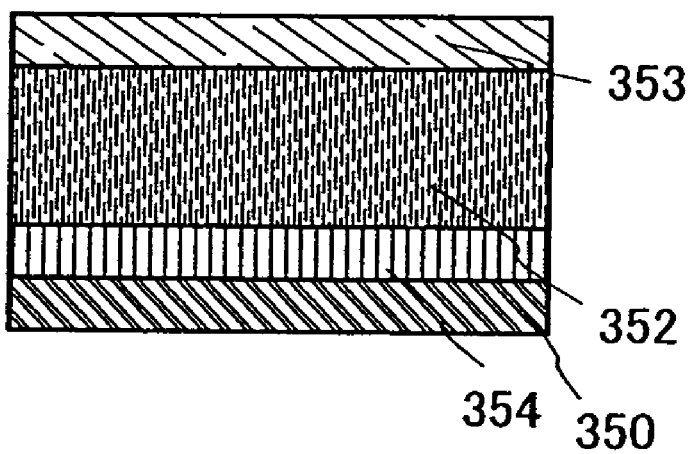
Figure 34C:
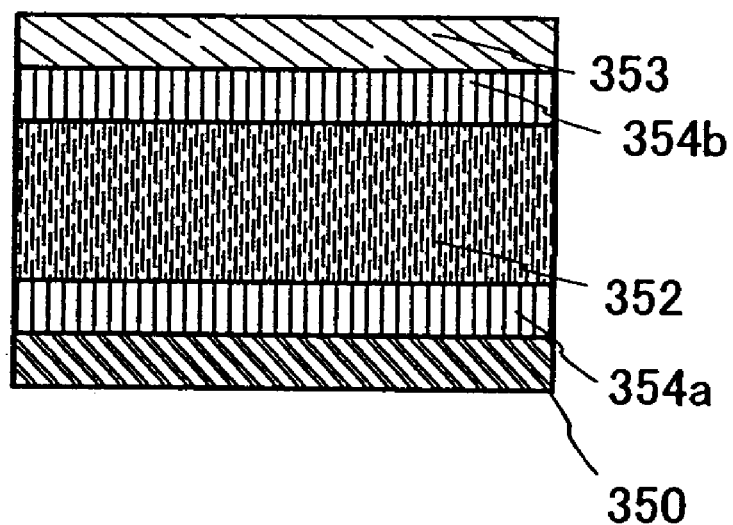

FIGS. 34A to 34C show examples of a thin-film inorganic EL element which can be used as a light emitting element. In each of FIGS. 34A to 34C, a light emitting element includes a first electrode layer 350, an electroluminescent layer 351, and a second electrode layer 353.

Each of the light emitting elements shown in FIGS. 34B and 34C has a structure in which an insulating layer is provided between the electrode layer and the electroluminescent layer in the light emitting element in FIG. 34A. The light emitting element shown in FIG. 34B includes an insulating layer 354 between the first electrode layer 350 and the electroluminescent layer 352. The light emitting element shown in FIG. 34C includes an insulating layer 354a between the first electrode layer 350 and the electroluminescent layer 352 and an insulating layer 354b between the second electrode layer 353 and the electroluminescent layer 352. As described above, the insulating layer may be provided between the electroluminescent layer and either or both of the pair of electrode layers sandwiching the electroluminescent layer. The insulating layer may be a single layer or a laminate of a plurality of layers.

In FIG. 34B, the insulating layer 354 is provided to be in contact with the first electrode layer 350. However, the insulating layer 354 may be provided to be in contact with the second electrode layer 353 by reversing the order of the insulating layer and the electroluminescent layer.

In the case of the dispersed inorganic EL element, a particulate light emitting material is dispersed in a binder to form a film electroluminescent layer. In the case where a particle having a desired size cannot be sufficiently obtained by a production method of a light emitting material, the material may be processed into particles by crushing in a mortar or the like. The binder is a substance for fixing a particulate light emitting material in a dispersed manner and holding the material in shape as the electroluminescent layer. The light emitting material is uniformly dispersed and fixed in the electroluminescent layer by the binder.

In the case of the dispersed inorganic EL element, the electroluminescent layer can be formed by a droplet discharge method which can selectively form the electroluminescent layer, a printing method (such as screen printing or off-set printing), a coating method such as a spin-coating method, a dipping method, a dispenser method, or the like. The thickness is not particularly limited, but it is preferably in the range of 10 nm to 1000 nm. In addition, in the electroluminescent layer containing the light emitting material and the binder, the proportion of the light emitting material is preferably in the range of 50 wt % to 80 wt %.

Figure 35A:
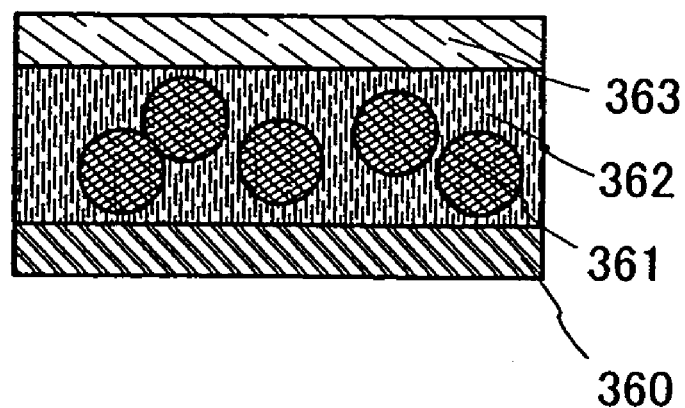
FIGS. 35A to 35C are diagrams explaining structures of light emitting elements applicable to the present invention.
Figure 35B:
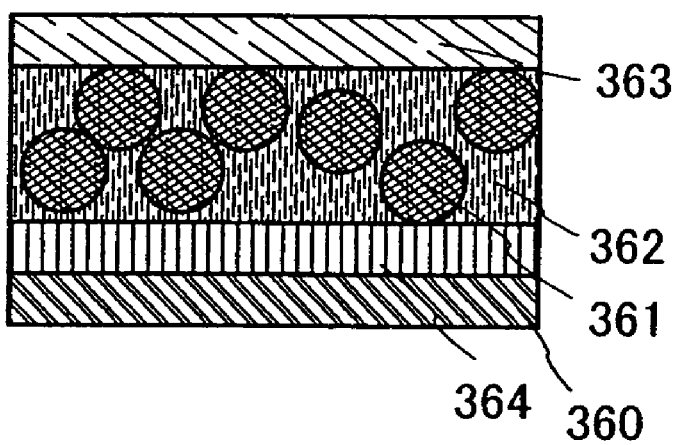
Figure 35C:
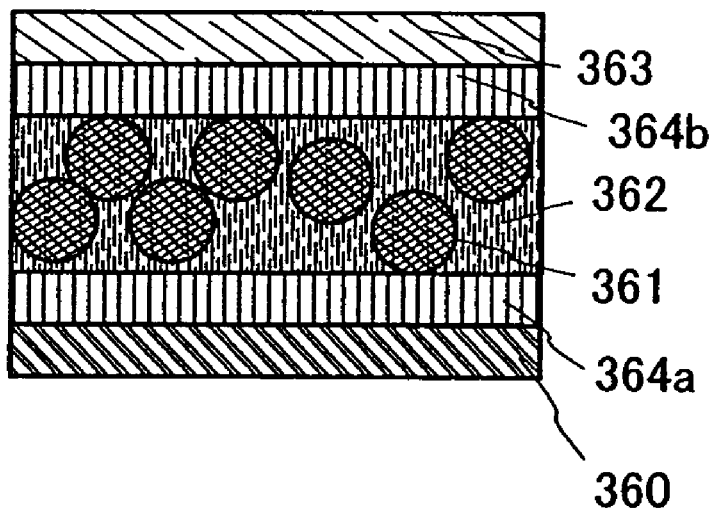

FIGS. 35A to 35C show examples of a dispersed inorganic EL element which can be used as a light emitting element. A light emitting element in FIG. 35A has a laminated structure of a first electrode layer 360, an electroluminescent layer 362, and a second electrode layer 363, and contains a light emitting material 361 held by a binder in the electroluminescent layer 362.

As the binder which can be used in this embodiment mode, an insulating material, an organic material or an inorganic material, or a mixed material of an organic material and an inorganic material can be used. As an organic insulating material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high molecular compound such as aromatic polyamide or polybenzimidazole, or a siloxane resin may be used. Note that the siloxane resin corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin of polyvinyl alcohol, polyvinylbutyral, or the like, a phenol resin, a novolac resin, an acrylic resin, a melamine resin, a urethane resin, or an oxazole resin (polybenzoxazole) may be used. A dielectric constant can be adjusted by appropriately mixing high dielectric constant fine particles such as barium titanate ($BaTiO_3$) or strontium titanate ($SrTiO_3$) in the above resin.

As an inorganic insulating material included in the binder, a material selected from substances containing inorganic insulating materials can be used, such as silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), or ZnS. A dielectric constant of the electroluminescent layer including the light emitting material and the binder can be controlled by making an organic material to contain a high dielectric constant inorganic material (by addition or the like), so that a dielectric constant can be increased.

In a producing process, a light emitting material is dispersed in a solution including a binder. As a solvent of the solution including the binder that can be used in this embodiment mode, a solvent in which a binder material is soluble and which can produce a solution having a viscosity suitable for a method for forming the electroluminescent layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

Each of the light emitting elements shown in FIGS. 35B and 35C has a structure in which an insulating layer is provided between the electrode layer and the electroluminescent layer in the light emitting element in FIG. 35A. The light emitting element shown in FIG. 35B includes an insulating layer 364 between the first electrode layer 360 and the electroluminescent layer 362. The light emitting element shown in FIG. 35C includes an insulating layer 364a between the first electrode layer 360 and the electroluminescent layer 362 and an insulating layer 364b between the second electrode layer 363 and the electroluminescent layer 362. As described above, the insulating layer may be provided between the electroluminescent layer and either or both of the pair of electrodes sandwiching the electroluminescent layer. In addition, the insulating layer may be a single layer or a laminate of a plurality of layers.

In FIG. 35B, the insulating layer 364 is provided to be in contact with the first electrode layer 360. However, the insulating layer 364 may be provided to be in contact with the second electrode layer 363 by reversing the order of the insulating layer and the electroluminescent layer.

An insulating layer such as the insulating layer 354 in FIGS. 34A to 34C or the insulating layer 364 in FIGS. 35A to 35C is not particularly limited, but it preferably has high insulation resistance and dense film quality. Furthermore, it preferably has a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a laminated film of two or more kinds can be used. These insulating films can be formed by sputtering, evaporation, CVD, or the like. Alternatively, the insulating layer may be formed by dispersing particles of the insulating material in a binder. A binder material may be formed using a material and a method similar to those of the binder included in the electroluminescent layer. The thickness is not particularly limited, but it is preferably in the range of 10 nm to 1000 nm.

The light emitting element described in this embodiment mode, which can provide light emission by applying voltage between a pair of electrode layers sandwiching the electroluminescent layer, can be operated by either DC drive or AC drive.

Embodiment 1

This embodiment describes an example of manufacturing a metal film by a plating method using the present invention.

A molybdenum film was formed as a conductive layer 65 over a substrate by a sputtering method, and a silicon oxide film was formed as an insulating layer 66 over the molybdenum film by a CVD method. A titanium oxide film was formed as a photocatalyst material over the insulating layer 66, and a fluoroalkylsilane (FAS) film was formed as a mask film over the photocatalyst material. The titanium oxide film was formed by baking at 450° C. after formation by a coating method, and the FAS film was formed by heating at a substrate temperature of 170° C. to evaporate liquid FAS.

While the substrate with the titanium oxide film was immersed in a plating catalyst solution formed of a palladium chloride ($PdCl_2$) solution, light irradiation was performed through the substrate from backside of the substrate. Since light passes through the insulating layer 66, the photocatalyst material is selectively irradiated therewith to be activated. The mask film over the photocatalyst material irradiated with light is decomposed and removed due to that activation energy; therefore, the photocatalyst material is exposed to selectively adsorb a plating catalyst material. On the other hand, the conductive layer 65 does not transmit light and blocks light, so the photocatalyst material formed over the conductive layer 65 is not irradiated with light and not activated. Therefore, the mask film remains. In this embodiment, light irradiation was performed while immersing in a plating catalyst solution to adsorb palladium ions onto the titanium oxide film. Thereafter, the substrate adsorbing palladium ions was immersed in a plating solution containing a metal material to grow a metal film. As the plating solution, a mixture of nickel sulfate hexahydrate ($NiSO_4$) as a metal salt, a hypophosphorous acid ($H_3PO_2$) as a reducing agent, and a lactic acid and a malic acid as complexing agents was used. A nickel phosphorus alloy film was formed as the metal film by a plating method.

Figure 33:
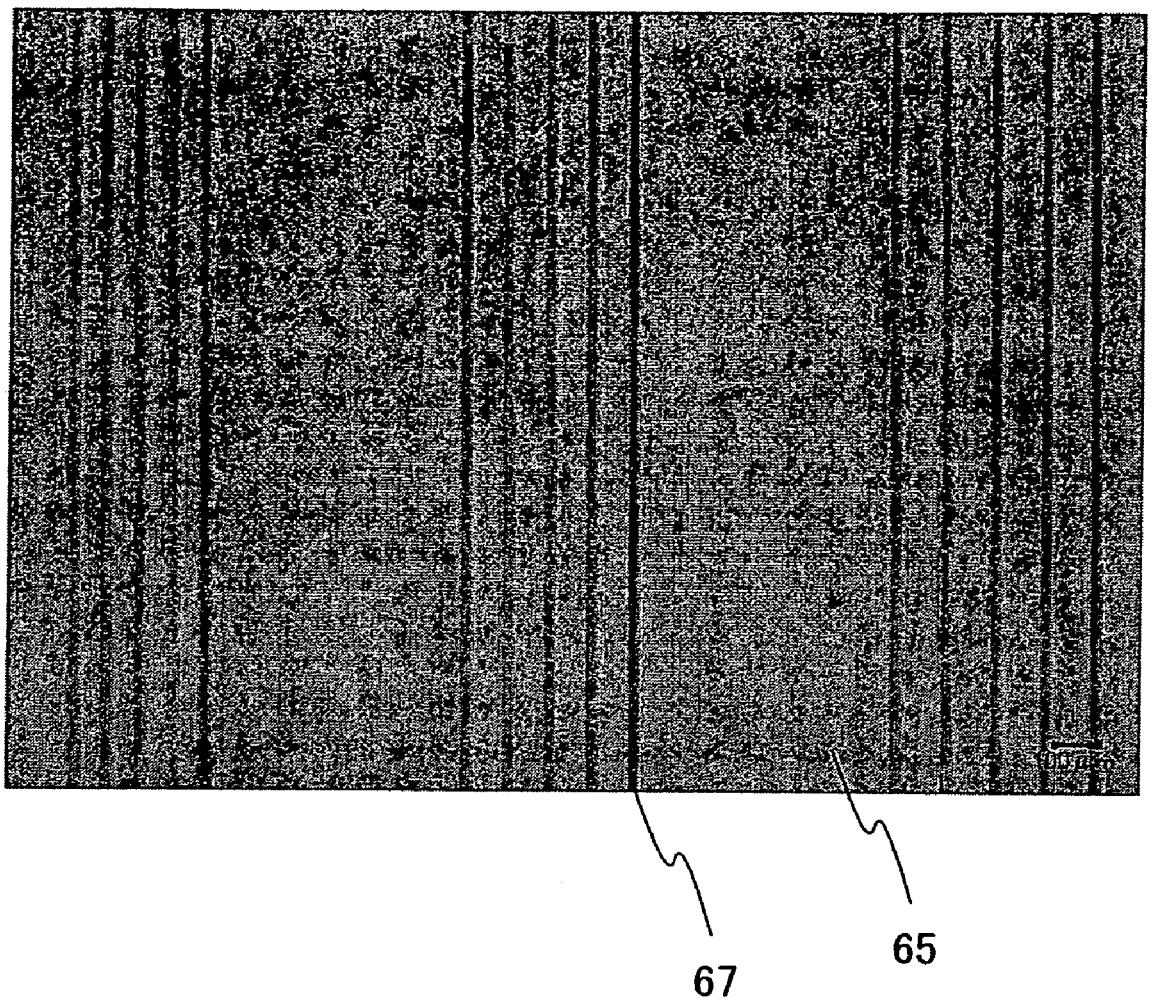
FIG. 33 is a diagram showing experimental data of Embodiment 1.

FIG. 33 is an optical photomicrograph of the formed metal film. In FIG. 33, the conductive layer 65 and a metal film 67 are formed over a substrate. Since the metal film 67 is formed in an exact shape of a pattern of a selectively-formed plating catalyst element, the metal film 67 is electively formed in a self-aligned manner almost without overlapping the conductive layer 65 with the insulating layer 66 interposed therebetween.

Figure 32A:
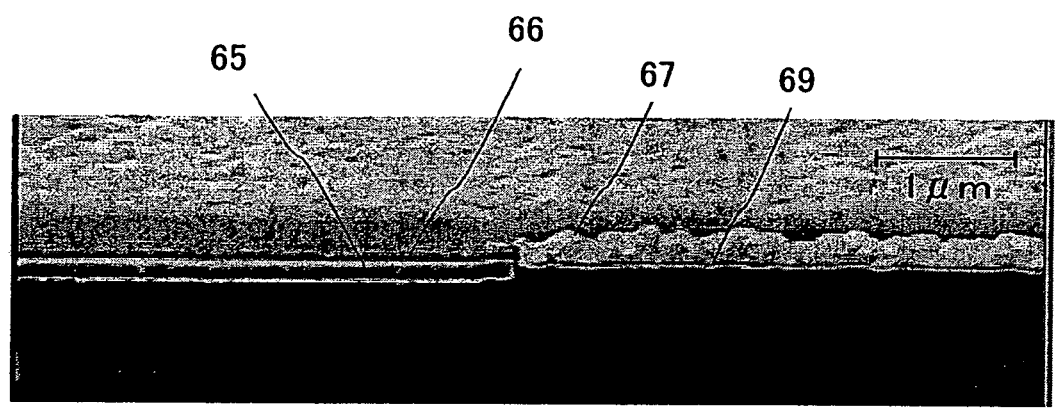
FIGS. 32A and 32B are diagrams showing experimental data of Embodiment 1.
Figure 32B:
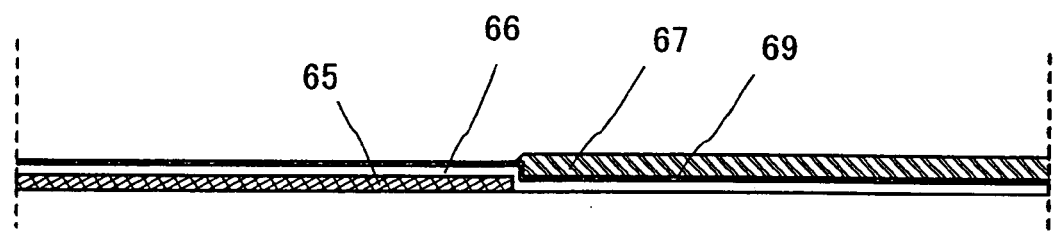

In addition, FIGS. 32A and 32B are cross-sectional views of the sample manufactured in this embodiment. FIG. 32A is an FIB photography of the sample manufactured in this embodiment and observed by a focused ion beam system (FIB), and FIG. 32B is a schematic diagram of FIG. 32A. As shown in FIGS. 32A and 32B, the insulating layer 66 is formed to cover the conductive layer 65, and a photocatalyst material 69 and the metal film 67 are formed over the insulating layer 66. Although it is difficult to confirm with FIGS. 32A and 32B, the plating catalyst material also exists between the photocatalyst material 69 and the metal film 67. Since the metal film 67 is formed by a plating method, the metal film 67 grows isotropically from a region adsorbing the plating catalyst element. Consequently, a part of an edge of the metal film 67 is formed over the conductive layer 65.

In this embodiment, titanium oxide adsorbing palladium that is a plating catalyst element is selectively irradiated with light by backside light exposure to selectively adsorb the plating catalyst element onto the light-exposed photocatalyst material. Thus, a mask and a photolithography step are not required to process into a desired shape. Consequently, a process is simplified, so that a wire can be formed at low cost with high productivity. Accordingly, by using the present invention, a semiconductor device, a display device, or the like can be manufactured at low cost with high productivity.

In addition, a plating method is used; therefore, the thickness or size of a wire layer can be controlled relatively easily, and a wire layer can be manufactured to suit application.

Therefore, a high-performance and high-reliability semiconductor device which can operate at high speed can also be manufactured.

This application is base on Japanese Patent Application serial no. 2005-218090 filed in Japan Patent Office on Jul. 27, 2005, the contents of which are hereby incorporated by reference.

What is claimed is:

1. A method for manufacturing a semiconductor device, comprising the steps of:
   forming a first conductive layer over a substrate having a light transmitting property;
   forming an insulating layer over the first conductive layer;
   forming a photocatalyst material over the insulating layer;
   immersing the photocatalyst material in a solution containing a plating catalyst material and exposing a first part and a second part of the photocatalyst material to light transmitted through the substrate in the solution containing the plating catalyst material with the use of the first conductive layer as a mask to deposit the plating catalyst material onto the part of the photocatalyst material;
   immersing the plating catalyst material in a plating solution containing a metal material to form a second conductive layer and a third conductive layer over the first part and the second part of the photocatalyst material, respectively; and
   forming a semiconductor layer over the second conductive layer and the third conductive layer.

2. A method for manufacturing a semiconductor device according to claim 1, wherein the semiconductor layer is formed over the second conductive layer and the third conductive layer by etching the photocatalyst material with the use of the second conductive layer and the third conductive layer as masks.

3. A method for manufacturing a semiconductor device according to claim 1, wherein the photocatalyst material is selectively formed by discharging a composition containing the photocatalyst material.

4. A method for manufacturing a semiconductor device according to claim 1, wherein titanium oxide is used as the photocatalyst material.

5. A method for manufacturing a semiconductor device according to claim 1, wherein one of a nickel alloy thin film and a copper thin film is formed as the second conductive layer and the third conductive layer.

6. A method for manufacturing a semiconductor device according to claim 1, wherein at least one of palladium, platinum, rhodium, and gold is used as the plating catalyst material.

7. A method for manufacturing a semiconductor device according to claim 1, wherein the solution containing the plating catalyst material is used with its pH adjusted to 3 to 6.

8. A method for manufacturing a semiconductor device according to claim 1, wherein the first conductive layer is a gate electrode layer, the second conductive layer is a source electrode layer, the third conductive layer is a drain electrode layer, and the insulating layer is a gate insulating layer.

9. A method for manufacturing a semiconductor device, comprising the steps of:
   forming a first conductive layer over a substrate having a light transmitting property;
   forming an insulating layer over the first conductive layer;
   forming a photocatalyst material over the insulating layer;
   forming a mask film over the photocatalyst material;
   exposing a first part and a second part of the photocatalyst material to light transmitted through the substrate with the use of the first conductive layer as a mask, thereby removing the mask film over the first part and the second part of the photocatalyst material;
   immersing the first part and the second part of the photocatalyst material in a solution containing a plating catalyst material to deposit the plating catalyst material onto the first part and the second part of the photocatalyst material;
   immersing the plating catalyst material in a plating solution containing a metal material to form a second conductive layer and a third conductive layer over the first part and the second part of the photocatalyst material, respectively; and
   forming a semiconductor layer over the second conductive layer and the third conductive layer.

10. A method for manufacturing a semiconductor device according to claim 9, wherein the semiconductor layer is formed over the second conductive layer and the third conductive layer by etching the photocatalyst material and the mask film with the use of the second conductive layer and the third conductive layer as masks.

11. A method for manufacturing a semiconductor device according to claim 9, wherein the mask film is formed of a silane coupling agent having a fluorocarbon group or an alkyl group as its end group.

12. A method for manufacturing a semiconductor device according to claim 9, wherein the photocatalyst material is selectively formed by discharging a composition containing the photocatalyst material.

13. A method for manufacturing a semiconductor device according to claim 9, wherein titanium oxide is used as the photocatalyst material.

14. A method for manufacturing a semiconductor device according to claim 9, wherein one of a nickel alloy thin film and a copper thin film is formed as the second conductive layer and the third conductive layer.

15. A method for manufacturing a semiconductor device according to claim 9, wherein at least one of palladium, platinum, rhodium, and gold is used as the plating catalyst material.

16. A method for manufacturing a semiconductor device according to claim 9, wherein the solution containing the plating catalyst material is used with its pH adjusted to 3 to 6.

17. A method for manufacturing a semiconductor device according to claim 9, wherein the first conductive layer is a gate electrode layer, the second conductive layer is a source electrode layer, the third conductive layer is a drain electrode layer, and the insulating layer is a gate insulating layer.

18. A method for manufacturing a semiconductor device, comprising the steps of:
   forming a first conductive layer over a substrate having a light transmitting property;
   forming an insulating layer over the first conductive layer;
   forming a photocatalyst material over the insulating layer;
   immersing the photocatalyst material in a solution containing a plating catalyst material and exposing a first part and a second part of the photocatalyst material to light transmitted through the substrate in the solution containing the plating catalyst material with the use of the first conductive layer as a mask to deposit the plating catalyst material onto the first part and the second part of the photocatalyst material;
   immersing the plating catalyst material in a plating solution containing a first metal material to form a second conductive layer and a third conductive layer over the first part and the second part of the photocatalyst material, respectively;

immersing the second conductive layer and the third conductive layer in a plating solution containing a second metal material to form a first metal film over the second conductive layer and a second metal film over the third conductive layer; and forming a semiconductor layer over the first metal film and the second metal film.

19. A method for manufacturing a semiconductor device according to claim 18, wherein the semiconductor layer is formed over the second conductive layer and the third conductive layer by etching the photocatalyst material with the use of the second conductive layer and the third conductive layer as masks.

20. A method for manufacturing a semiconductor device according to claim 18, wherein gold is used as the second metal material.

21. A method for manufacturing a semiconductor device according to claim 18, wherein the photocatalyst material is selectively formed by discharging a composition containing the photocatalyst material.

22. A method for manufacturing a semiconductor device according to claim 18, wherein titanium oxide is used as the photocatalyst material.

23. A method for manufacturing a semiconductor device according to claim 18, wherein one of a nickel alloy thin film and a copper thin film is formed as the second conductive layer and the third conductive layer.

24. A method for manufacturing a semiconductor device according to claim 18, wherein at least one of palladium, platinum, rhodium, and gold is used as the plating catalyst material.

25. A method for manufacturing a semiconductor device according to claim 18, wherein the solution containing the plating catalyst material is used with its pH adjusted to 3 to 6.

26. A method for manufacturing a semiconductor device according to claim 18, wherein the first conductive layer is a gate electrode layer, the second conductive layer is a source electrode layer, the third conductive layer is a drain electrode layer, and the insulating layer is a gate insulating layer.

27. A method for manufacturing a semiconductor device, comprising the steps of:
    forming a first conductive layer over a substrate having a light transmitting property;
    forming an insulating layer over the first conductive layer;
    forming a photocatalyst material over the insulating layer;
    forming a mask film over the photocatalyst material;
    exposing the a first part and a second part of the photocatalyst material to light transmitted through the substrate with the use of the first conductive layer as a mask, thereby removing the mask film over the first part and the second part of the photocatalyst material;
    immersing the first part and the second part of the photocatalyst material in a solution containing a plating catalyst material to deposit the plating catalyst material onto the first part and the second part of the photocatalyst material;
    immersing the plating catalyst material in a plating solution containing a first metal material to form a second conductive layer and a third conductive layer over the first part and the second part of the photocatalyst material, respectively;
    immersing the second conductive layer and the third conductive layer in a plating solution containing a second metal material to form a first metal film and a second metal film over the second conductive layer and the third conductive layer, respectively; and
    forming a semiconductor layer over the first metal film and the second metal film.

28. A method for manufacturing a semiconductor device according to claim 27, wherein the semiconductor layer is formed over the second conductive layer and the third conductive layer by etching the photocatalyst material and the mask film with the use of the second conductive layer and the third conductive layer as masks.

29. A method for manufacturing a semiconductor device according to claim 27, wherein gold is used as the second metal material.

30. A method for manufacturing a semiconductor device according to claim 27, wherein the mask film is formed of a silane coupling agent having a fluorocarbon group or an alkyl group as its end group.

31. A method for manufacturing a semiconductor device according to claim 27, wherein the photocatalyst material is selectively formed by discharging a composition containing the photocatalyst material.

32. A method for manufacturing a semiconductor device according to claim 27, wherein titanium oxide is used as the photocatalyst material.

33. A method for manufacturing a semiconductor device according to claim 27, wherein one of a nickel alloy thin film and a copper thin film is formed as the second conductive layer and the third conductive layer.

34. A method for manufacturing a semiconductor device according to claim 27, wherein at least one of palladium, platinum, rhodium, and gold is used as the plating catalyst material.

35. A method for manufacturing a semiconductor device according to claim 27, wherein the solution containing the plating catalyst material is used with its pH adjusted to 3 to 6.

36. A method for manufacturing a semiconductor device according to claim 27, wherein the first conductive layer is a gate electrode layer, the second conductive layer is a source electrode layer, the third conductive layer is a drain electrode layer, and the insulating layer is a gate insulating layer.

* * * * *

UNITED STATES PATENT AND TRADEMARK OFFICE
CERTIFICATE OF CORRECTION

| | | |
|---|---|---|
| PATENT NO. | : 7,655,566 B2 | Page 1 of 1 |
| APPLICATION NO. | : 11/488143 | |
| DATED | : February 2, 2010 | |
| INVENTOR(S) | : Gen Fujii | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 734 days.

Signed and Sealed this

Twenty-eighth Day of December, 2010

David J. Kappos
*Director of the United States Patent and Trademark Office*